(12) United States Patent
Wang et al.

(10) Patent No.: US 12,417,991 B2
(45) Date of Patent: Sep. 16, 2025

(54) CHIP STACK STRUCTURE WITH CONDUCTIVE PLUG AND METHOD FOR FORMING THE SAME

(71) Applicant: TAIWAN SEMICONDUCTOR MANUFACTURING COMPANY, LTD., Hsinchu (TW)

(72) Inventors: Chuei-Tang Wang, Taichung (TW); Tso-Jung Chang, Taoyuan (TW); Shih-Ping Lin, Taichung (TW); Jeng-Shien Hsieh, Kaohsiung (TW); Chih-Peng Lin, Hsinchu County (TW); Chieh-Yen Chen, Taipei (TW); Chen-Hua Yu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 420 days.

(21) Appl. No.: 18/150,949

(22) Filed: Jan. 6, 2023

(65) Prior Publication Data
US 2024/0203918 A1 Jun. 20, 2024

Related U.S. Application Data

(60) Provisional application No. 63/433,261, filed on Dec. 16, 2022.

(51) Int. Cl.
*H01L 23/00* (2006.01)

(52) U.S. Cl.
CPC .............. *H01L 24/08* (2013.01); *H01L 24/80* (2013.01); *H01L 2224/08145* (2013.01); *H01L 2224/80895* (2013.01); *H01L 2224/80896* (2013.01)

(58) Field of Classification Search
CPC ..................... H01L 24/08; H01L 24/80; H01L 2224/08145; H01L 2224/80895; H01L 2224/80896
See application file for complete search history.

(56) References Cited

U.S. PATENT DOCUMENTS

| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |

(Continued)

FOREIGN PATENT DOCUMENTS

| TW | 201919194 A | 5/2019 |
| TW | 202232609 A | 8/2022 |
| TW | 202232707 A | 8/2022 |

*Primary Examiner* — Ibrahim A Khan
(74) *Attorney, Agent, or Firm* — Birch, Stewart, Kolasch & Birch, LLP

(57) ABSTRACT

A chip stack structure is provided. The chip stack structure includes a first chip including a first substrate and a first interconnect structure over the first substrate. The chip stack structure includes a second chip over and bonded to the first chip. The second chip has a second interconnect structure and a second substrate over the second interconnect structure. The chip stack structure includes an insulating layer over the second interconnect structure and surrounding the second substrate. The chip stack structure includes a conductive plug penetrating through the insulating layer to the second interconnect structure.

20 Claims, 47 Drawing Sheets

(56) References Cited

U.S. PATENT DOCUMENTS

| | | | |
|---|---|---|---|
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 10,950,599 B1* | 3/2021 | Or-Bach | H10D 88/101 |
| 11,482,440 B2* | 10/2022 | Or-Bach | H01L 24/08 |
| 2014/0264862 A1* | 9/2014 | Tsai | H10F 39/199 |
| | | | 257/774 |
| 2017/0133336 A1* | 5/2017 | Oliver | H10N 69/00 |
| 2019/0057903 A1* | 2/2019 | Or-Bach | H01L 23/544 |
| 2019/0148347 A1 | 5/2019 | Jeng et al. | |
| 2020/0243487 A1* | 7/2020 | Or-Bach | H01L 24/80 |
| 2020/0328186 A1* | 10/2020 | Liu | H01L 25/0657 |
| 2021/0020596 A1* | 1/2021 | Yi | H01L 24/94 |
| 2021/0043557 A1* | 2/2021 | Lee | H01L 23/5223 |
| 2021/0225813 A1* | 7/2021 | Chen | H01L 25/50 |
| 2021/0257357 A1* | 8/2021 | Or-Bach | H01L 23/481 |
| 2021/0305200 A1* | 9/2021 | Lin | B23K 26/362 |
| 2021/0375721 A1* | 12/2021 | Chen | H01L 24/03 |
| 2022/0278074 A1* | 9/2022 | Chen | H01L 25/50 |
| 2022/0367407 A1* | 11/2022 | Lin | H01L 21/31105 |
| 2023/0041344 A1* | 2/2023 | Or-Bach | H01L 25/18 |
| 2023/0104210 A1* | 4/2023 | Or-Bach | H10D 84/00 |
| | | | 438/129 |
| 2024/0128150 A1* | 4/2024 | Tong | H01L 23/49822 |

* cited by examiner

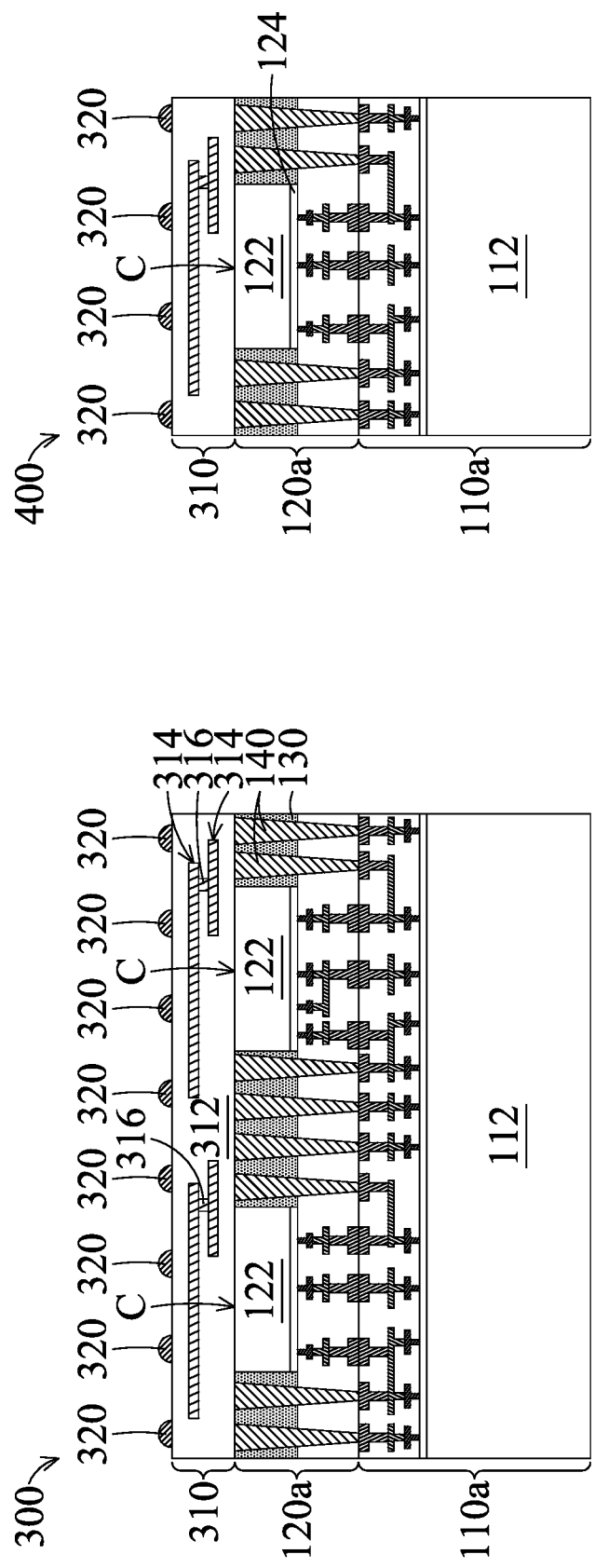

CHIP STACK STRUCTURE WITH CONDUCTIVE PLUG AND METHOD FOR FORMING THE SAME

PRIORITY CLAIM AND CROSS-REFERENCE

This application claims the benefit of U.S. Provisional Application No. 63/433,261, filed on Dec. 16, 2022, and entitled "CHIP STACK STRUCTURE WITH CONDUCTIVE PLUG AND METHOD FOR FORMING THE SAME", the entirety of which is incorporated by reference herein.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed and greater bandwidth, as well as lower power consumption and latency has grown recently, there has grown a need for smaller and more creative packaging techniques of semiconductor dies.

As semiconductor technologies further advance, stacked semiconductor devices, e.g., 3D integrated circuits (3DIC), have emerged as an effective alternative to further reduce the physical size of a semiconductor device. In a stacked semiconductor device, active circuits such as logic, memory, processor circuits and the like are fabricated on different semiconductor wafers. Two or more semiconductor wafers may be installed on top of one another to further reduce the form factor of the semiconductor device.

Two semiconductor wafers or dies may be bonded together through suitable bonding techniques. An electrical connection may be provided between the stacked semiconductor wafers. The stacked semiconductor devices may provide a higher density with smaller form factors and allow for increased performance and lower power consumption.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIGS. 1A-1G are cross-sectional views of various stages of a process for forming a chip stack structure, in accordance with some embodiments.

FIG. 1C-1 is a top view of the semiconductor structures of FIG. 1C, in accordance with some embodiments.

FIG. 1D-1 is a top view of the semiconductor structures and the insulating layer of FIG. 1D, in accordance with some embodiments.

FIG. 1E-1 is a top view of the semiconductor structures, the insulating layer, and the conductive plugs of FIG. 1E, in accordance with some embodiments.

FIG. 1F-1 is a top view of the semiconductor structures, the insulating layer, the conductive plugs, and the conductive bumps of FIG. 1F, in accordance with some embodiments.

FIG. 2 is a cross-sectional view of a chip stack structure, in accordance with some embodiments.

FIG. 3 is a cross-sectional view of a chip stack structure, in accordance with some embodiments.

FIG. 4 is a cross-sectional view of a chip stack structure, in accordance with some embodiments.

DETAILED DESCRIPTION

Figure 1A:
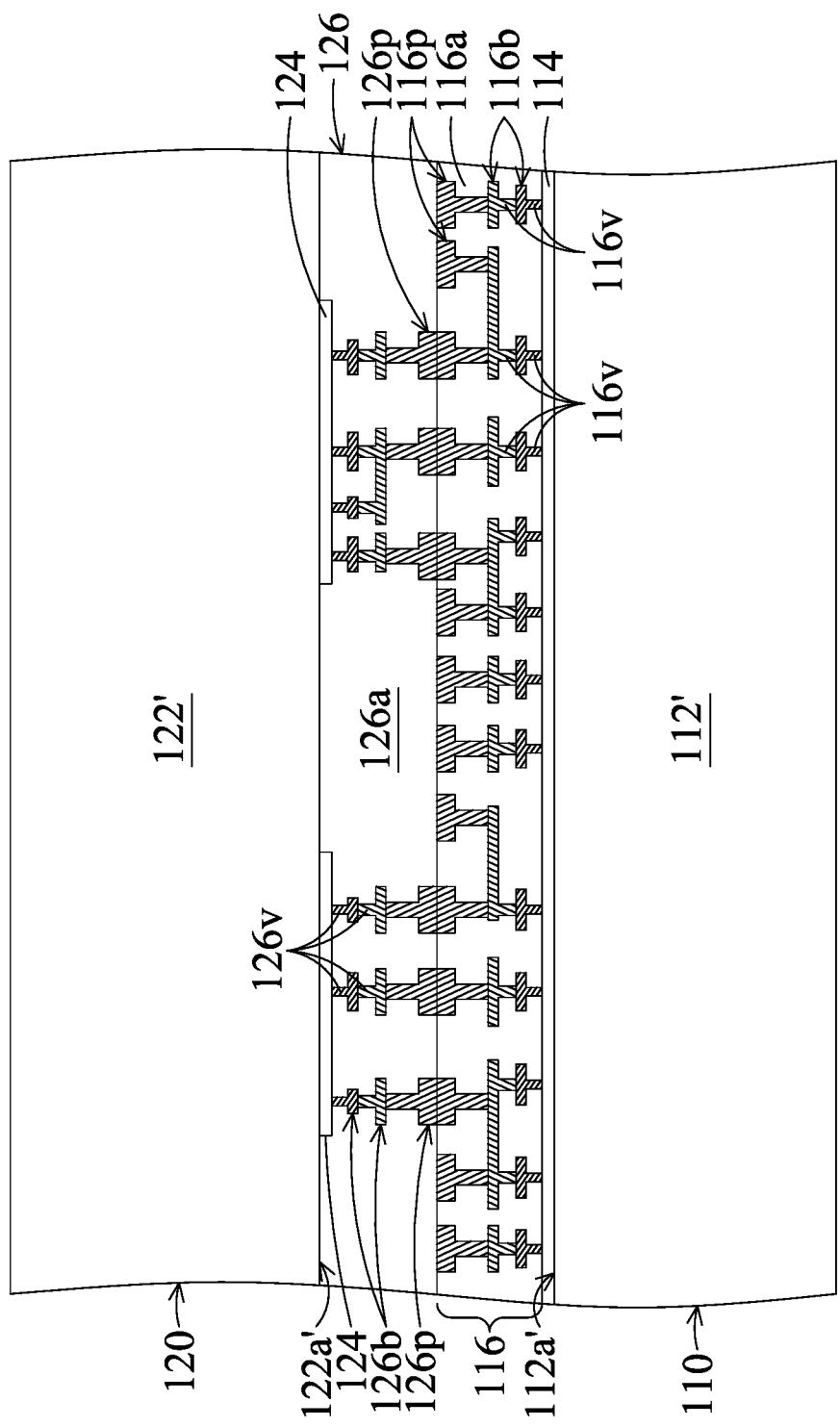

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3 DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 1A-1G are cross-sectional views of various stages of a process for forming a chip stack structure, in accordance with some embodiments. As shown in FIG. 1A, a semiconductor structure 110 is provided, in accordance with some embodiments. The semiconductor structure 110 includes a substrate structure 112', a device layer 114, and an interconnect structure 116, in accordance with some embodiments. The device layer 114 is formed over the substrate structure 112', in accordance with some embodiments. The interconnect structure 116 is formed over the device layer 114, in accordance with some embodiments.

The substrate structure 112' includes, for example, a semiconductor substrate. The substrate structure 112' includes, for example, a semiconductor wafer (such as a silicon wafer) or a portion of a semiconductor wafer. In some embodiments, the substrate structure 112' is made of an elementary semiconductor material including silicon or germanium in a single crystal structure, a polycrystal structure, or an amorphous structure.

In some other embodiments, the substrate structure 112' is made of a compound semiconductor, such as silicon carbide, gallium arsenide, gallium phosphide, indium phosphide, indium arsenide, an alloy semiconductor, such as SiGe or GaAsP, or a combination thereof. The substrate structure 112' may also include multi-layer semiconductors, semiconductor on insulator (SOI) (such as silicon on insulator or germanium on insulator), or a combination thereof.

In some embodiments, isolation features (not shown) are formed in the substrate structure 112'. The isolation features are used to surround active regions and electrically isolate various device elements formed in and/or over the substrate structure 112' in the active regions. In some embodiments, the isolation features include shallow trench isolation (STI) features, local oxidation of silicon (LOCOS) features, other suitable isolation features, or a combination thereof.

The device layer 114 includes device elements (not shown), conductive vias (not shown), and one or more wiring layers (not shown), in accordance with some embodiments. The device elements are formed over a surface 112a' of the substrate structure 112', in accordance with some embodiments. The conductive vias are over and connected to the device elements, in accordance with some embodiments. The wiring layers are over the conductive vias, in accordance with some embodiments. The conductive vias are connected between the one or more wiring layers and the device elements, in accordance with some embodiments.

Examples of the device elements include active devices, passive devices, other suitable elements, or a combination thereof. The active devices may include transistors or diodes formed at the surface 112a' of the substrate structure 112'. The passive devices include resistors, capacitors, inductors, or other suitable passive devices.

For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc. Various processes, such as front-end-of-line (FEOL) semiconductor fabrication processes, are performed to form the various device elements. The FEOL semiconductor fabrication processes may include deposition, etching, implantation, photolithography, annealing, planarization, one or more other applicable processes, or a combination thereof.

The wiring layers and the conductive vias are made of conductive materials such as metal (e.g., aluminum, copper, gold, silver, tungsten or the like) or alloys thereof, in accordance with some embodiments.

The interconnect structure 116 includes a dielectric layer 116a, wiring layers 116b, bonding pads 116p, and conductive vias 116v, in accordance with some embodiments. The wiring layers 116b and conductive vias 116v are in the dielectric layer 116a, in accordance with some embodiments. For the sake of simplicity, FIG. 1A only shows two of the wiring layers 116b, in accordance with some embodiments.

The conductive vias 116v are connected between the wiring layers 116b and the wiring layer of the device layer 114, in accordance with some embodiments. The bonding pads 116p are embedded in the dielectric layer 116a, in accordance with some embodiments. The bonding pads 116p are over and connected to the top-most one of the wiring layers 116b, in accordance with some embodiments.

The dielectric layer 116a is made of an oxide-containing material (e.g. silicon oxide, borosilicate glass (BSG), phosphoric silicate glass (PSG), borophosphosilicate glass (BPSG), or fluorinated silicate glass (FSG)), a nitrogen-containing material (e.g., silicon oxynitride), a low-k material, a porous dielectric material, or a combination thereof, in accordance with some embodiments.

The wiring layers 116b, the conductive vias 116v, and the bonding pads 116p are made of conductive materials such as metal (e.g., aluminum, copper, gold, silver, tungsten or the like) or alloys thereof, in accordance with some embodiments.

As shown in FIG. 1A, a semiconductor structure 120 is provided, in accordance with some embodiments. The semiconductor structure 120 includes a substrate structure 122', a device layer 124, and an interconnect structure 126, in accordance with some embodiments. The device layer 124 is formed over the substrate structure 122', in accordance with some embodiments. The interconnect structure 126 is formed over the device layer 124 and the substrate structure 122', in accordance with some embodiments.

The substrate structure 122' includes, for example, a semiconductor substrate. The substrate structure 122' includes, for example, a semiconductor wafer (such as a silicon wafer) or a portion of a semiconductor wafer.

In some embodiments, the substrate structure 122' is made of an elementary semiconductor material including silicon or germanium in a single crystal structure, a polycrystal structure, or an amorphous structure. In some other embodiments, the substrate structure 122' is made of a compound semiconductor, such as silicon carbide, gallium arsenide, gallium phosphide, indium phosphide, indium arsenide, an alloy semiconductor, such as SiGe or GaAsP, or a combination thereof. The substrate structure 122' may also include multi-layer semiconductors, semiconductor on insulator (SOI) (such as silicon on insulator or germanium on insulator), or a combination thereof.

In some embodiments, isolation features (not shown) are formed in the substrate structure 122'. The isolation features are used to surround active regions and electrically isolate various device elements formed in and/or over the substrate structure 122' in the active regions. In some embodiments, the isolation features include shallow trench isolation (STI) features, local oxidation of silicon (LOCOS) features, other suitable isolation features, or a combination thereof.

The device layer 124 includes device elements (not shown), conductive vias (not shown), and one or more wiring layers (not shown), in accordance with some embodiments. The device elements are formed over a surface 122a' of the substrate structure 122', in accordance with some embodiments. The conductive vias are connected to the device elements, in accordance with some embodiments. The conductive vias are connected between the one or more wiring layers and the device elements, in accordance with some embodiments.

Examples of the device elements include active devices, passive devices, other suitable elements, or a combination thereof. The active devices may include transistors or diodes formed at the surface 122a' of the substrate structure 122'. The passive devices include resistors, capacitors, inductors, or other suitable passive devices.

For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc. Various processes, such as front-end-of-line (FEOL) semiconductor fabrication processes, are performed to form the various device elements. The FEOL semiconductor fabrication processes may include deposition, etching, implantation, photolithography, annealing, planarization, one or more other applicable processes, or a combination thereof. In some other embodiments, the device layer 124 only includes conductive vias and one or more wiring layers and does not include device elements.

The wiring layers and the conductive vias are made of conductive materials such as metal (e.g., aluminum, copper, gold, silver, tungsten or the like) or alloys thereof, in accordance with some embodiments.

The interconnect structure 126 includes a dielectric layer 126a, wiring layers 126b, bonding pads 126p, and conductive vias 126v, in accordance with some embodiments. The wiring layers 126b and conductive vias 126v are in the dielectric layer 126a, in accordance with some embodiments. For the sake of simplicity, FIG. 1A only shows two of the wiring layers 126b, in accordance with some embodiments.

The conductive vias 126v are connected between the wiring layers 126b and the wiring layer of the device layer 124, in accordance with some embodiments. The bonding pads 126p are embedded in the dielectric layer 126a, in accordance with some embodiments. The bonding pads 126p are connected to the wiring layer 126b, in accordance with some embodiments.

The dielectric layer 126a is made of an oxide-containing material (e.g. silicon oxide, borosilicate glass (BSG), phosphoric silicate glass (PSG), borophosphosilicate glass (BPSG), or fluorinated silicate glass (FSG)), a nitrogen-containing material (e.g., silicon oxynitride), a low-k material, a porous dielectric material, or a combination thereof, in accordance with some embodiments.

The wiring layers 126b, the conductive vias 126v, and the bonding pads 126p are made of conductive materials such as metal (e.g., aluminum, copper, gold, silver, tungsten or the like) or alloys thereof, in accordance with some embodiments.

As shown in FIG. 1A, the semiconductor structure 120 is flipped upside down and bonded to the semiconductor structure 110, in accordance with some embodiments. The bonding pads 126p are bonded to the bonding pads 116p, in accordance with some embodiments. The dielectric layer 126a is bonded to the dielectric layer 116a, in accordance with some embodiments.

Figure 1B:
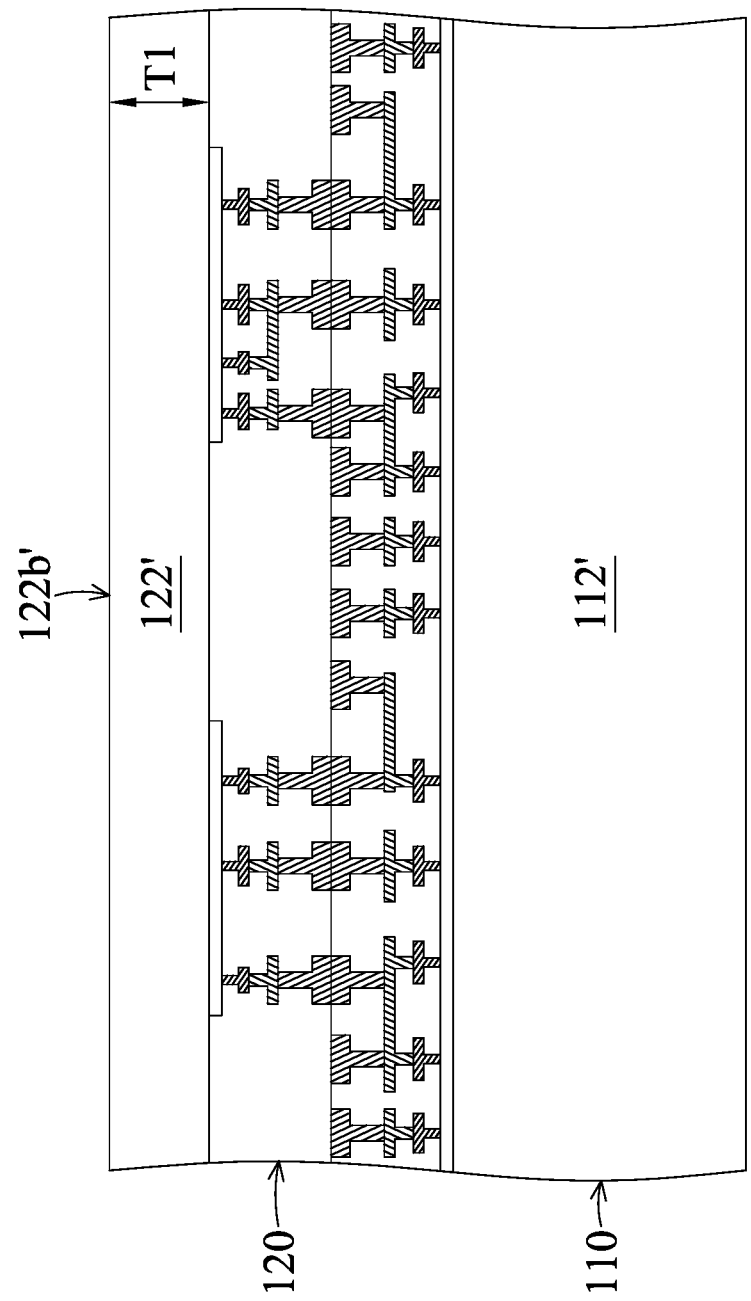

As shown in FIG. 1B, a thinning process is performed on a surface 122b' of the substrate structure 122' to thin the substrate structure 122', in accordance with some embodiments. The thinning process includes a planarization process such as a chemical mechanical polishing process, in accordance with some embodiments. After the thinning process, the (minimum) thickness T1 of the substrate structure 122' is greater than or equal to about 1 µm, in accordance with some embodiments. If the thickness T1 is less than 1 µm, the substrate structure 122' may be too thin for the following etching process. The thickness T1 ranges from about 1 µm to about 15 µm, in accordance with some embodiments.

Figures 1, 1C:
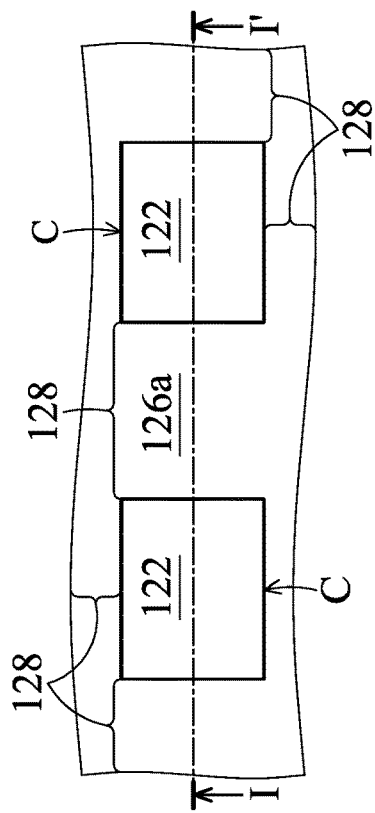
Figure 1C:
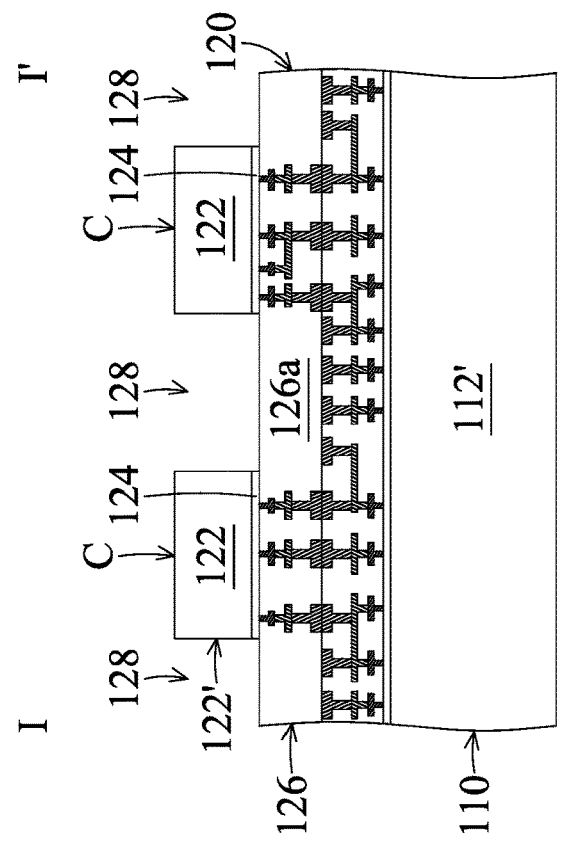

FIG. 1C-1 is a top view of the semiconductor structures of FIG. 1C, in accordance with some embodiments. FIG. 1C is a cross-sectional view illustrating the semiconductor structures along a sectional line I-I' in FIG. 1C-1, in accordance with some embodiments.

As shown in FIGS. 1B, 1C and 1C-1, portions of the semiconductor structure 120 are removed to form a trench 128 in the semiconductor structure 120, in accordance with some embodiments. The trench 128 passes through the substrate structure 122', in accordance with some embodiments. The removal process includes a photolithography process and an etching process such as a dry etching process, in accordance with some embodiments.

The dry etching process includes a plasma etching process, in accordance with some embodiments. The substrate structure 122' and the interconnect structure 126 are made of different materials, and therefore there is a sufficient etching selectivity between the substrate structure 122' and the interconnect structure 126. As a result, the dry etching process can stop on the interconnect structure 126. The etching processes of the application can also stop at the target layer (or the target element) for the same reason.

As shown in FIGS. 1C and 1C-1, portions of the substrate structure 122' remain over the interconnect structure 126 after the removal process of the substrate structure 122', in accordance with some embodiments. The portions form substrates 122, in accordance with some embodiments. The trench 128 continuously surrounds the substrates 122, in accordance with some embodiments.

As shown in FIG. 1C, one of the substrates 122, the device layer 124 under the one of the substrates 122, and the interconnect structure 126 under the one of the substrates 122 together form a chip C, in accordance with some embodiments. The chips C share the interconnect structure 126, in accordance with some embodiments. The interconnect structure 126 is wider than each substrate 122, in accordance with some embodiments.

Figures 1, 1D:
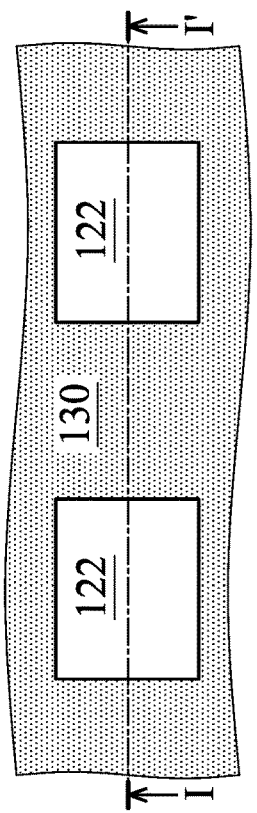
Figure 1D:
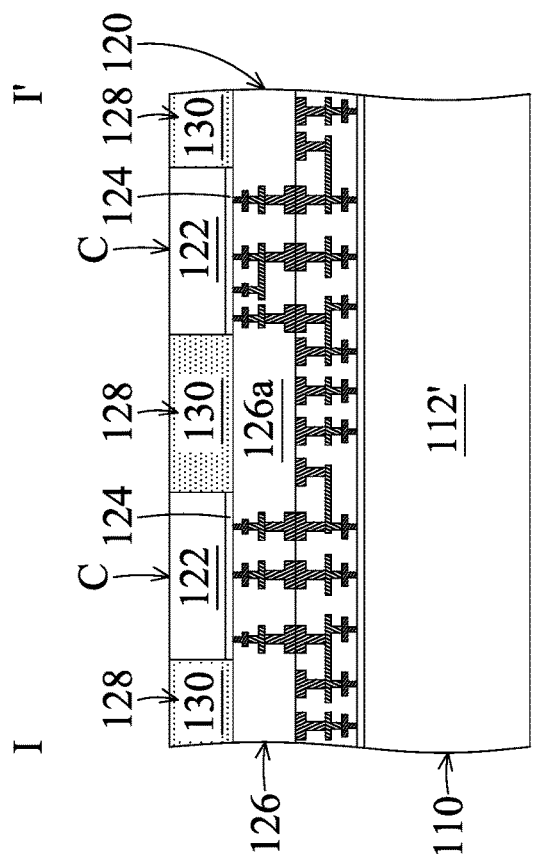

FIG. 1D-1 is a top view of the semiconductor structures and the insulating layer of FIG. 1D, in accordance with some embodiments. FIG. 1D is a cross-sectional view illustrating the semiconductor structures and the insulating layer along a sectional line I-I' in FIG. 1D-1, in accordance with some embodiments.

As shown in FIGS. 1D and 1D-1, an insulating layer 130 is formed in the trench 128, in accordance with some embodiments. The insulating layer 130 is over the interconnect structure 126, in accordance with some embodiments. The insulating layer 130 continuously surrounds the substrates 122 and the device layer 124, in accordance with some embodiments.

The insulating layer 130 is made of an oxide-containing material (e.g. silicon oxide, borosilicate glass (BSG), phosphoric silicate glass (PSG), borophosphosilicate glass (BPSG), or fluorinated silicate glass (FSG)), a nitrogen-containing material (e.g., silicon oxynitride), a low-k material, a porous dielectric material, a polymer material, or a combination thereof, in accordance with some embodiments.

The insulating layer 130 is formed using a deposition process or a spin-on process and a chemical mechanical polishing process, in accordance with some embodiments. The deposition process includes a chemical vapor deposition process, a high density plasma chemical vapor deposition process, a flowable chemical vapor deposition process, a sputtering process, or a combination thereof, in accordance with some embodiments.

Figures 1, 1E:
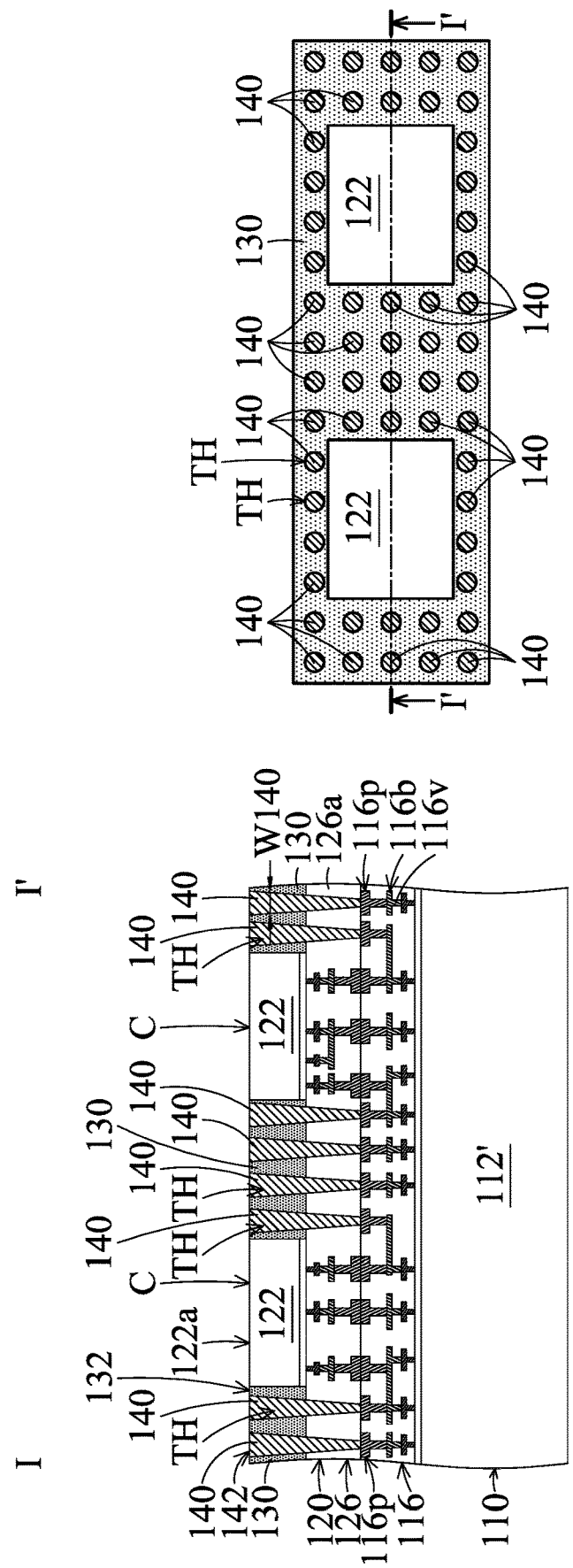

FIG. 1E-1 is a top view of the semiconductor structures, the insulating layer, and the conductive plugs of FIG. 1E, in accordance with some embodiments. FIG. 1E is a cross-sectional view illustrating the semiconductor structures, the insulating layer, and the conductive plugs along a sectional line I-I' in FIG. 1E-1, in accordance with some embodiments.

As shown in FIGS. 1E and 1E-1, the insulating layer 130 and the dielectric layer 126a are partially removed to form through holes TH, in accordance with some embodiments. The through holes TH pass through the insulating layer 130 and the dielectric layer 126a, in accordance with some embodiments. The through holes TH partially expose the bonding pads 116p of the interconnect structure 116, in accordance with some embodiments. The removal process includes a photolithography process and an etching process such as a dry etching process, in accordance with some embodiments.

The dry etching process includes a plasma etching process, in accordance with some embodiments. The dielectric layer 126a and the bonding pads 116p are made of different materials, and therefore there is a sufficient etching selectivity between the dielectric layer 126a and the bonding pads 116p. As a result, the dry etching process can stop on the bonding pads 116p.

As shown in FIGS. 1E and 1E-1, conductive plugs 140 are formed in the through holes TH, in accordance with some embodiments. The conductive plugs 140 penetrate through the insulating layer 130 and the dielectric layer 126a to the interconnect structure 116, in accordance with some embodiments. The conductive plugs 140 surround the substrates 122, in accordance with some embodiments. The width W140 of the conductive plug 140 decreases toward the semiconductor structure 110, in accordance with some embodiments.

The conductive plugs 140 are made of conductive materials such as metal (e.g., aluminum, copper, gold, silver, tungsten or the like) or alloys thereof, in accordance with some embodiments. The conductive plugs 140 are formed using a deposition process (or a plating process) and a chemical mechanical polishing process, in accordance with some embodiments. The deposition process includes a physical vapor deposition process, in accordance with some embodiments.

Figures 1, 1F:
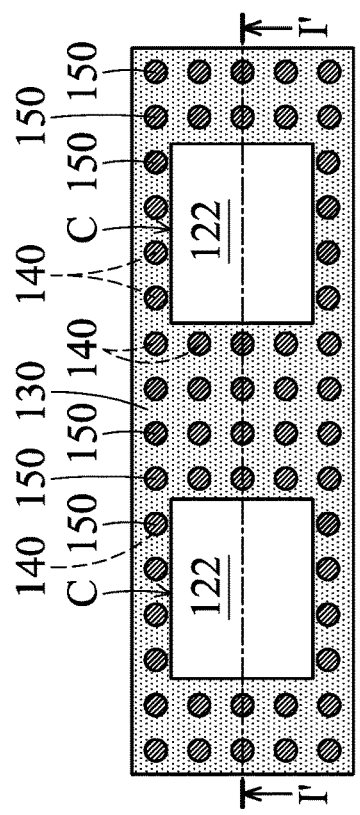
Figure 1F:
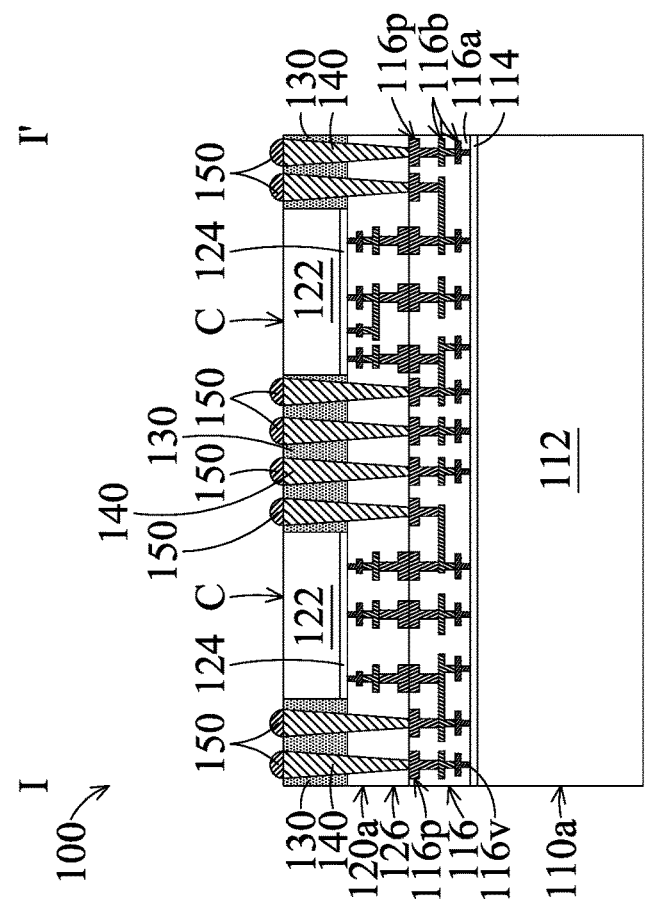

FIG. 1F-1 is a top view of the semiconductor structures, the insulating layer, the conductive bumps, and the conductive plugs of FIG. 1F, in accordance with some embodiments. FIG. 1F is a cross-sectional view illustrating the semiconductor structures, the insulating layer, the conductive bumps, and the conductive plugs along a sectional line I-I' in FIG. 1F-1, in accordance with some embodiments.

As shown in FIGS. 1F and 1F-1, conductive bumps 150 are formed over the conductive plugs 140, in accordance with some embodiments. The conductive bumps 150 are made of a solder material including Tin (Sn) and alloys thereof, in accordance with some embodiments. In some other embodiments, the conductive bumps 150 are made of a metal material or alloys thereof, in accordance with some embodiments.

As shown in FIGS. 1E, 1F and 1F-1, a dicing process is performed to cut through the semiconductor structures 110 and 120 and the insulating layer 130, in accordance with some embodiments. After the dicing process, chip stack structures 100 are formed, in accordance with some embodiments. For the sake of simplicity, FIG. 1F only shows one of the chip stack structures 100, in accordance with some embodiments.

Each chip stack structure 100 includes a chip 110a and a chip structure 120a, in accordance with some embodiments. The chip 110a comes from the semiconductor structure 110, in accordance with some embodiments. The chip 110a includes a substrate 112 which comes from the substrate structure 112', a portion of the device layer 114, and a portion of the interconnect structure 116, in accordance with some embodiments. The chip structure 120a includes the chips C, a portion of insulating layer 130, some of the conductive plugs 140, and some of the conductive bumps 150, in accordance with some embodiments. The chip C is thinner than the chip 110a, in accordance with some embodiments.

Figures 1G, 2:
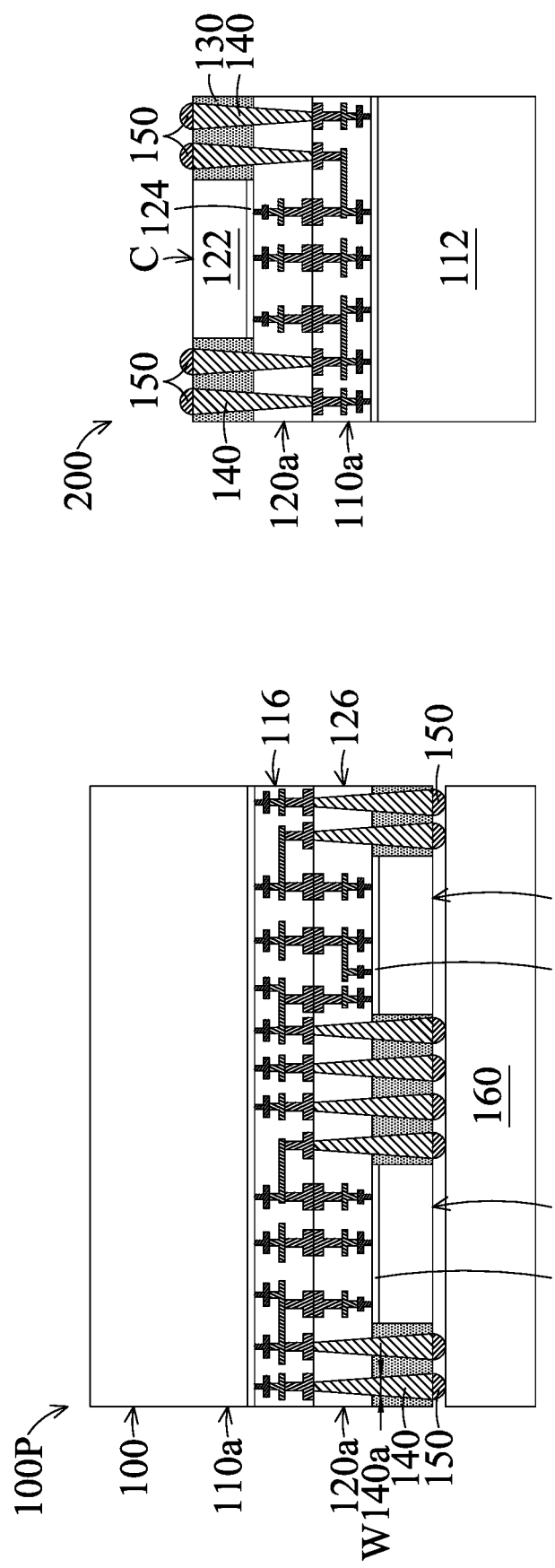

As shown in FIG. 1G, the chip stack structure 100 is bonded to a substrate 160 through the conductive bumps 150, in accordance with some embodiments. The chip stack structure 100 is electrically connected to the substrate 160 through the conductive bumps 150, in accordance with some embodiments.

The substrate 160 includes a wiring substrate or an interposer substrate, in accordance with some embodiments. The wiring substrate includes, for example, a dielectric structure, wiring layers in the dielectric structure, conductive vias in the dielectric structure and electrically connected between the wiring layers, in accordance with some embodiments.

The interposer substrate includes, for example, a substrate, a first redistribution layer over the substrate and electrically connected to the conductive bumps 150, a second redistribution layer under the substrate, and conductive vias passing through the substrate and electrically connected between the first redistribution layer and the second redistribution layer. In some other embodiments, the interposer substrate does not have the first redistribution layer and/or the second redistribution layer. In this step, a chip package structure 100P is substantially formed, in accordance with some embodiments.

The conductive plugs 140 are used to deliver signal and power between the chip stack structure 100 and the substrate 160, in accordance with some embodiments. Since the conductive plugs 140 are directly connected to the interconnect structure 116 without through the interconnect structure 126, the conductive path between the interconnect structure 116 and the substrate 160 is shortened, in accordance with some embodiments.

Therefore, the resistance of the conductive path between the chip 110a and the substrate 160 is decreased, in accordance with some embodiments. As a result, the signal integrity and the power integrity between the chip 110a and the substrate 160 are improved, in accordance with some embodiments.

In some embodiments, the chip 110a is a logic chip, and the chips C are memory chips such as a resistive random access memory (RRAM) chip, a dynamic random access memory (DRAM) chip, and/or a magnetic random access memory (MRAM) chip. Since the power integrity between the chip 110a and the substrate 160 is improved, the stability of the operation of the (logic) chip 110a is improved, in accordance with some embodiments. Therefore, the performance of the chip package structure 100P is improved, in accordance with some embodiments.

In some other embodiments, the conductive plugs 140 are directly connected to wiring layers of the interconnect structure 116 or 126 according to different requirements.

Since the conductive plugs 140 do not pass through the device layer 124 of the chip C, the size (e.g., the average width W140a) of the conductive plugs 140 is not limited to the layout of the device layer 124, in accordance with some embodiments. Therefore, the conductive plugs 140 may have a greater width than conductive plugs (not shown) passing through a device layer of a chip. As a result, the resistance of the conductive path between the chip 110a and the substrate 160 is decreased, in accordance with some embodiments. Therefore, the signal integrity and the power integrity between the chip 110a and the substrate 160 are improved, in accordance with some embodiments.

The average width W140a of the conductive plugs 140 ranges from about 4.5 µm to about 25 µm, in accordance with some embodiments. If the average width W140a is less than 4.5 µm, the resistance of the conductive plugs 140 may be too large. If the average width W140a is greater than 25 µm, the conductive plugs 140 may occupy too much space, which may limit the size of the chips C.

FIG. 2 is a cross-sectional view of a chip stack structure 200, in accordance with some embodiments. As shown in FIG. 2, the chip stack structure 200 is similar to the chip stack structure 100 of FIG. 1F, except that the chip structure 120a of the chip stack structure 200 has only one chip C, in accordance with some embodiments. The substrates 112 and 122 are similar in size such as width, in accordance with some embodiments.

FIG. 3 is a cross-sectional view of a chip stack structure 300, in accordance with some embodiments. As shown in FIG. 3, the chip stack structure 300 is similar to the chip stack structure 100 of FIG. 1F, except that the chip stack structure 300 further has a redistribution layer (RDL) 310 and conductive bumps 320, in accordance with some embodiments.

The redistribution layer 310 is formed over the chip structure 120a, in accordance with some embodiments. The conductive bumps 320 are formed over the redistribution layer 310, in accordance with some embodiments. The redistribution layer 310 includes a dielectric layer 312, wiring layers 314, and conductive vias 316, in accordance with some embodiments. The wiring layers 314 and conductive vias 316 are in the dielectric layer 312, in accordance with some embodiments. The conductive vias 316 are electrically connected between the wiring layers 314, in accordance with some embodiments.

The conductive plugs 140 and the conductive bumps 320 are electrically connected to the wiring layers 314 and the conductive vias 316, in accordance with some embodiments. The chips 110a and C are electrically connected to the conductive bumps 320 through the conductive plugs 140, the wiring layers 314, and the conductive vias 316, in accordance with some embodiments.

The dielectric layer 312 is made of a polymer material, an oxide-containing material (e.g. silicon oxide, borosilicate glass (BSG), phosphoric silicate glass (PSG), borophosphosilicate glass (BPSG), or fluorinated silicate glass (FSG)), a nitrogen-containing material (e.g., silicon oxynitride), a low-k material, a porous dielectric material, or a combination thereof, in accordance with some embodiments.

The wiring layers 314 and the conductive vias 316 are made of conductive materials such as metal (e.g., aluminum, copper, gold, silver, tungsten or the like) or alloys thereof, in accordance with some embodiments. The conductive bumps 320 are made of a solder material including Tin (Sn) and alloys thereof, in accordance with some embodiments. In some other embodiments, the conductive bumps 320 are made of a metal material or alloys thereof, in accordance with some embodiments.

FIG. 4 is a cross-sectional view of a chip stack structure 400, in accordance with some embodiments. As shown in FIG. 4, the chip stack structure 400 is similar to the chip stack structure 300 of FIG. 3, except that the chip structure 120a of the chip stack structure 400 has only one chip C, in accordance with some embodiments. The substrates 112 and 122 are similar in size such as width, in accordance with some embodiments.

Figure 5A:
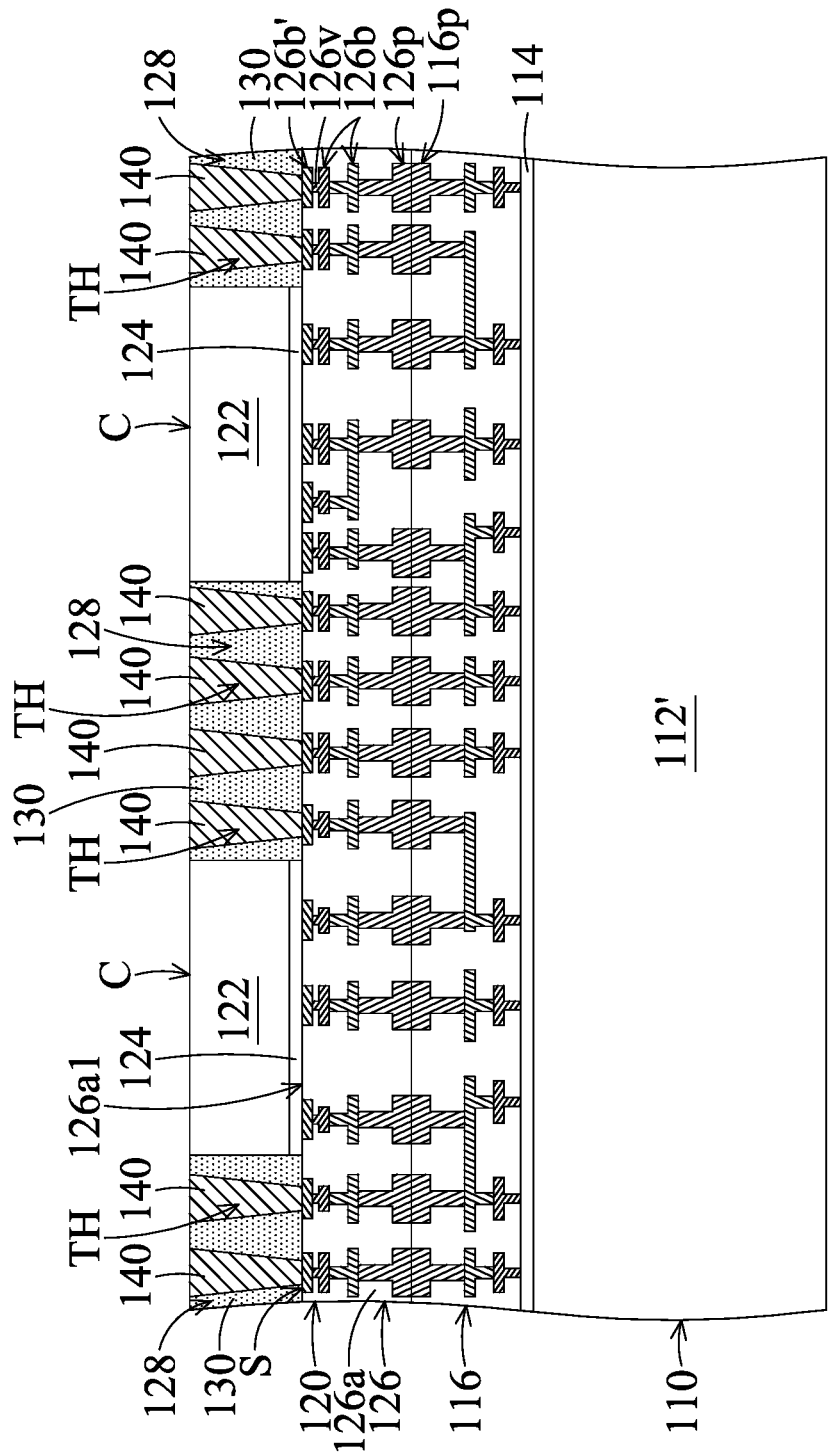
FIGS. 5A-5B are cross-sectional views of various stages of a process for forming a chip stack structure, in accordance with some embodiments.
Figure 5B:
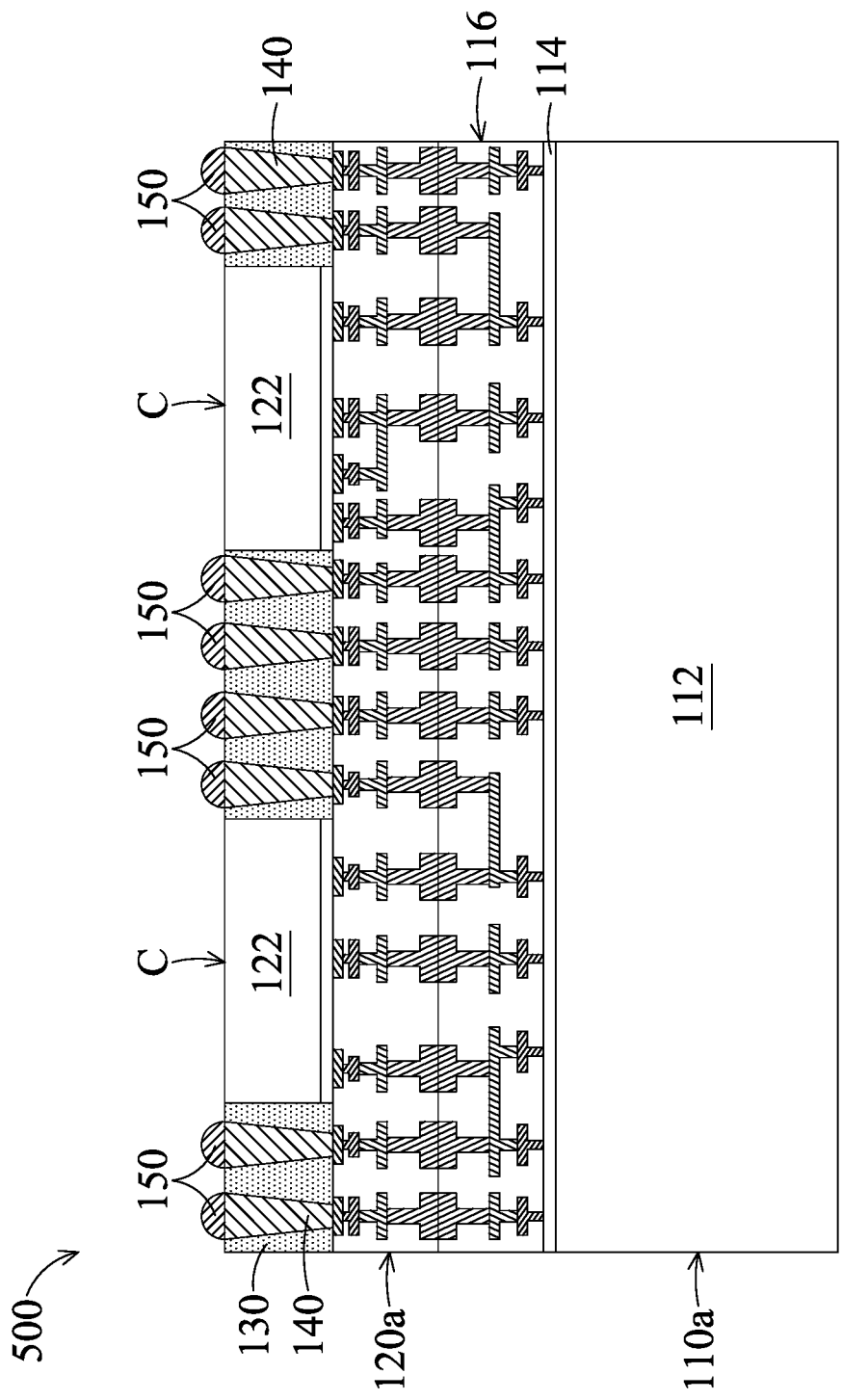

FIGS. 5A-5B are cross-sectional views of various stages of a process for forming a chip stack structure, in accordance with some embodiments. As shown in FIG. 5A, after the step of FIG. 1D, the insulating layer 130 is partially removed to form through holes TH, in accordance with some embodiments. The through holes TH pass through the insulating layer 130, in accordance with some embodiments.

The interconnect structure 126 includes a wiring layer 126b' embedded in the dielectric layer 126a, in accordance with some embodiments. A surface S of the wiring layer 126b' is exposed by the trench 128, in accordance with some embodiments. The surface S of the wiring layer 126b' is exposed by the dielectric layer 126a, in accordance with some embodiments. The surface S of the wiring layer 126b' is substantially level with a surface 126a1 of the dielectric layer 126a under the substrate 122, in accordance with some embodiments.

The through holes TH partially expose the surface S of the wiring layer 126b', in accordance with some embodiments. The removal process includes a photolithography process and an etching process such as a dry etching process, in accordance with some embodiments.

The dry etching process includes a plasma etching process, in accordance with some embodiments. The insulating layer 130 and the wiring layer 126b' are made of different materials, and therefore there is a sufficient etching selectivity between the insulating layer 130 and the wiring layer 126b'. As a result, the dry etching process can stop on the wiring layer 126b'.

As shown in FIG. 5A, conductive plugs 140 are formed in the through holes TH, in accordance with some embodiments. The conductive plugs 140 penetrate through the insulating layer 130 to the wiring layer 126b', in accordance with some embodiments. The conductive plugs 140 are in direct contact with the surface S of the wiring layer 126b', in accordance with some embodiments. The conductive plugs 140 surround the substrates 122 and the device layer 124, in accordance with some embodiments.

As shown in FIG. 5B, conductive bumps 150 are formed over the conductive plugs 140, in accordance with some embodiments. The conductive bumps 150 are made of a solder material including Tin (Sn) and alloys thereof, in accordance with some embodiments. In some other embodiments, the conductive bumps 150 are made of a metal material or alloys thereof, in accordance with some embodiments.

As shown in FIGS. 5A and 5B, a dicing process is performed to cut through the semiconductor structures 110 and 120 and the insulating layer 130, in accordance with some embodiments. After the dicing process, chip stack structures 500 are formed, in accordance with some embodiments. For the sake of simplicity, FIG. 5B only shows one of the chip stack structures 500, in accordance with some embodiments.

Each chip stack structure 500 includes a chip 110a and a chip structure 120a, in accordance with some embodiments. The chip 110a comes from the semiconductor structure 110, in accordance with some embodiments. The chip 110a includes a substrate 112 which comes from the substrate structure 112', a portion of the device layer 114, and a portion of the interconnect structure 116, in accordance with some embodiments. The chip structure 120a includes the chips C, a portion of insulating layer 130, some of the conductive plugs 140, and some of the conductive bumps 150, in accordance with some embodiments.

Figure 6:
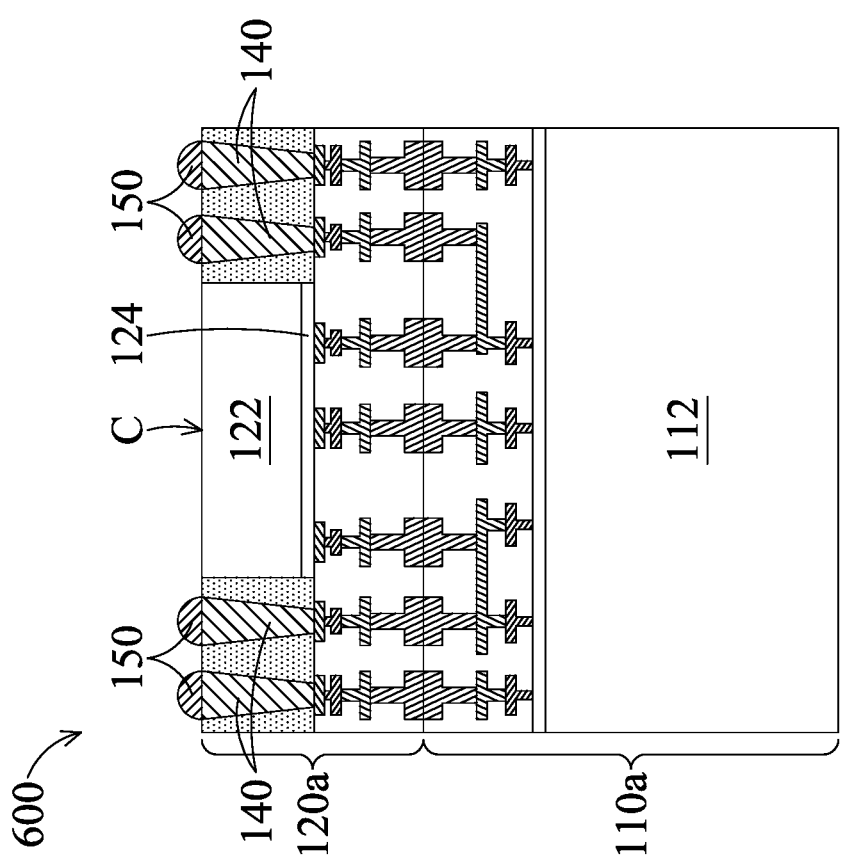
FIG. 6 is a cross-sectional view of a chip stack structure, in accordance with some embodiments.

FIG. 6 is a cross-sectional view of a chip stack structure 600, in accordance with some embodiments. As shown in FIG. 6, the chip stack structure 600 is similar to the chip stack structure 500 of FIG. 5B, except that the chip structure 120a of the chip stack structure 600 has only one chip C, in accordance with some embodiments. The substrates 112 and 122 are similar in size such as width, in accordance with some embodiments.

Figure 7:
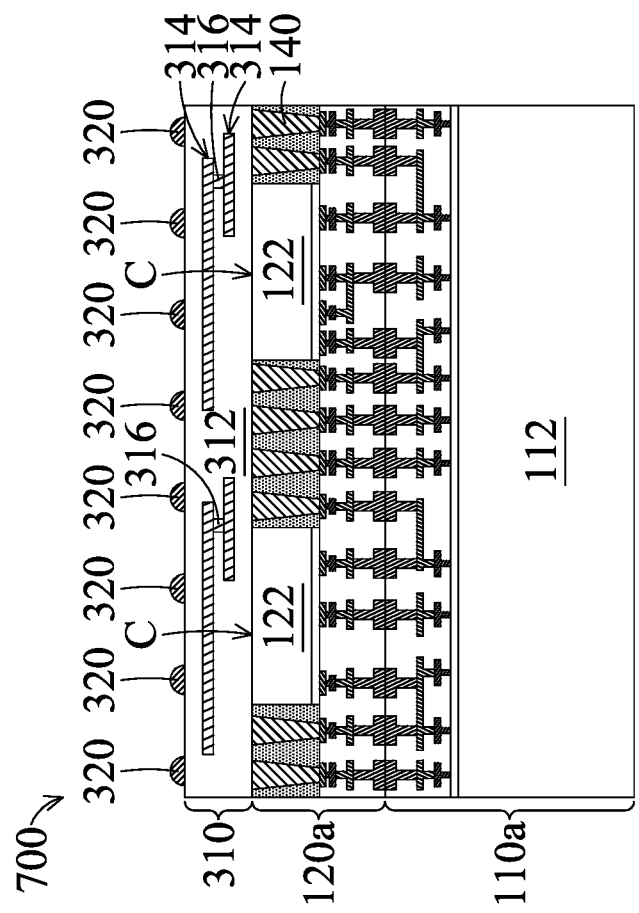
FIG. 7 is a cross-sectional view of a chip stack structure, in accordance with some embodiments.

FIG. 7 is a cross-sectional view of a chip stack structure 700, in accordance with some embodiments. As shown in FIG. 7, the chip stack structure 700 is similar to the chip stack structure 500 of FIG. 5B, except that the chip stack structure 700 further has a redistribution layer (RDL) 310 and conductive bumps 320, in accordance with some embodiments.

The redistribution layer 310 is formed over the chip structure 120a, in accordance with some embodiments. The conductive bumps 320 are formed over the redistribution layer 310, in accordance with some embodiments. The redistribution layer 310 includes a dielectric layer 312, wiring layers 314, and conductive vias 316, in accordance with some embodiments. The wiring layers 314 and conductive vias 316 are in the dielectric layer 312, in accordance with some embodiments. The conductive vias 316 are electrically connected between the wiring layers 314, in accordance with some embodiments.

The conductive plugs 140 and the conductive bumps 320 are electrically connected to the wiring layers 314 and the conductive vias 316, in accordance with some embodiments. The chips 110a and C are electrically connected to the conductive bumps 320 through the conductive plugs 140, the wiring layers 314, and the conductive vias 316, in accordance with some embodiments.

Figure 8:
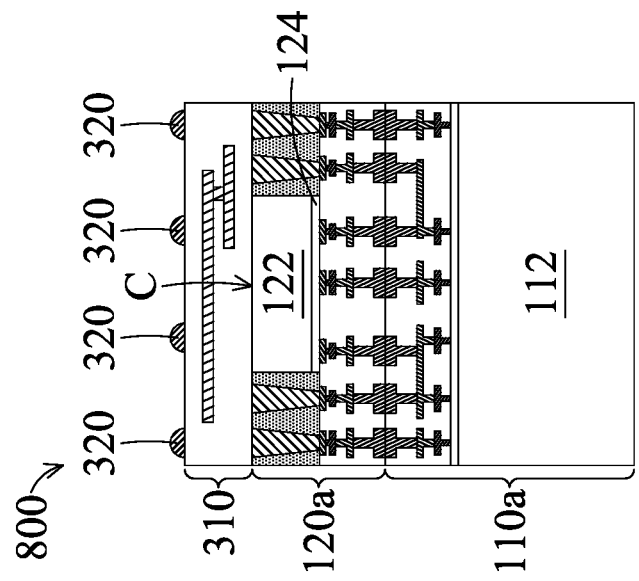
FIG. 8 is a cross-sectional view of a chip stack structure, in accordance with some embodiments.

FIG. 8 is a cross-sectional view of a chip stack structure 800, in accordance with some embodiments. As shown in FIG. 8, the chip stack structure 800 is similar to the chip stack structure 700 of FIG. 7, except that the chip structure 120a of the chip stack structure 800 has only one chip C, in accordance with some embodiments. The substrates 112 and 122 are similar in size such as width, in accordance with some embodiments.

Figure 9A:
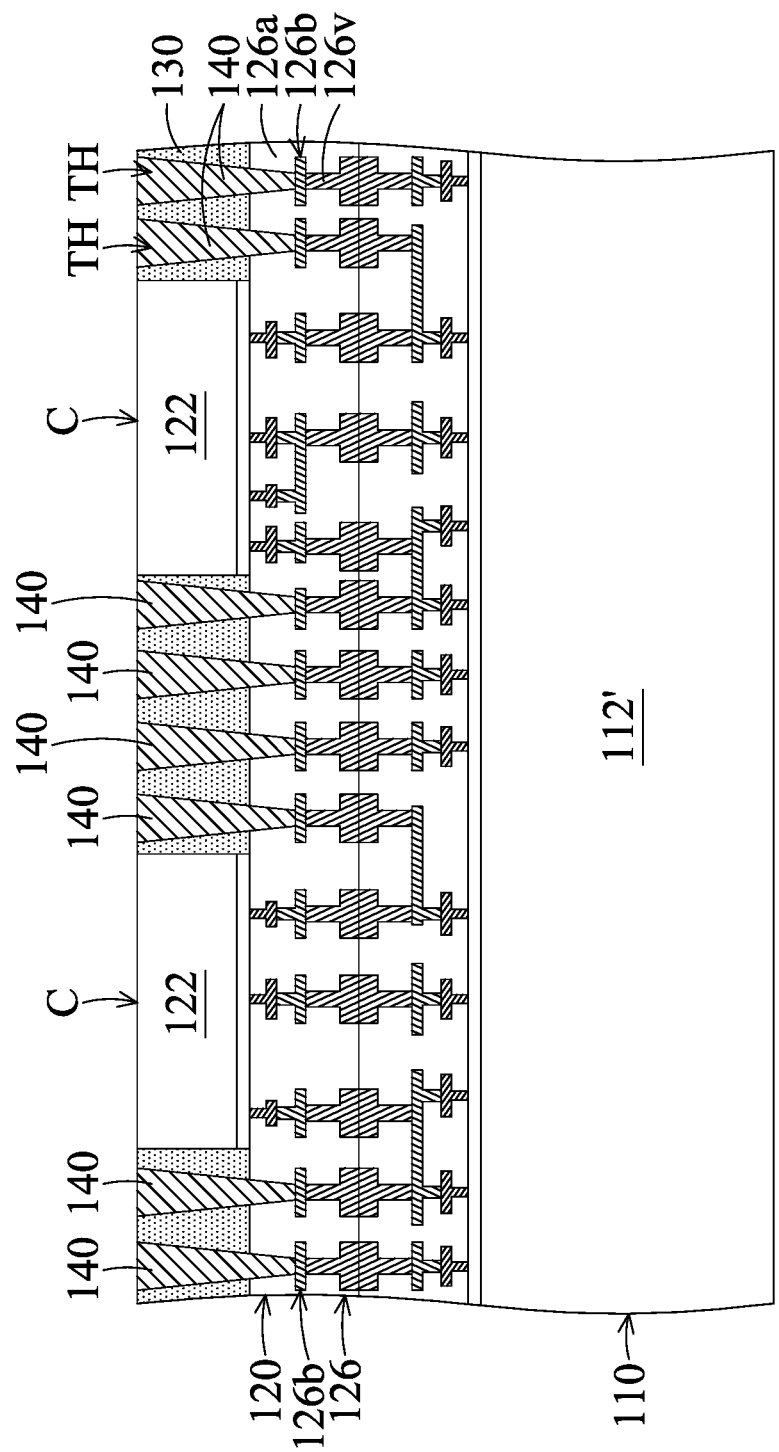
FIGS. 9A-9B are cross-sectional views of various stages of a process for forming a chip stack structure, in accordance with some embodiments.
Figure 9B:
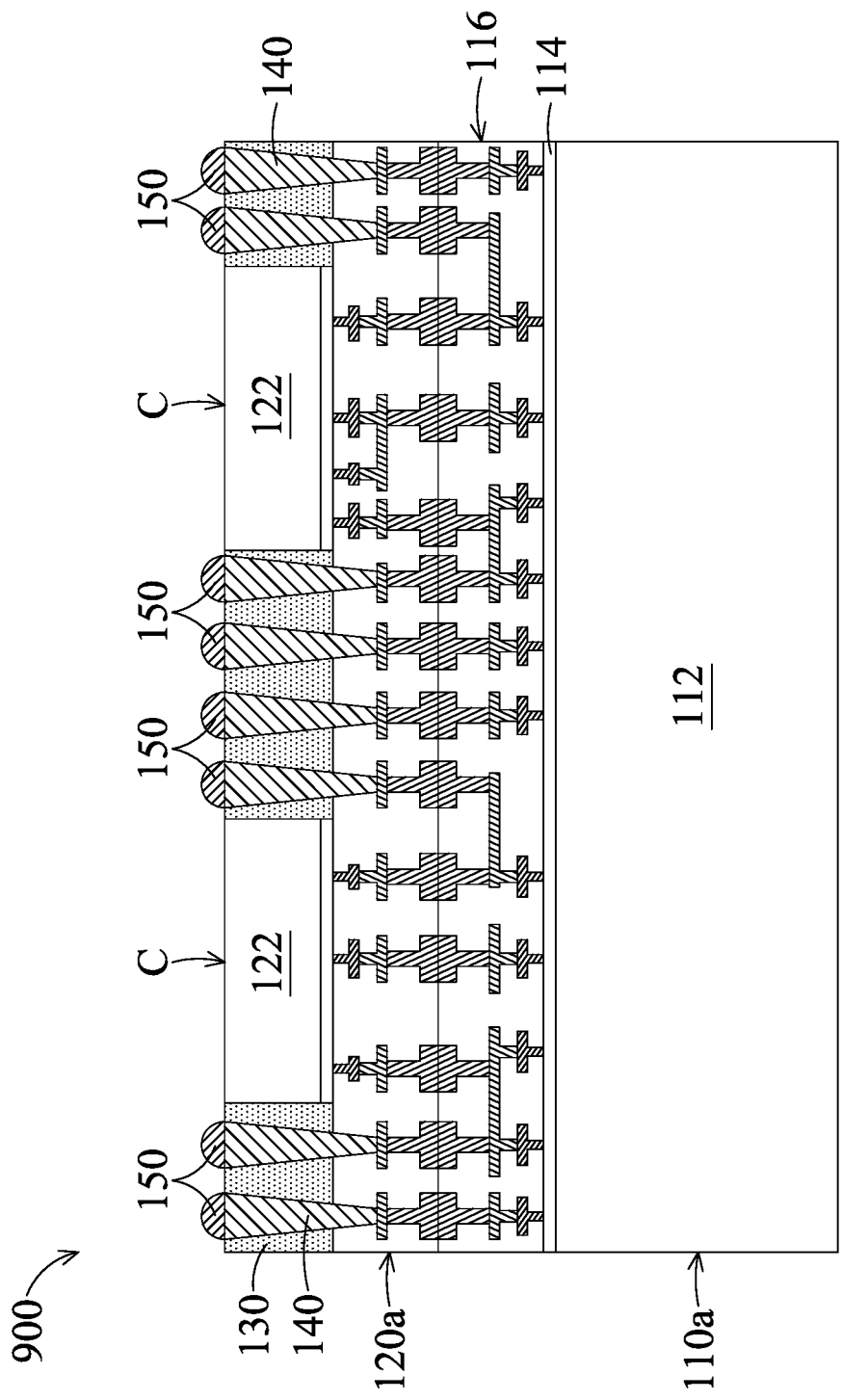

FIGS. 9A-9B are cross-sectional views of various stages of a process for forming a chip stack structure, in accordance with some embodiments. As shown in FIG. 9A, after the step of FIG. 1D, the insulating layer 130 and the dielectric layer 126a are partially removed to form through holes TH, in accordance with some embodiments. The through holes TH pass through the insulating layer 130 and extend into the dielectric layer 126a, in accordance with some embodiments. The through holes TH partially expose the wiring layer 126b of the interconnect structure 126, in accordance with some embodiments. The removal process includes a photolithography process and an etching process such as a dry etching process, in accordance with some embodiments.

The dry etching process includes a plasma etching process, in accordance with some embodiments. The dielectric layer 126a and the wiring layer 126b are made of different materials, and therefore there is a sufficient etching selectivity between the dielectric layer 126a and the wiring layer 126b. As a result, the dry etching process can stop on the wiring layer 126b.

As shown in FIG. 9A, conductive plugs 140 are formed in the through holes TH, in accordance with some embodiments. The conductive plugs 140 penetrate through the insulating layer 130 and extend into the dielectric layer 126a, in accordance with some embodiments. The conductive plugs 140 are in direct contact with the wiring layer 126b, in accordance with some embodiments. The conductive plugs 140 surround the substrates 122 and the device layer 124, in accordance with some embodiments.

As shown in FIG. 9B, conductive bumps 150 are formed over the conductive plugs 140, in accordance with some embodiments. As shown in FIGS. 9A and 9B, a dicing process is performed to cut through the semiconductor structures 110 and 120 and the insulating layer 130, in accordance with some embodiments. After the dicing process, chip stack structures 900 are formed, in accordance with some embodiments. For the sake of simplicity, FIG. 9B only shows one of the chip stack structures 900, in accordance with some embodiments.

Each chip stack structure 900 includes a chip 110a and a chip structure 120a, in accordance with some embodiments. The chip 110a comes from the semiconductor structure 110, in accordance with some embodiments. The chip 110a includes a substrate 112 which comes from the substrate structure 112', a portion of the device layer 114, and a portion of the interconnect structure 116, in accordance with some embodiments. The chip structure 120a includes the chips C, a portion of insulating layer 130, some of the conductive plugs 140, and some of the conductive bumps 150, in accordance with some embodiments.

Figure 10:
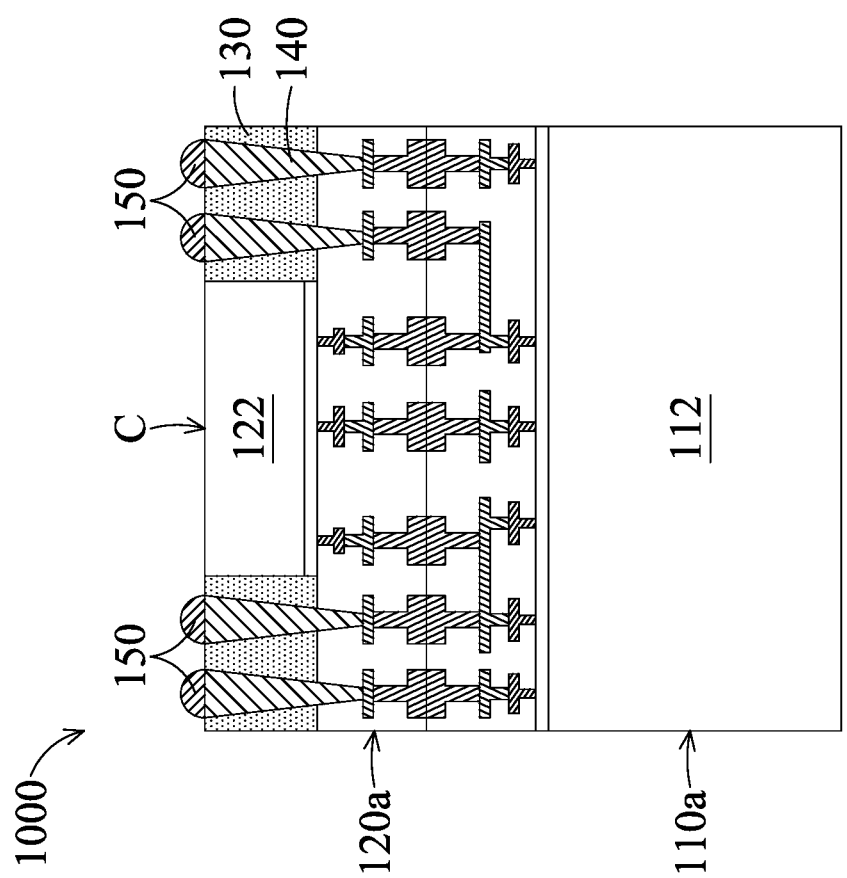
FIG. 10 is a cross-sectional view of a chip stack structure, in accordance with some embodiments.

FIG. 10 is a cross-sectional view of a chip stack structure 1000, in accordance with some embodiments. As shown in FIG. 10, the chip stack structure 1000 is similar to the chip stack structure 900 of FIG. 9B, except that the chip structure 120a of the chip stack structure 1000 has only one chip C, in accordance with some embodiments. The substrates 112 and 122 are similar in size such as width, in accordance with some embodiments.

Figure 11:
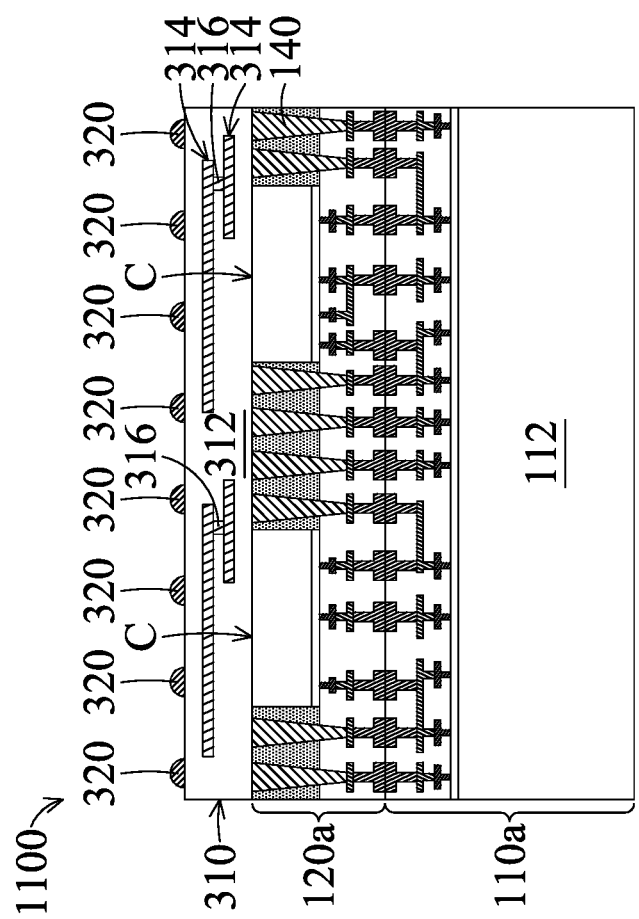
FIG. 11 is a cross-sectional view of a chip stack structure, in accordance with some embodiments.

FIG. 11 is a cross-sectional view of a chip stack structure 1100, in accordance with some embodiments. As shown in FIG. 11, the chip stack structure 1100 is similar to the chip stack structure 900 of FIG. 9B, except that the chip stack structure 1100 further has a redistribution layer 310 and conductive bumps 320, in accordance with some embodiments.

The redistribution layer 310 is formed over the chip structure 120a, in accordance with some embodiments. The conductive bumps 320 are formed over the redistribution layer 310, in accordance with some embodiments. The redistribution layer 310 includes a dielectric layer 312, wiring layers 314, and conductive vias 316, in accordance with some embodiments. The wiring layers 314 and conductive vias 316 are in the dielectric layer 312, in accordance with some embodiments. The conductive vias 316 are electrically connected between the wiring layers 314, in accordance with some embodiments.

The conductive plugs 140 and the conductive bumps 320 are electrically connected to the wiring layers 314 and the conductive vias 316, in accordance with some embodiments. The chips 110a and C are electrically connected to the conductive bumps 320 through the conductive plugs 140, the wiring layers 314, and the conductive vias 316, in accordance with some embodiments.

Figure 12:
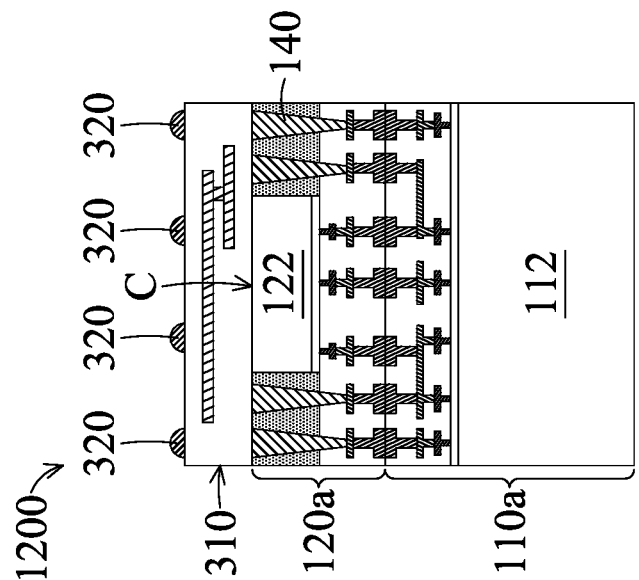
FIG. 12 is a cross-sectional view of a chip stack structure, in accordance with some embodiments.

FIG. 12 is a cross-sectional view of a chip stack structure 1200, in accordance with some embodiments. As shown in FIG. 12, the chip stack structure 1200 is similar to the chip stack structure 1100 of FIG. 11, except that the chip structure 120a of the chip stack structure 1200 has only one chip C, in accordance with some embodiments. The substrates 112 and 122 are similar in size such as width, in accordance with some embodiments.

Figure 13A:
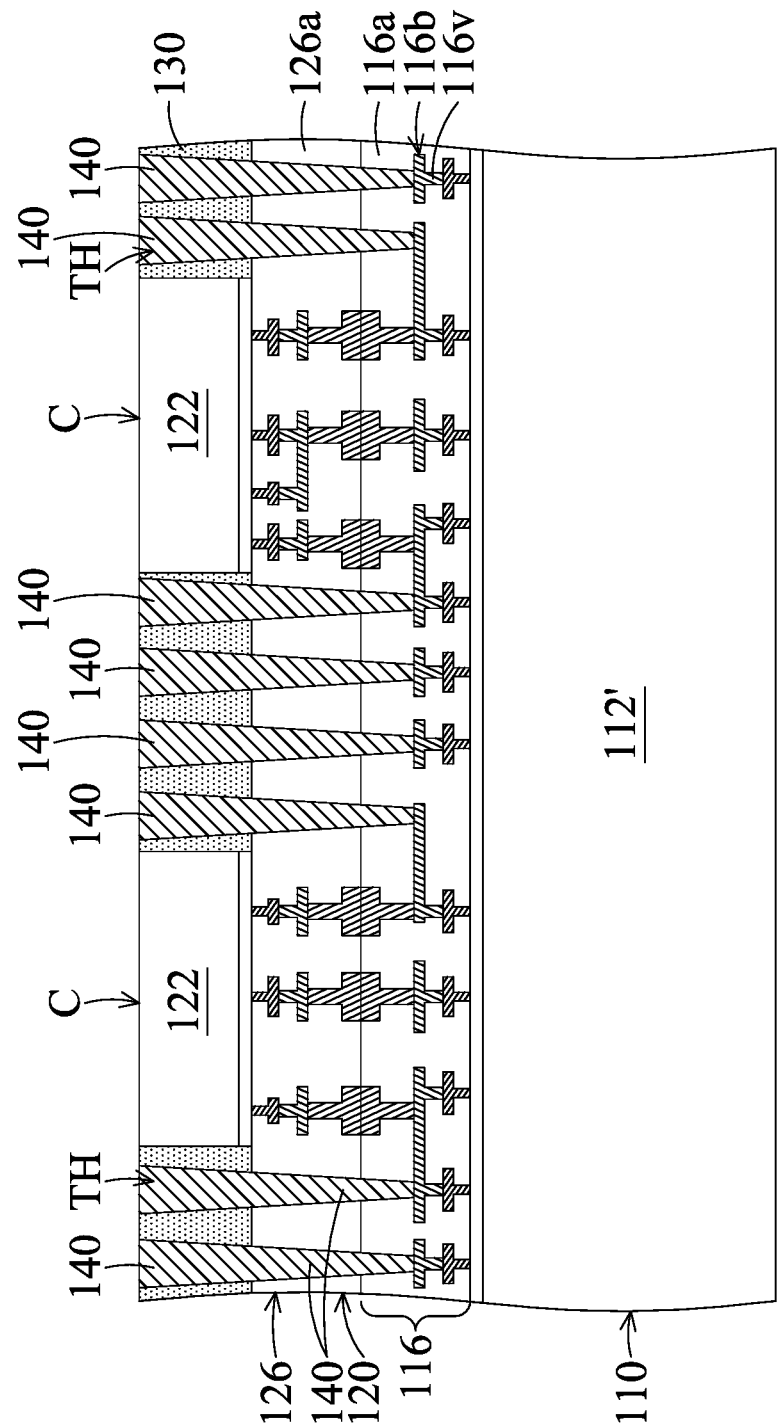
FIGS. 13A-13B are cross-sectional views of various stages of a process for forming a chip stack structure, in accordance with some embodiments.
Figure 13B:
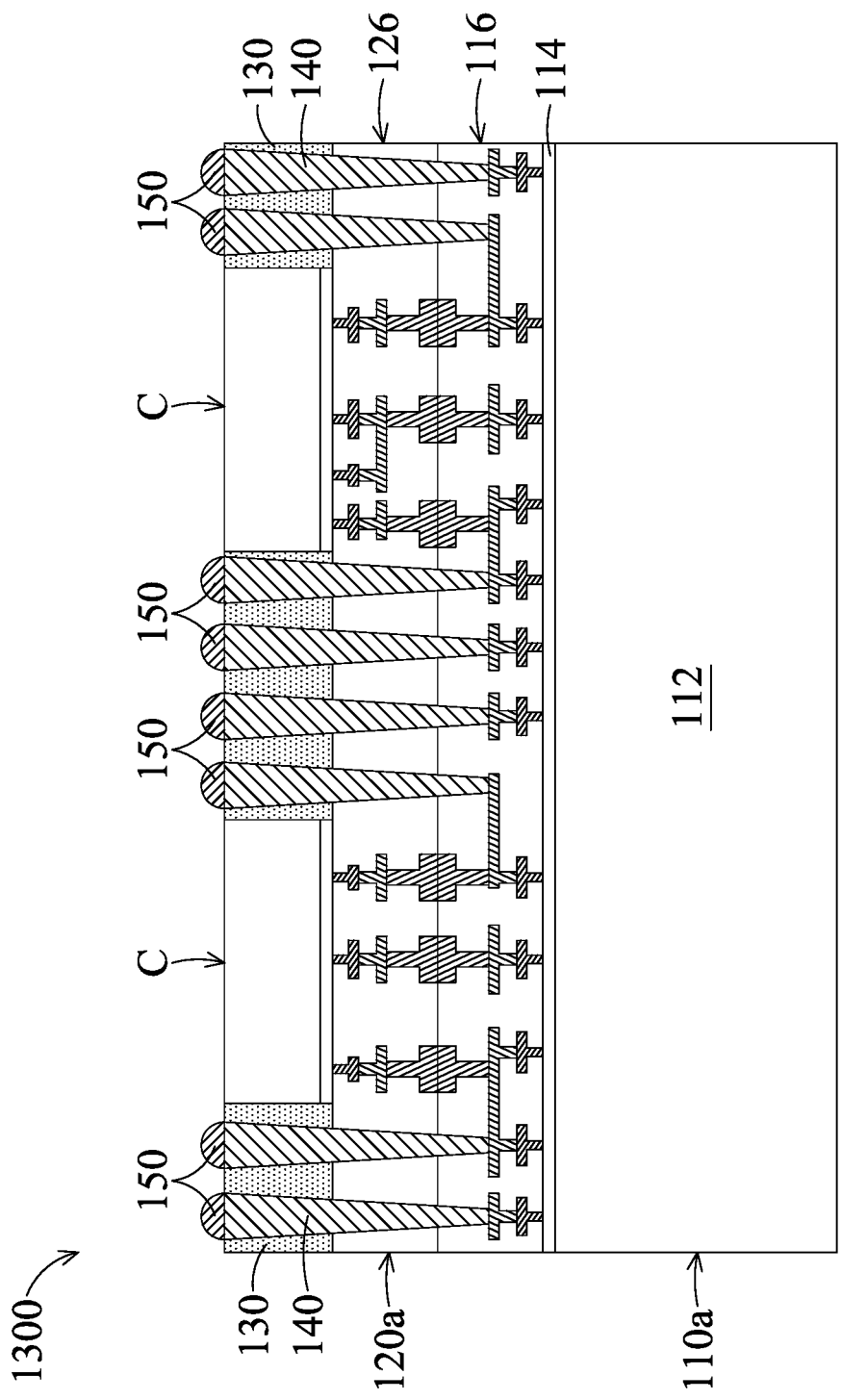

FIGS. 13A-13B are cross-sectional views of various stages of a process for forming a chip stack structure, in accordance with some embodiments. As shown in FIG. 13A, after the step of FIG. 1D, the insulating layer 130 and the dielectric layers 116a and 126a are partially removed to form through holes TH, in accordance with some embodiments.

The through holes TH pass through the insulating layer 130 and the dielectric layer 126a and extend into the dielectric layer 116a, in accordance with some embodiments. The through holes TH partially expose the wiring layer 116b of the interconnect structure 116, in accordance with some embodiments. The removal process includes a photolithography process and an etching process such as a dry etching process, in accordance with some embodiments.

The dry etching process includes a plasma etching process, in accordance with some embodiments. The dielectric layer 116a and the wiring layer 116b are made of different materials, so there is a sufficient etching selectivity between the dielectric layer 116a and the wiring layer 116b. As a result, the dry etching process can stop on the wiring layer 116b.

As shown in FIG. 13A, conductive plugs 140 are formed in the through holes TH, in accordance with some embodiments. The conductive plugs 140 penetrate through the insulating layer 130 and the dielectric layer 126a and extend into the dielectric layer 116a, in accordance with some embodiments. The conductive plugs 140 are in direct contact with the wiring layer 116b, in accordance with some embodiments. The conductive plugs 140 surround the substrates 122 and the device layer 124, in accordance with some embodiments.

As shown in FIG. 13B, conductive bumps 150 are formed over the conductive plugs 140, in accordance with some embodiments. As shown in FIGS. 13A and 13B, a dicing process is performed to cut through the semiconductor structures 110 and 120 and the insulating layer 130, in accordance with some embodiments. After the dicing process, chip stack structures 1300 are formed, in accordance with some embodiments. For the sake of simplicity, FIG. 13B only shows one of the chip stack structures 1300, in accordance with some embodiments.

Each chip stack structure 1300 includes a chip 110a and a chip structure 120a, in accordance with some embodiments. The chip 110a comes from the semiconductor structure 110, in accordance with some embodiments. The chip 110a includes a substrate 112 which comes from the substrate structure 112', a portion of the device layer 114, and a portion of the interconnect structure 116, in accordance with some embodiments. The chip structure 120a includes the chips C, a portion of insulating layer 130, some of the conductive plugs 140, and some of the conductive bumps 150, in accordance with some embodiments.

Figure 14:
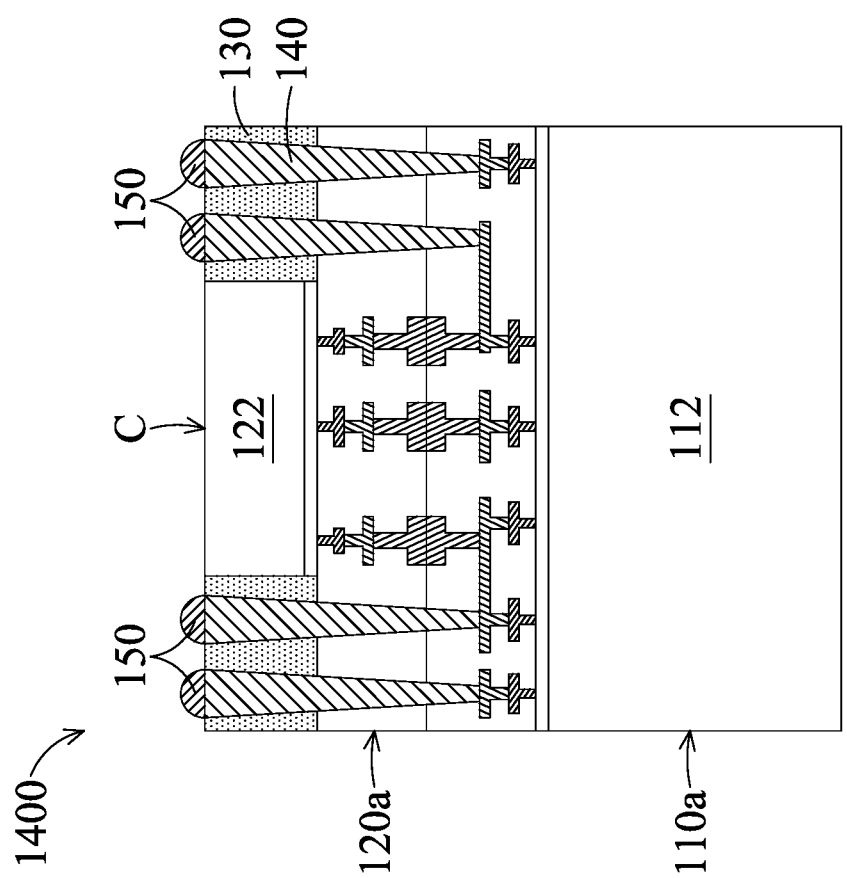
FIG. 14 is a cross-sectional view of a chip stack structure, in accordance with some embodiments.

FIG. 14 is a cross-sectional view of a chip stack structure 1400, in accordance with some embodiments. As shown in FIG. 14, the chip stack structure 1400 is similar to the chip stack structure 1300 of FIG. 13B, except that the chip structure 120a of the chip stack structure 1400 has only one chip C, in accordance with some embodiments. The substrates 112 and 122 are similar in size such as width, in accordance with some embodiments.

Figure 15:
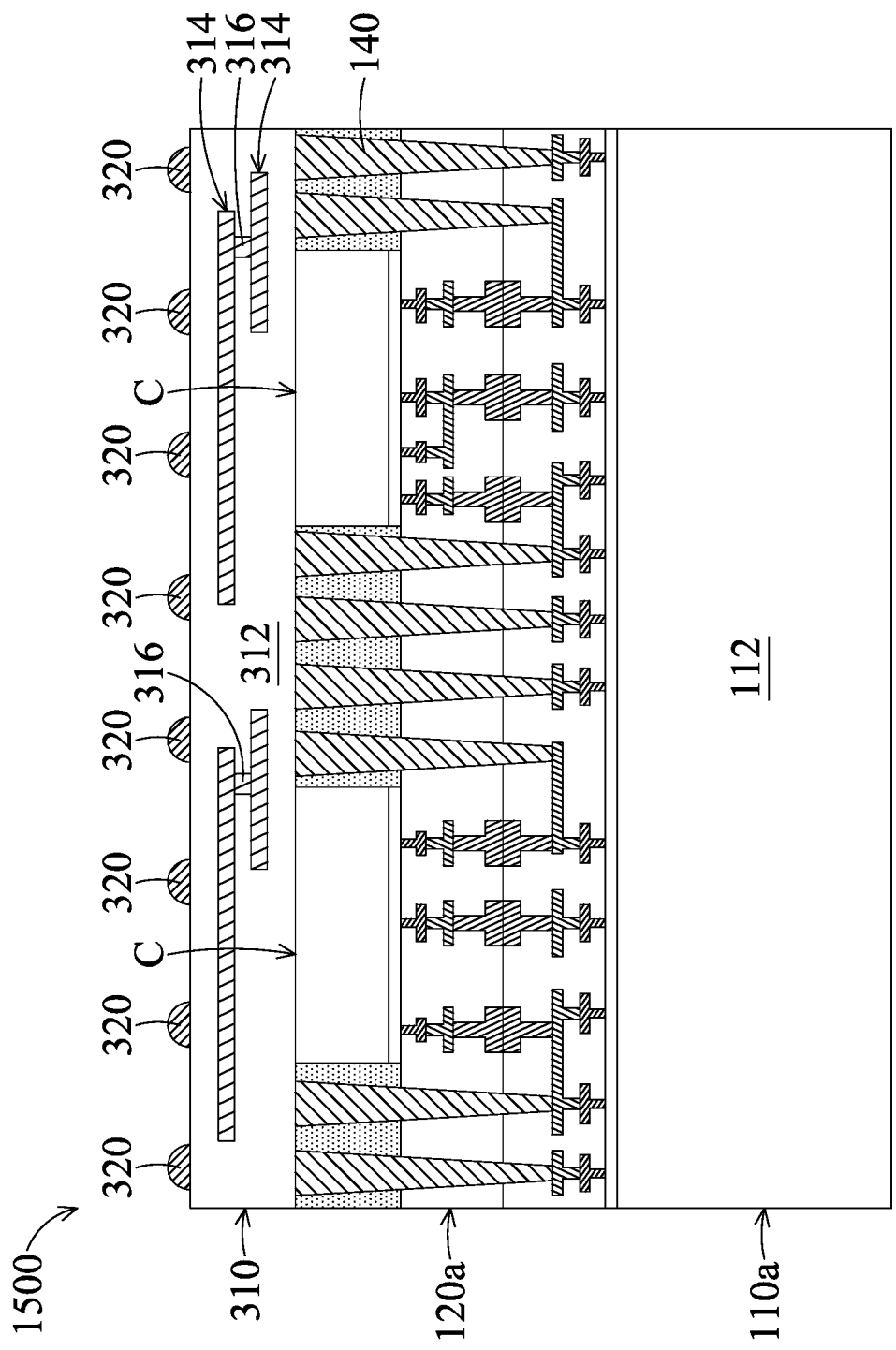
FIG. 15 is a cross-sectional view of a chip stack structure, in accordance with some embodiments.

FIG. 15 is a cross-sectional view of a chip stack structure 1500, in accordance with some embodiments. As shown in FIG. 15, the chip stack structure 1500 is similar to the chip stack structure 1300 of FIG. 13B, except that the chip stack structure 1500 further has a redistribution layer 310 and conductive bumps 320, in accordance with some embodiments.

The redistribution layer 310 is formed over the chip structure 120a, in accordance with some embodiments. The conductive bumps 320 are formed over the redistribution layer 310, in accordance with some embodiments. The redistribution layer 310 includes a dielectric layer 312, wiring layers 314, and conductive vias 316, in accordance with some embodiments. The wiring layers 314 and conductive vias 316 are in the dielectric layer 312, in accordance with some embodiments. The conductive vias 316 are electrically connected between the wiring layers 314, in accordance with some embodiments.

The conductive plugs 140 and the conductive bumps 320 are electrically connected to the wiring layers 314 and the conductive vias 316, in accordance with some embodiments. The chips 110a and C are electrically connected to the conductive bumps 320 through the conductive plugs 140, the wiring layers 314, and the conductive vias 316, in accordance with some embodiments.

Figure 16:
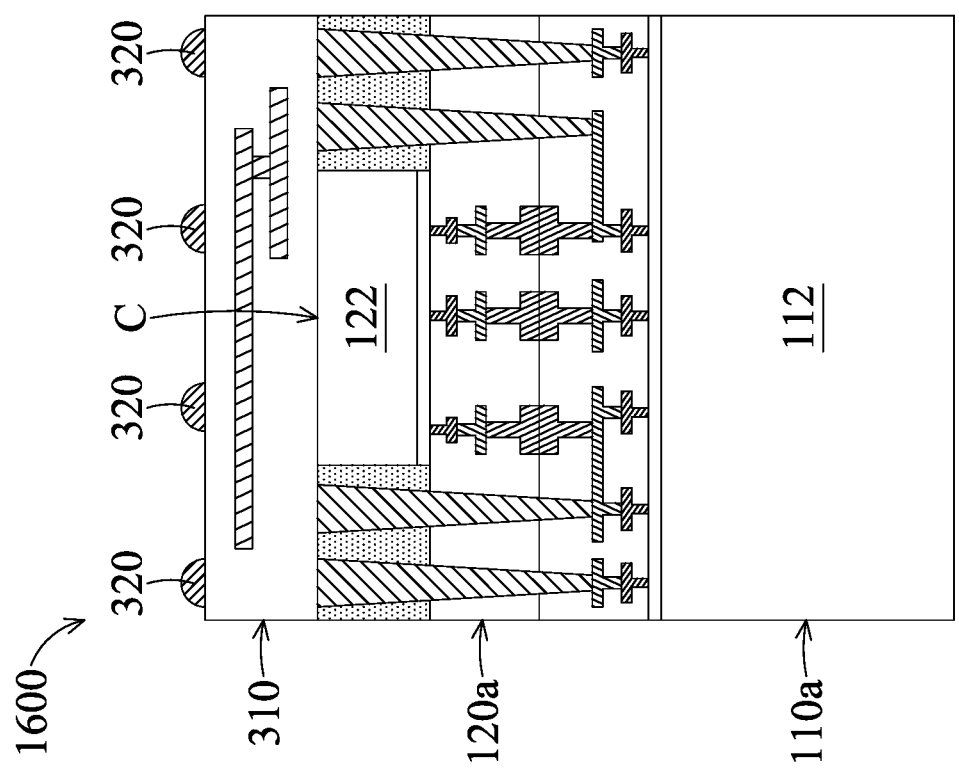
FIG. 16 is a cross-sectional view of a chip stack structure, in accordance with some embodiments.

FIG. 16 is a cross-sectional view of a chip stack structure 1600, in accordance with some embodiments. As shown in FIG. 16, the chip stack structure 1600 is similar to the chip stack structure 1500 of FIG. 15, except that the chip structure 120a of the chip stack structure 1600 has only one chip C, in accordance with some embodiments. The substrates 112 and 122 are similar in size such as width, in accordance with some embodiments.

Figure 17A:
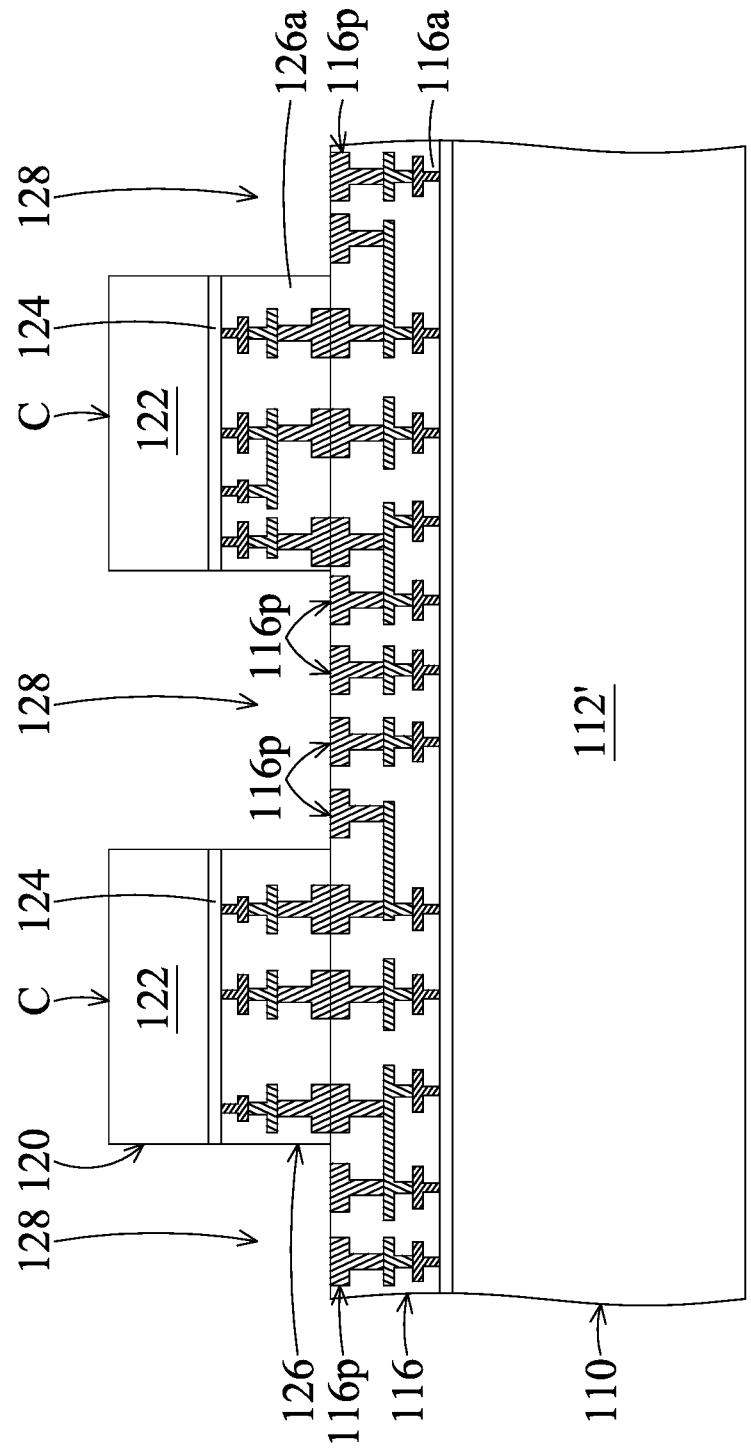
FIGS. 17A-17D are cross-sectional views of various stages of a process for forming a chip stack structure, in accordance with some embodiments.

FIGS. 17A-17D are cross-sectional views of various stages of a process for forming a chip stack structure, in accordance with some embodiments. As shown in FIG. 17A, after the step of FIG. 1B, portions of the semiconductor structure 120 are removed to form a trench 128 in the semiconductor structure 120, in accordance with some embodiments. The trench 128 passes through the semiconductor structure 120 and exposes the bonding pads 116p of the interconnect structure 116, in accordance with some embodiments. The removal process includes a photolithography process and an etching process such as a dry etching process, in accordance with some embodiments.

The dry etching process includes a plasma etching process, in accordance with some embodiments. The dielectric layer 126a and the bonding pads 116p are made of different materials, so there is a sufficient etching selectivity between the dielectric layer 126a and the bonding pads 116p. As a result, the dry etching process can stop on the bonding pads 116p.

As shown in FIGS. 1B and 17A, portions of the substrate structure 122' remain over the interconnect structure 126 after the removal process of the semiconductor structure 120, in accordance with some embodiments. The portions form substrates 122, in accordance with some embodiments. The trench 128 continuously surrounds the substrates 122, in accordance with some embodiments.

As shown in FIG. 17A, one of the substrates 122, the device layer 124 remaining under the one of the substrates 122, and the interconnect structure 126 remaining under the one of the substrates 122 together form a chip C, in accordance with some embodiments. The interconnect structure 126 and the substrate 122 thereover have substantially the same width, in accordance with some embodiments.

Figure 17B:
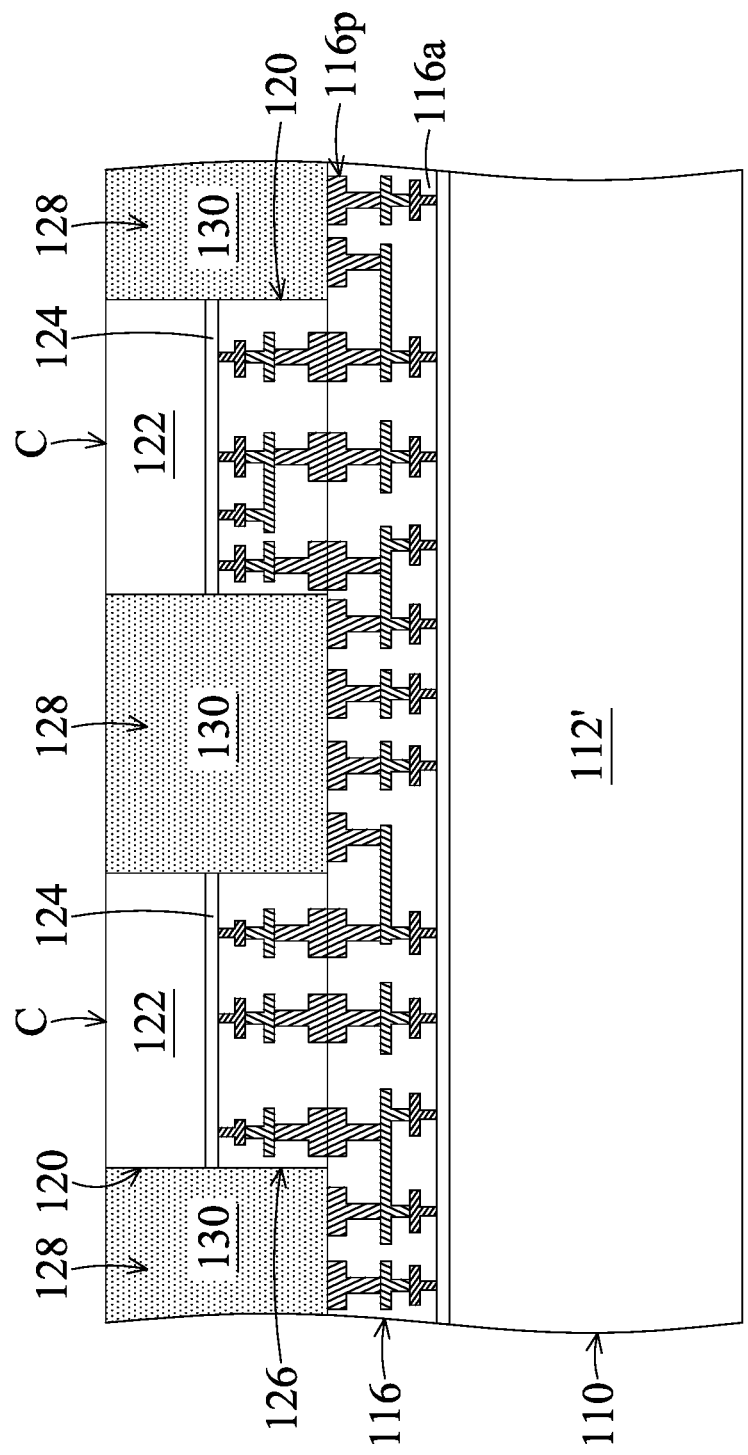

As shown in FIG. 17B, an insulating layer 130 is formed in the trench 128, in accordance with some embodiments. The insulating layer 130 passes through the semiconductor structure 120, in accordance with some embodiments. The insulating layer 130 is over the interconnect structure 116, in accordance with some embodiments. The insulating layer 130 is in direct contact with the interconnect structure 116, in accordance with some embodiments. The insulating layer 130 continuously surrounds the chips C, in accordance with some embodiments.

Figure 17C:
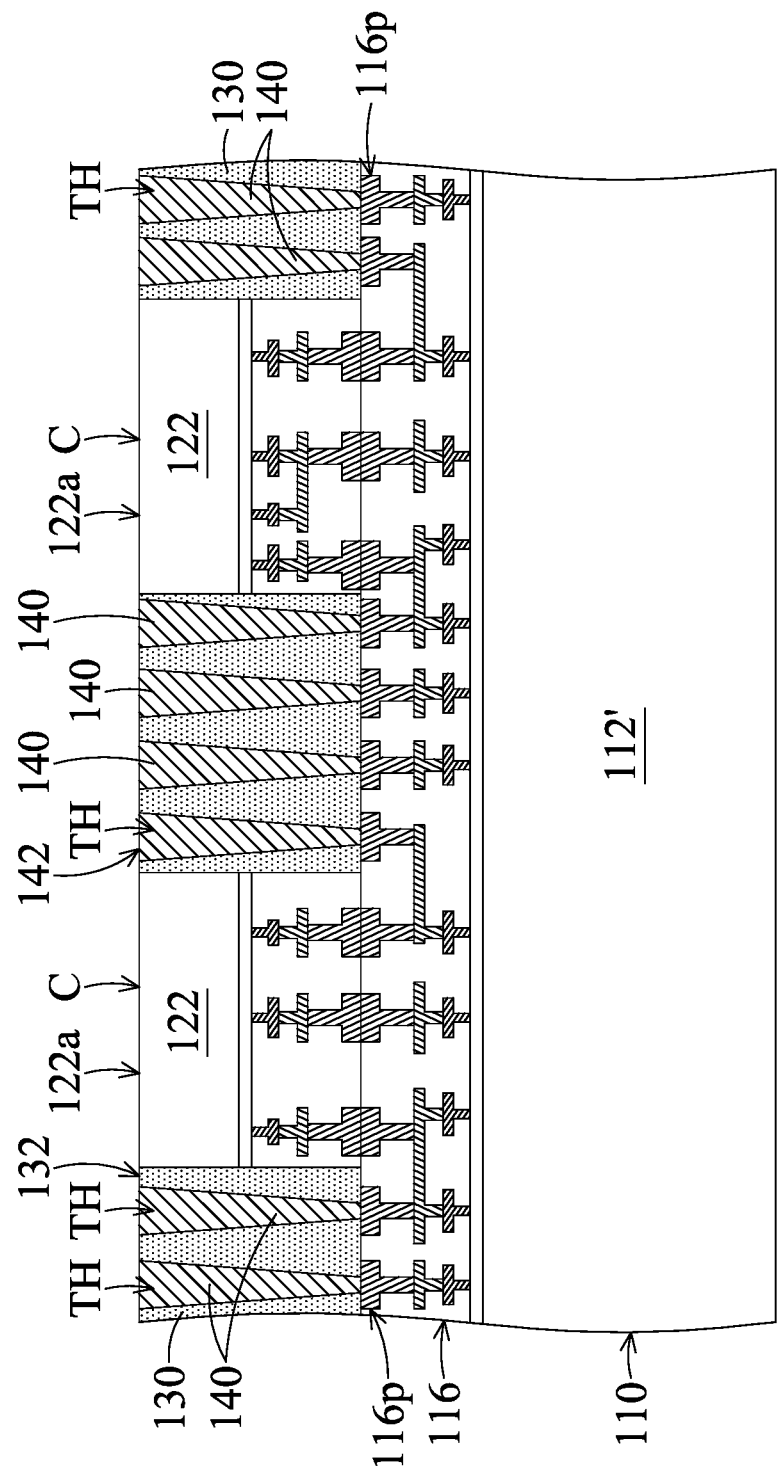

As shown in FIGS. 17B and 17C, the insulating layer 130 is partially removed to form through holes TH, in accordance with some embodiments. The through holes TH pass through the insulating layer 130, in accordance with some embodiments. The through holes TH partially expose the bonding pads 116p of the interconnect structure 116, in accordance with some embodiments. The removal process includes a photolithography process and an etching process such as a dry etching process, in accordance with some embodiments.

The dry etching process includes a plasma etching process, in accordance with some embodiments. The insulating layer 130 and the bonding pads 116p are made of different materials, and therefore there is a sufficient etching selectivity between the insulating layer 130 and the bonding pads 116p. As a result, the dry etching process can stop on the bonding pads 116p.

As shown in FIG. 17C, conductive plugs 140 are formed in the through holes TH, in accordance with some embodiments. The conductive plugs 140 penetrate through the insulating layer 130 to the bonding pads 116p of the interconnect structure 116, in accordance with some embodiments. The conductive plugs 140 surround the chips C, in accordance with some embodiments. A surface 122a of the substrate 122, a surface 132 of the insulating layer 130, and a surface 142 of the conductive plugs 140 are substantially level with each other, in accordance with some embodiments.

Figure 17D:
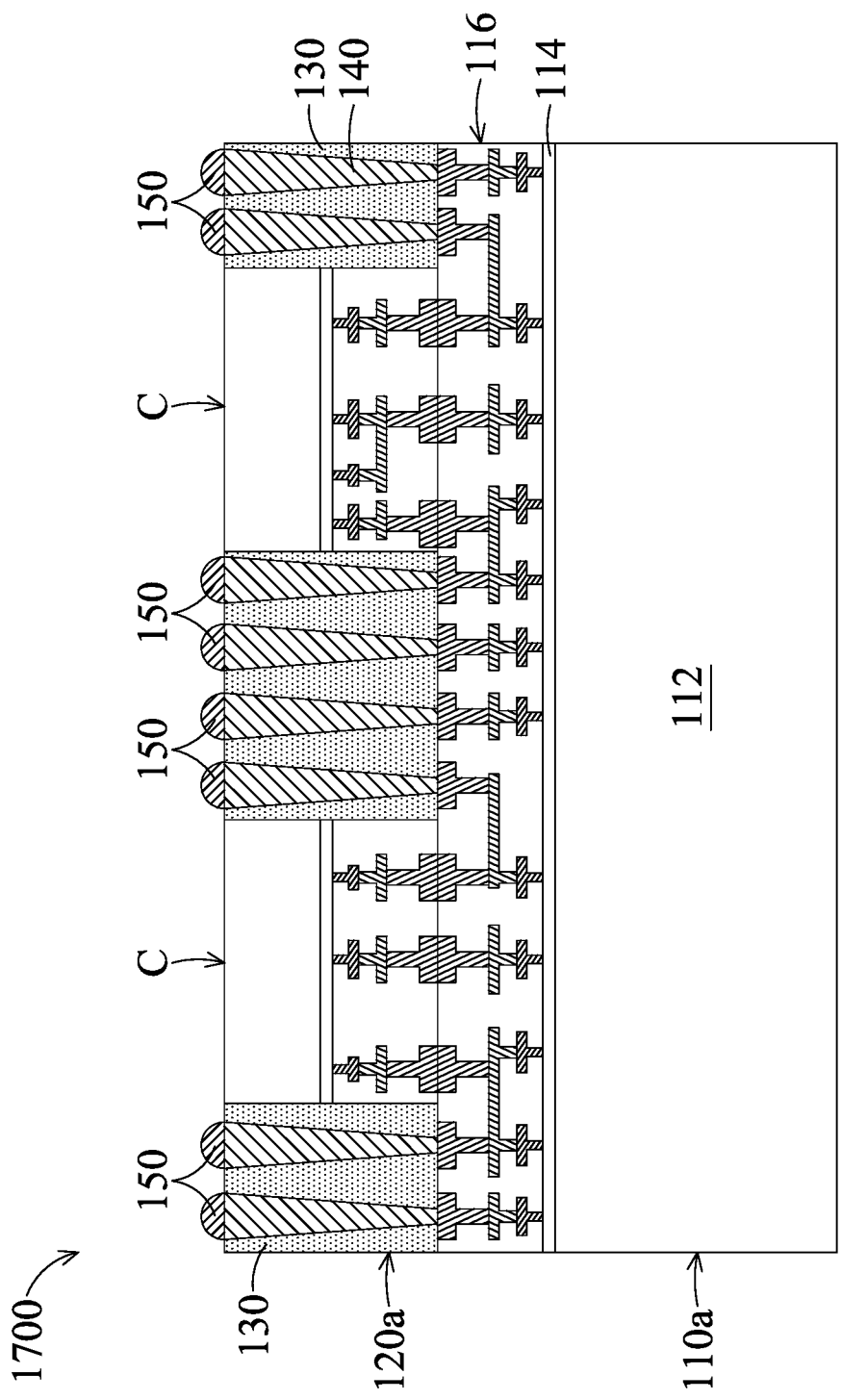

As shown in FIG. 17D, conductive bumps 150 are formed over the conductive plugs 140, in accordance with some embodiments. As shown in FIG. 17D, a dicing process is performed to cut through the semiconductor structure 110 and the insulating layer 130, in accordance with some embodiments. After the dicing process, chip stack structures 1700 are formed, in accordance with some embodiments. For the sake of simplicity, FIG. 17D only shows one of the chip stack structures 1700, in accordance with some embodiments.

Each chip stack structure 1700 includes a chip 110a and a chip structure 120a, in accordance with some embodiments. The chip 110a comes from the semiconductor structure 110, in accordance with some embodiments. The chip 110a includes a substrate 112 which comes from the substrate structure 112', a portion of the device layer 114, and a portion of the interconnect structure 116, in accordance with some embodiments. The chip structure 120a includes the chips C, a portion of insulating layer 130, some of the conductive plugs 140, and some of the conductive bumps 150, in accordance with some embodiments.

Figure 18:
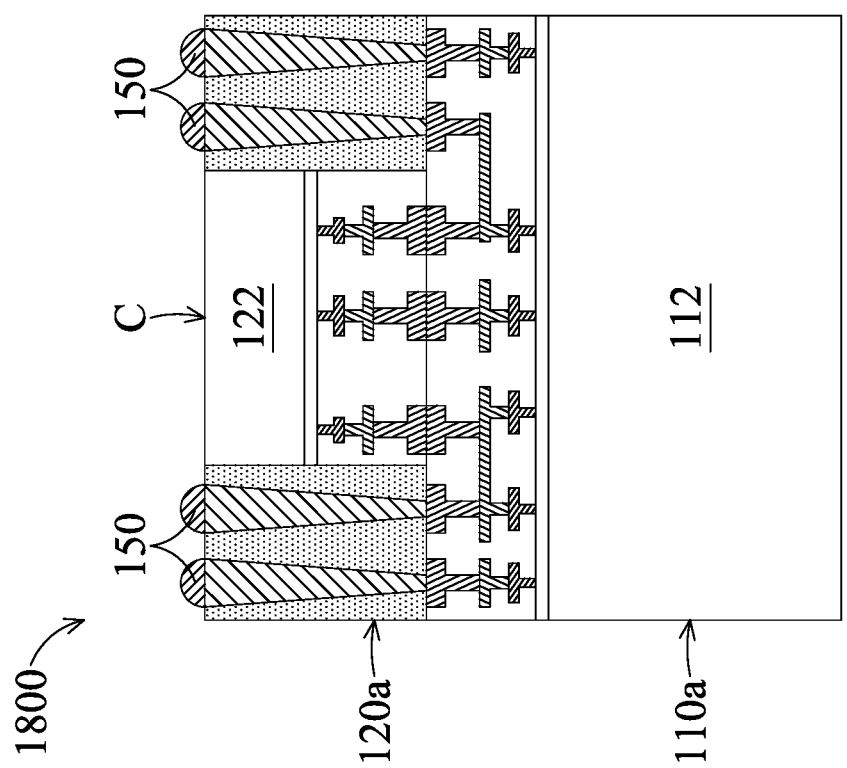
FIG. 18 is a cross-sectional view of a chip stack structure, in accordance with some embodiments.

FIG. 18 is a cross-sectional view of a chip stack structure 1800, in accordance with some embodiments. As shown in FIG. 18, the chip stack structure 1800 is similar to the chip stack structure 1700 of FIG. 17D, except that the chip structure 120a of the chip stack structure 1800 has only one chip C, in accordance with some embodiments. The substrates 112 and 122 are similar in size such as width, in accordance with some embodiments.

Figure 19:
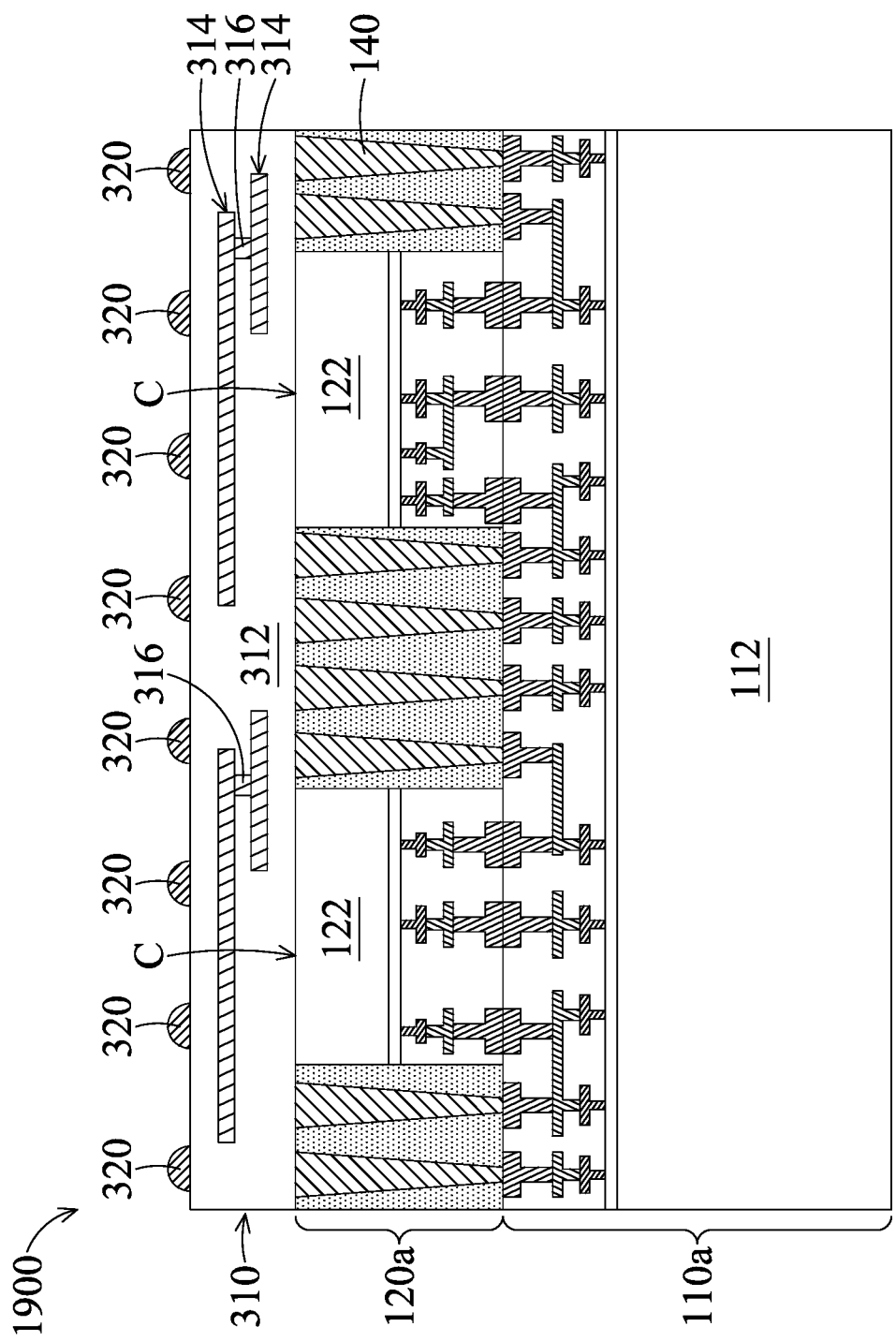
FIG. 19 is a cross-sectional view of a chip stack structure, in accordance with some embodiments.

FIG. 19 is a cross-sectional view of a chip stack structure 1900, in accordance with some embodiments. As shown in FIG. 19, the chip stack structure 1900 is similar to the chip stack structure 1700 of FIG. 17D, except that the chip stack structure 1900 further has a redistribution layer 310 and conductive bumps 320, in accordance with some embodiments.

The redistribution layer 310 is formed over the chip structure 120a, in accordance with some embodiments. The conductive bumps 320 are formed over the redistribution layer 310, in accordance with some embodiments. The redistribution layer 310 includes a dielectric layer 312, wiring layers 314, and conductive vias 316, in accordance with some embodiments. The wiring layers 314 and conductive vias 316 are in the dielectric layer 312, in accordance with some embodiments. The conductive vias 316 are electrically connected between the wiring layers 314, in accordance with some embodiments.

The conductive plugs 140 and the conductive bumps 320 are electrically connected to the wiring layers 314 and the conductive vias 316, in accordance with some embodiments. The chips 110a and C are electrically connected to the conductive bumps 320 through the conductive plugs 140, the wiring layers 314, and the conductive vias 316, in accordance with some embodiments.

Figure 20:
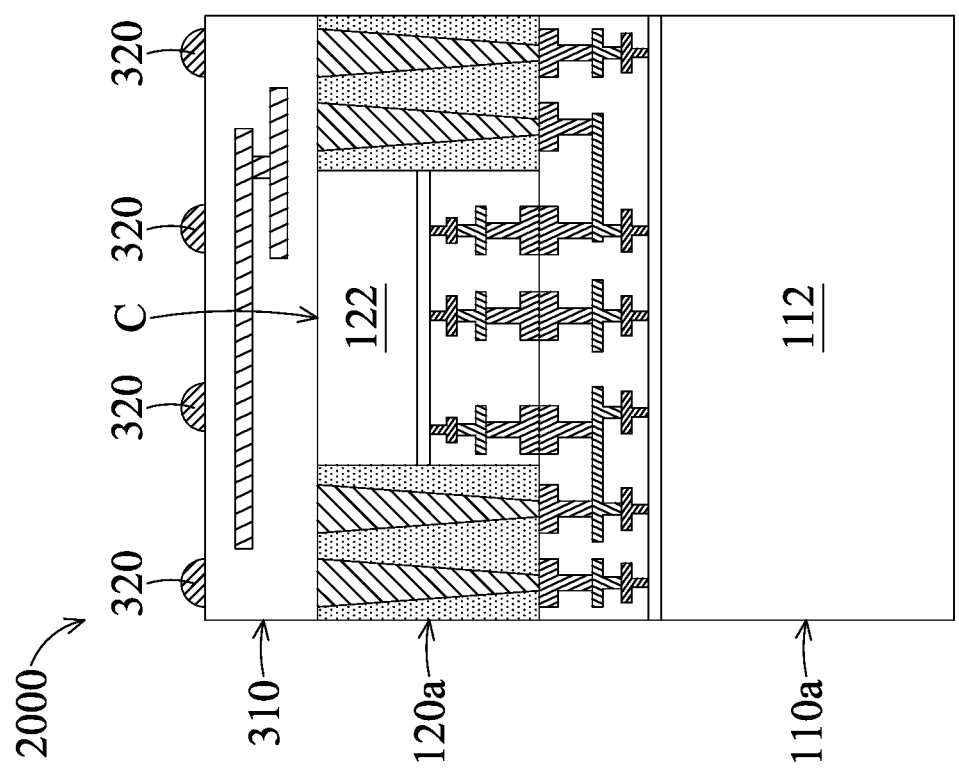
FIG. 20 is a cross-sectional view of a chip stack structure, in accordance with some embodiments.

FIG. 20 is a cross-sectional view of a chip stack structure 2000, in accordance with some embodiments. As shown in FIG. 20, the chip stack structure 2000 is similar to the chip stack structure 1900 of FIG. 19, except that the chip structure 120a of the chip stack structure 2000 has only one chip C, in accordance with some embodiments. The substrates 112 and 122 are similar in size such as width, in accordance with some embodiments.

Figure 21A:
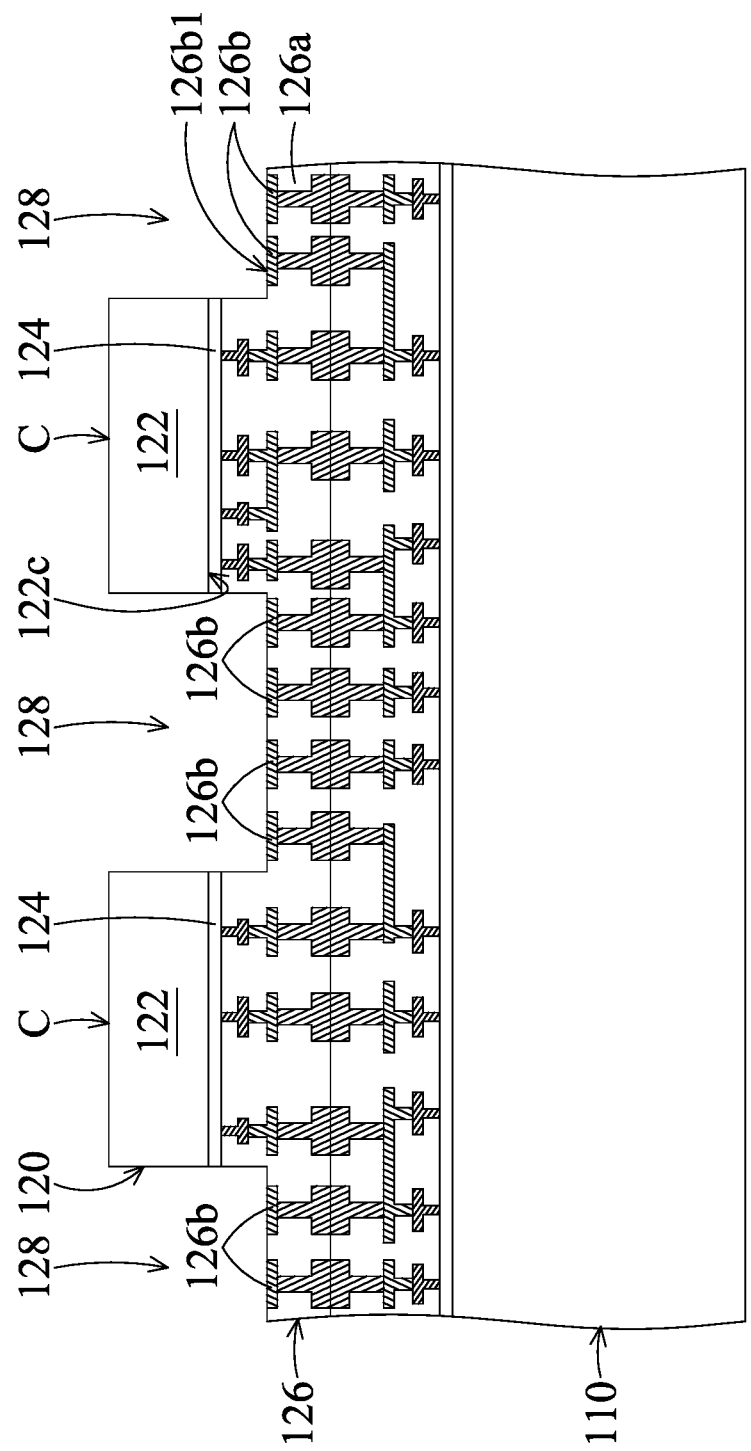
FIGS. 21A-21D are cross-sectional views of various stages of a process for forming a chip stack structure, in accordance with some embodiments.

FIGS. 21A-21D are cross-sectional views of various stages of a process for forming a chip stack structure, in accordance with some embodiments. As shown in FIGS. 1B and 21A, after the step of FIG. 1B, portions of the semiconductor structure 120 are removed to form a trench 128 in the semiconductor structure 120, in accordance with some embodiments. The trench 128 passes through the substrate structure 122' and extends into the interconnect structure 126, in accordance with some embodiments. The trench 128 exposes the wiring layer 126b of the interconnect structure 126, in accordance with some embodiments.

The surface 126b1 of the wiring layer 126b, which is exposed by the trench 128, is lower than a surface 122c of the substrate 122, in accordance with some embodiments. The surface 122c faces the interconnect structure 126, in accordance with some embodiments. The removal process includes a photolithography process and an etching process such as a dry etching process, in accordance with some embodiments.

The dry etching process includes a plasma etching process, in accordance with some embodiments. The dielectric layer 126a and the wiring layer 126b are made of different materials, and therefore there is a sufficient etching selectivity between the dielectric layer 126a and the wiring layer 126b. As a result, the dry etching process can stop on the wiring layer 126b.

As shown in FIG. 21A, portions of the substrate structure 122' remain over the interconnect structure 126 after the removal process of the substrate structure 122', in accordance with some embodiments. The portions form substrates 122, in accordance with some embodiments. The trench 128 continuously surrounds the substrates 122, in accordance with some embodiments.

As shown in FIG. 21A, one of the substrates 122, the device layer 124 under the one of the substrates 122, and the interconnect structure 126 under the one of the substrates 122 together form a chip C, in accordance with some embodiments. The chips C share the interconnect structure 126, in accordance with some embodiments. The interconnect structure 126 is wider than each substrate 122, in accordance with some embodiments.

Figure 21B:
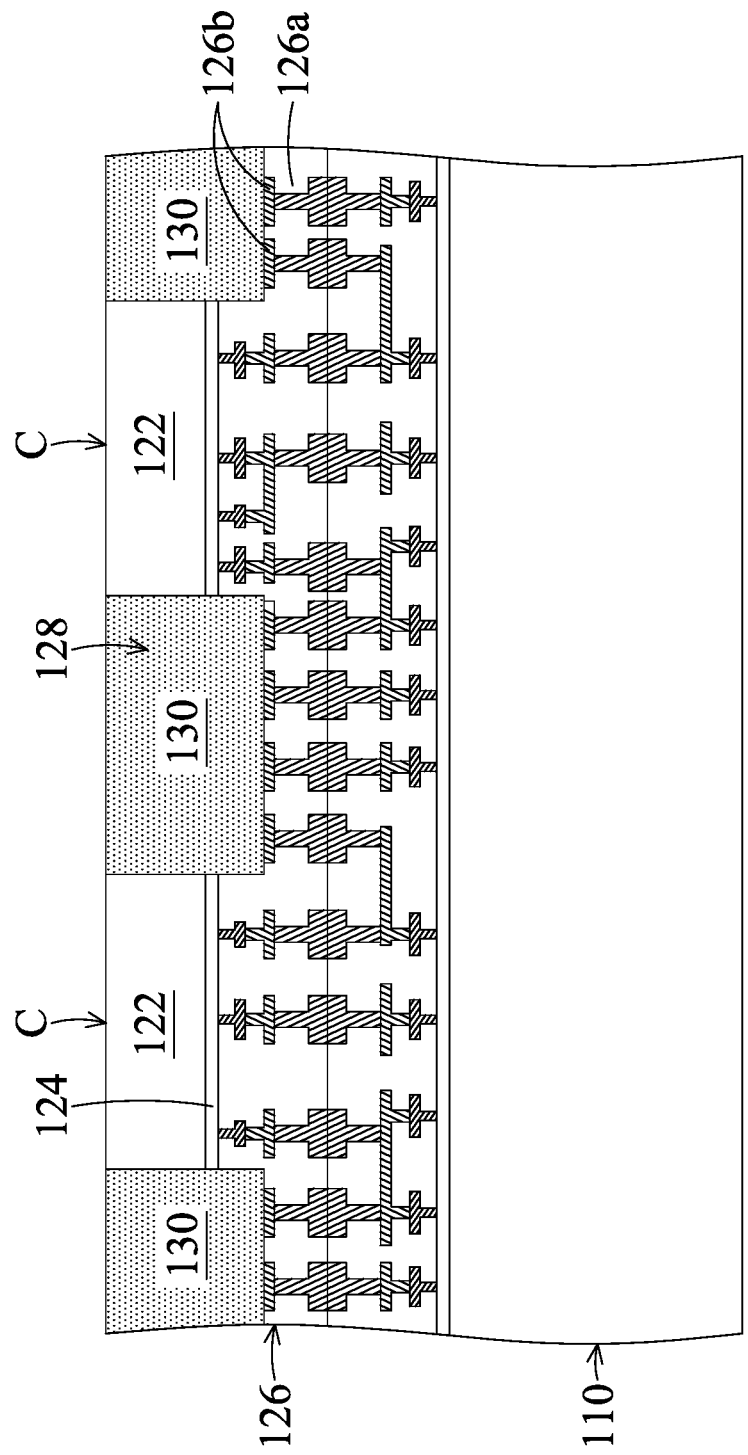

As shown in FIG. 21B, an insulating layer 130 is formed in the trench 128, in accordance with some embodiments. The insulating layer 130 extends into the interconnect structure 126, in accordance with some embodiments. The insulating layer 130 is partially in the dielectric layer 126a, in accordance with some embodiments. The insulating layer 130 continuously surrounds the substrates 122 and the device layer 124, in accordance with some embodiments.

Figure 21C:
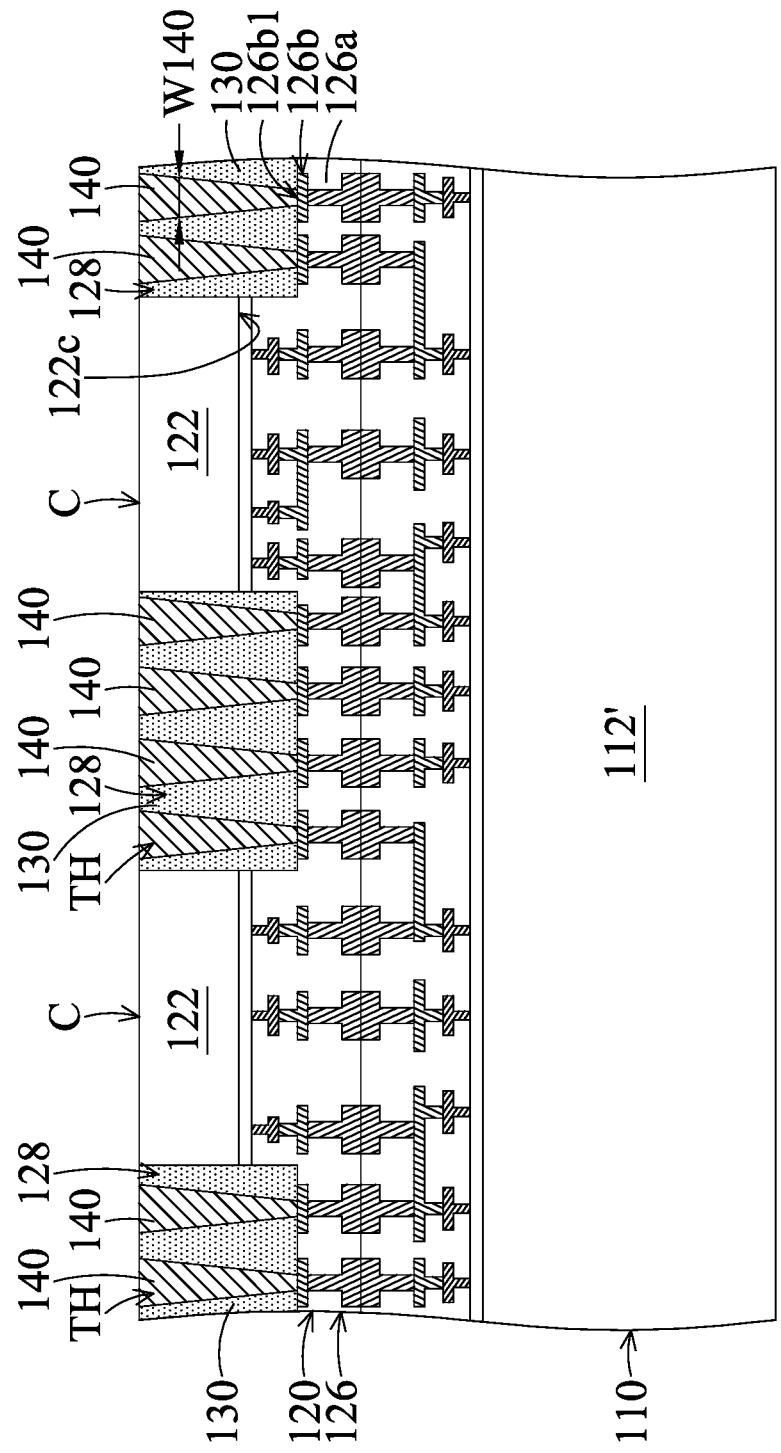

As shown in FIGS. 21B and 21C, the insulating layer 130 is partially removed to form through holes TH, in accordance with some embodiments. The through holes TH pass through the insulating layer 130, in accordance with some embodiments. The through holes TH partially expose the wiring layer 126b of the interconnect structure 126, in accordance with some embodiments. The removal process includes a photolithography process and an etching process such as a dry etching process, in accordance with some embodiments.

The dry etching process includes a plasma etching process, in accordance with some embodiments. The insulating layer 130 and the wiring layer 126b are made of different materials, and therefore there is a sufficient etching selectivity between the insulating layer 130 and the wiring layer 126b. As a result, the dry etching process can stop on the wiring layer 126b.

As shown in FIG. 21C, conductive plugs 140 are formed in the through holes TH, in accordance with some embodiments. The conductive plugs 140 extends into the interconnect structure 126, in accordance with some embodiments. The conductive plugs 140 penetrate through the insulating layer 130 to the wiring layer 126b of the interconnect structure 126, in accordance with some embodiments. The conductive plugs 140 are partially in the dielectric layer 126a, in accordance with some embodiments. The conductive plugs 140 surround the substrates 122, in accordance with some embodiments. A width W140 of the conductive plug 140 decreases toward the semiconductor structure 110, in accordance with some embodiments.

Figure 21D:
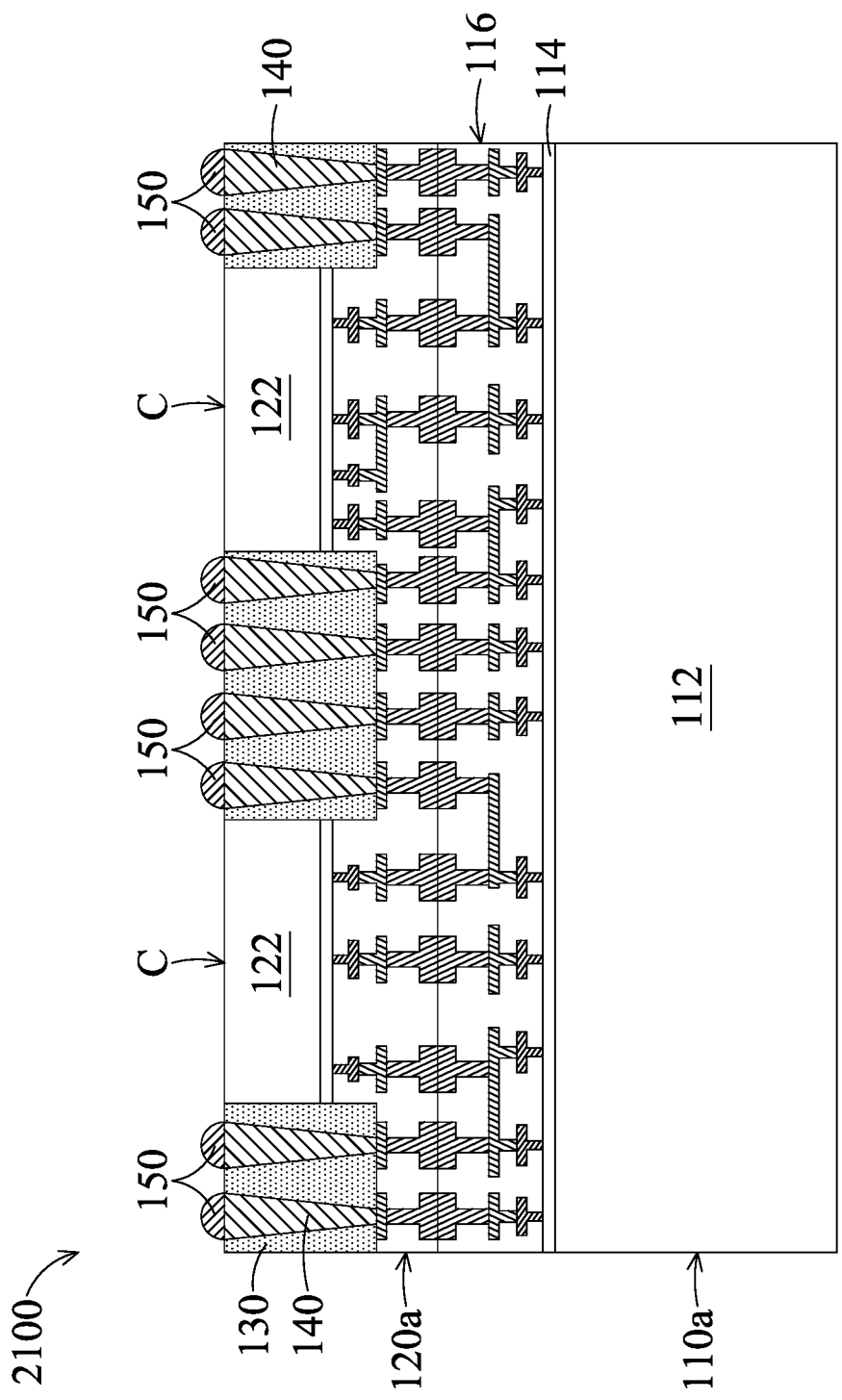

As shown in FIG. 21D, conductive bumps 150 are formed over the conductive plugs 140, in accordance with some embodiments. As shown in FIG. 21D, a dicing process is performed to cut through the semiconductor structures 110 and 120 and the insulating layer 130, in accordance with some embodiments. After the dicing process, chip stack structures 2100 are formed, in accordance with some embodiments. For the sake of simplicity, FIG. 21D only shows one of the chip stack structures 2100, in accordance with some embodiments.

Each chip stack structure 2100 includes a chip 110a and a chip structure 120a, in accordance with some embodiments. The chip 110a comes from the semiconductor structure 110, in accordance with some embodiments. The chip 110a includes a substrate 112 which comes from the substrate structure 112', a portion of the device layer 114, and a portion of the interconnect structure 116, in accordance with some embodiments. The chip structure 120a includes the chips C, a portion of insulating layer 130, some of the conductive plugs 140, and some of the conductive bumps 150, in accordance with some embodiments.

Figure 22:
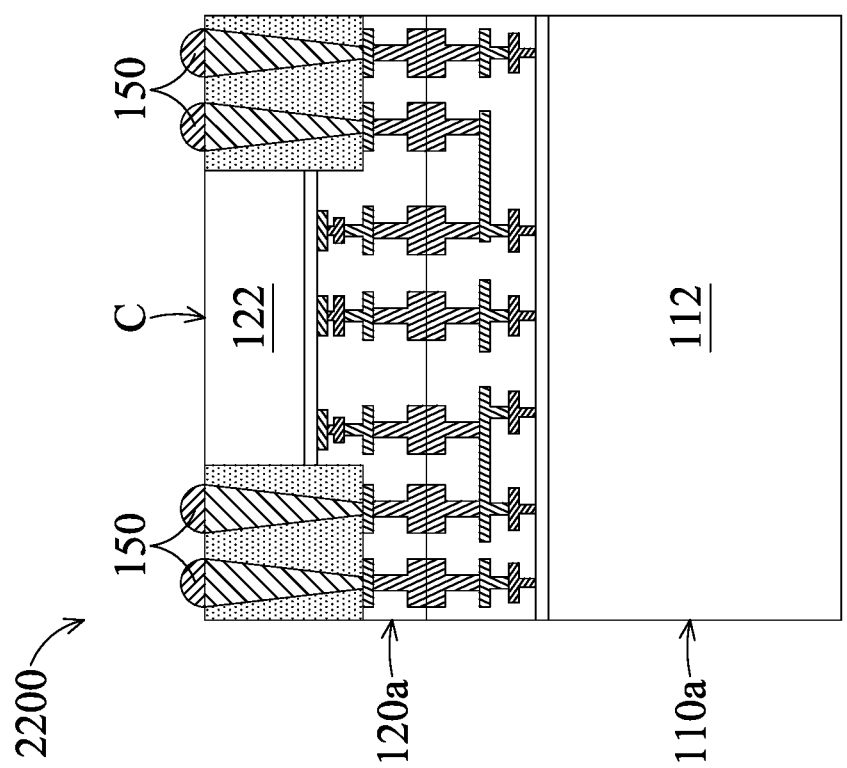
FIG. 22 is a cross-sectional view of a chip stack structure, in accordance with some embodiments.

FIG. 22 is a cross-sectional view of a chip stack structure 2200, in accordance with some embodiments. As shown in FIG. 22, the chip stack structure 2200 is similar to the chip stack structure 2100 of FIG. 21D, except that the chip structure 120a of the chip stack structure 2200 has only one chip C, in accordance with some embodiments. The substrates 112 and 122 are similar in size such as width, in accordance with some embodiments.

Figure 23:
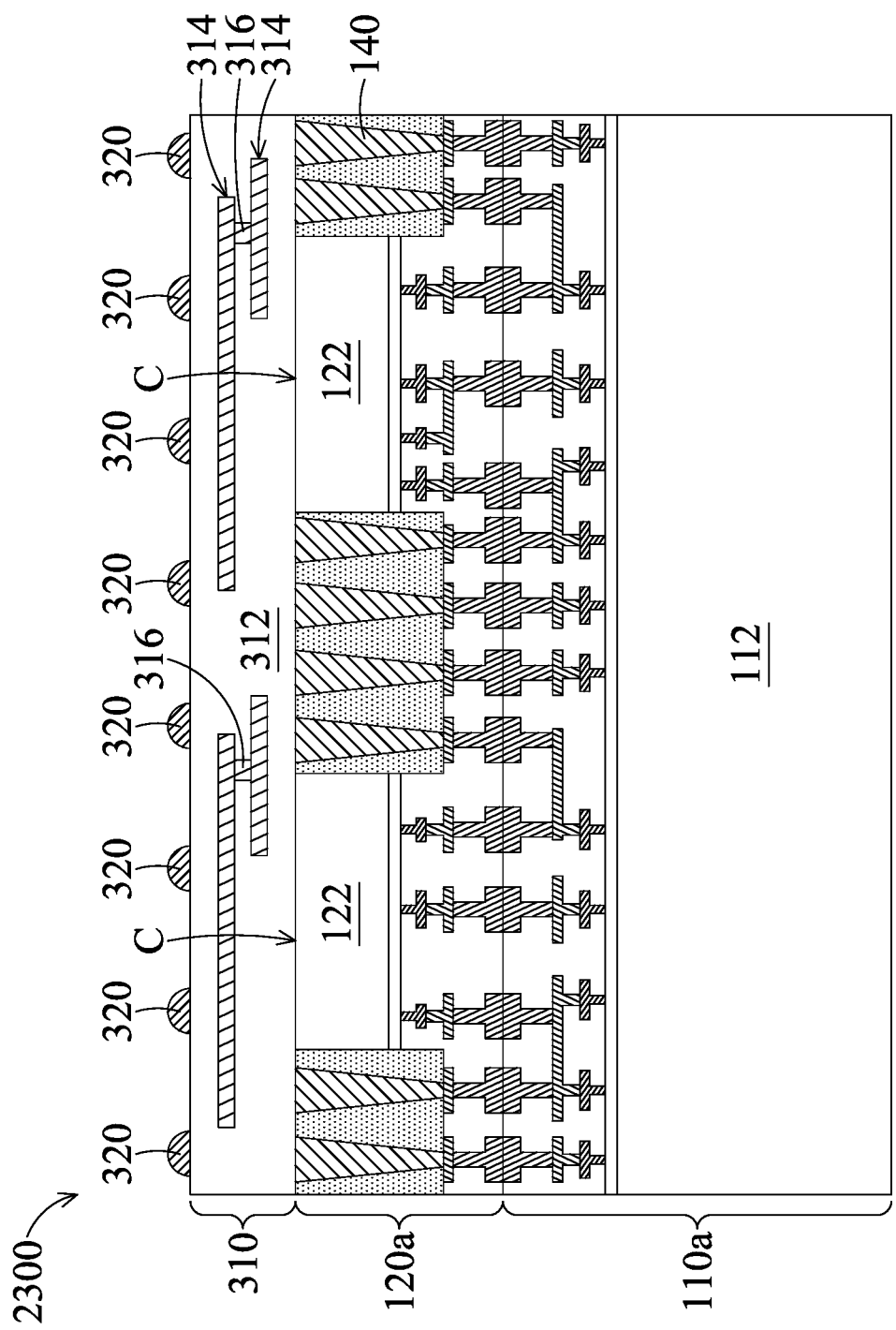
FIG. 23 is a cross-sectional view of a chip stack structure, in accordance with some embodiments.

FIG. 23 is a cross-sectional view of a chip stack structure 2300, in accordance with some embodiments. As shown in FIG. 23, the chip stack structure 2300 is similar to the chip stack structure 2100 of FIG. 21D, except that the chip stack structure 2300 further has a redistribution layer 310 and conductive bumps 320, in accordance with some embodiments.

The redistribution layer 310 is formed over the chip structure 120*a*, in accordance with some embodiments. The conductive bumps 320 are formed over the redistribution layer 310, in accordance with some embodiments. The redistribution layer 310 includes a dielectric layer 312, wiring layers 314, and conductive vias 316, in accordance with some embodiments. The wiring layers 314 and conductive vias 316 are in the dielectric layer 312, in accordance with some embodiments. The conductive vias 316 are electrically connected between the wiring layers 314, in accordance with some embodiments.

The conductive plugs 140 and the conductive bumps 320 are electrically connected to the wiring layers 314 and the conductive vias 316, in accordance with some embodiments. The chips 110*a* and C are electrically connected to the conductive bumps 320 through the conductive plugs 140, the wiring layers 314, and the conductive vias 316, in accordance with some embodiments.

Figure 24:
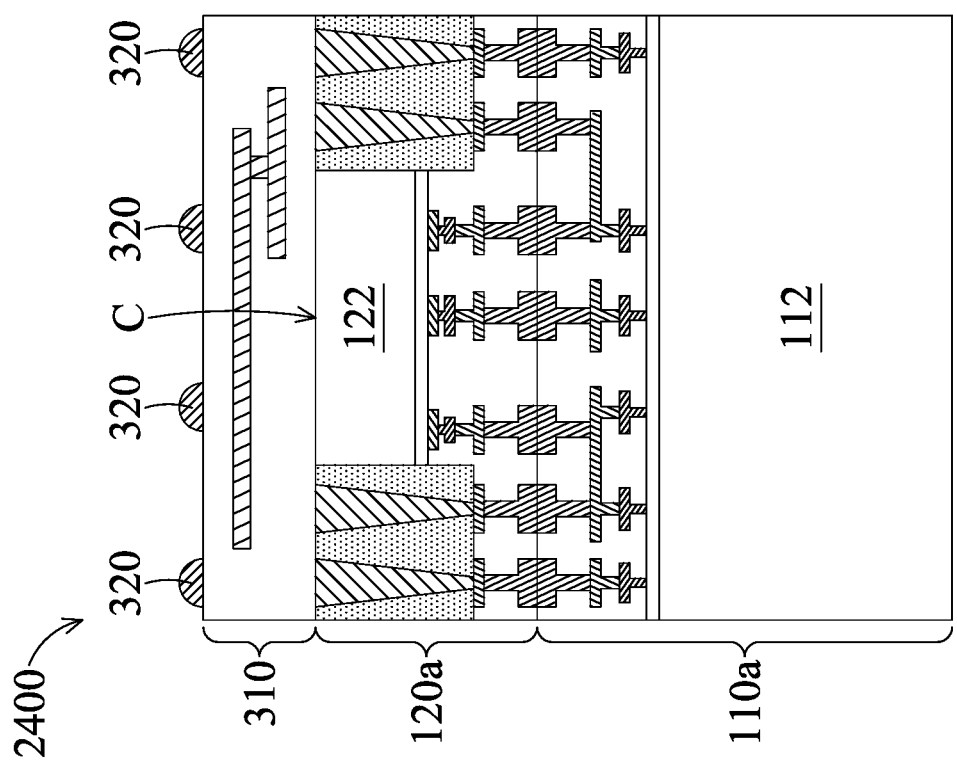
FIG. 24 is a cross-sectional view of a chip stack structure, in accordance with some embodiments.

FIG. 24 is a cross-sectional view of a chip stack structure 2400, in accordance with some embodiments. As shown in FIG. 24, the chip stack structure 2400 is similar to the chip stack structure 2300 of FIG. 23, except that the chip structure 120*a* of the chip stack structure 2400 has only one chip C, in accordance with some embodiments. The substrates 112 and 122 are similar in size such as width, in accordance with some embodiments.

Figure 25A:
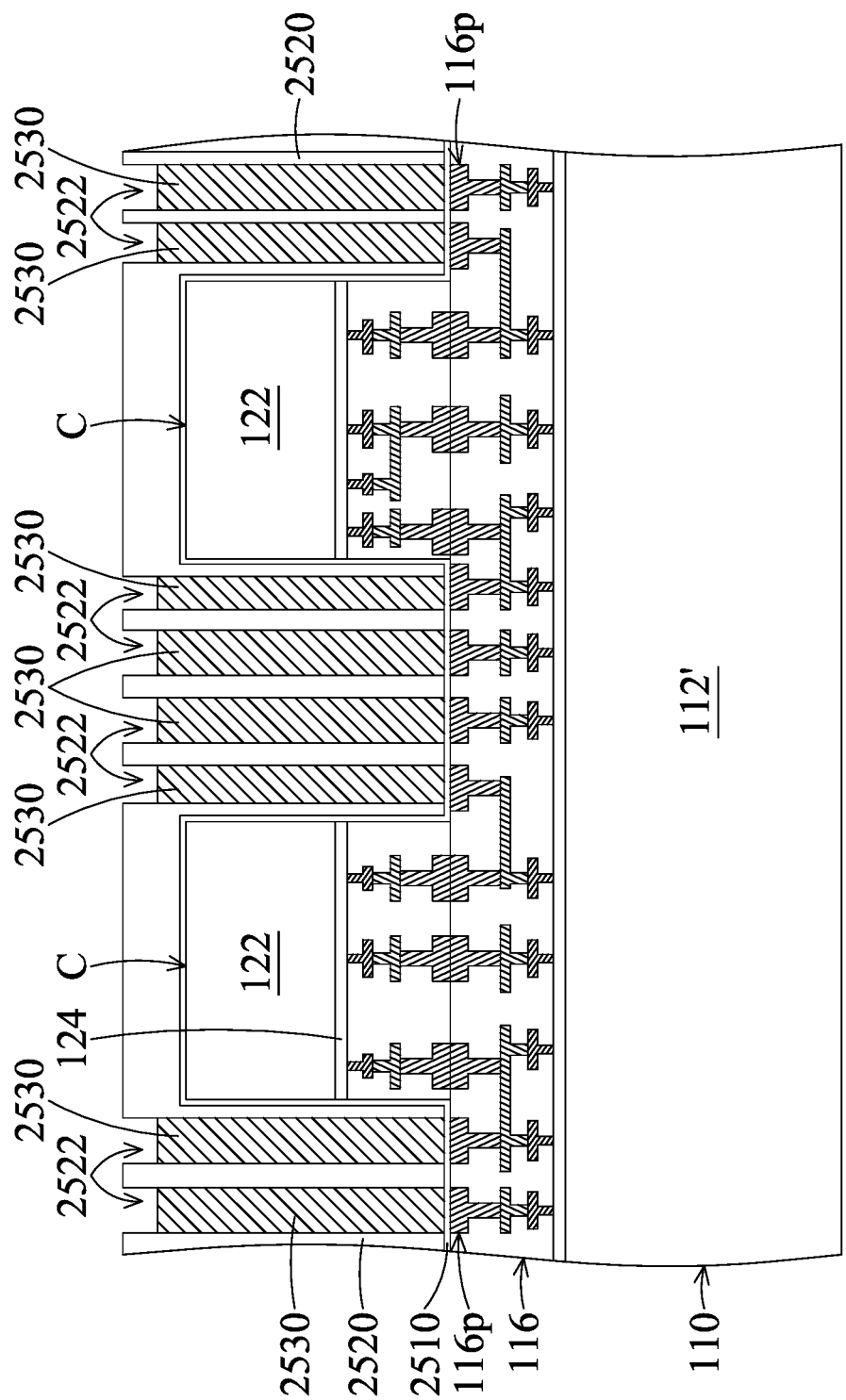
FIGS. 25A-25E are cross-sectional views of various stages of a process for forming a chip stack structure, in accordance with some embodiments.

FIGS. 25A-25E are cross-sectional views of various stages of a process for forming a chip stack structure, in accordance with some embodiments. As shown in FIG. 25A, after the step of FIG. 17A, a seed layer 2510 is conformally formed over the chips C and the semiconductor structure 110, in accordance with some embodiments.

As shown in FIG. 25A, a mask layer 2520 is formed over the seed layer 2510, in accordance with some embodiments. The mask layer 2520 has openings 2522 exposing portions of the seed layer 2510, in accordance with some embodiments. As shown in FIG. 25A, conductive pillars 2530 are formed in the openings 2522, in accordance with some embodiments.

Figure 25B:
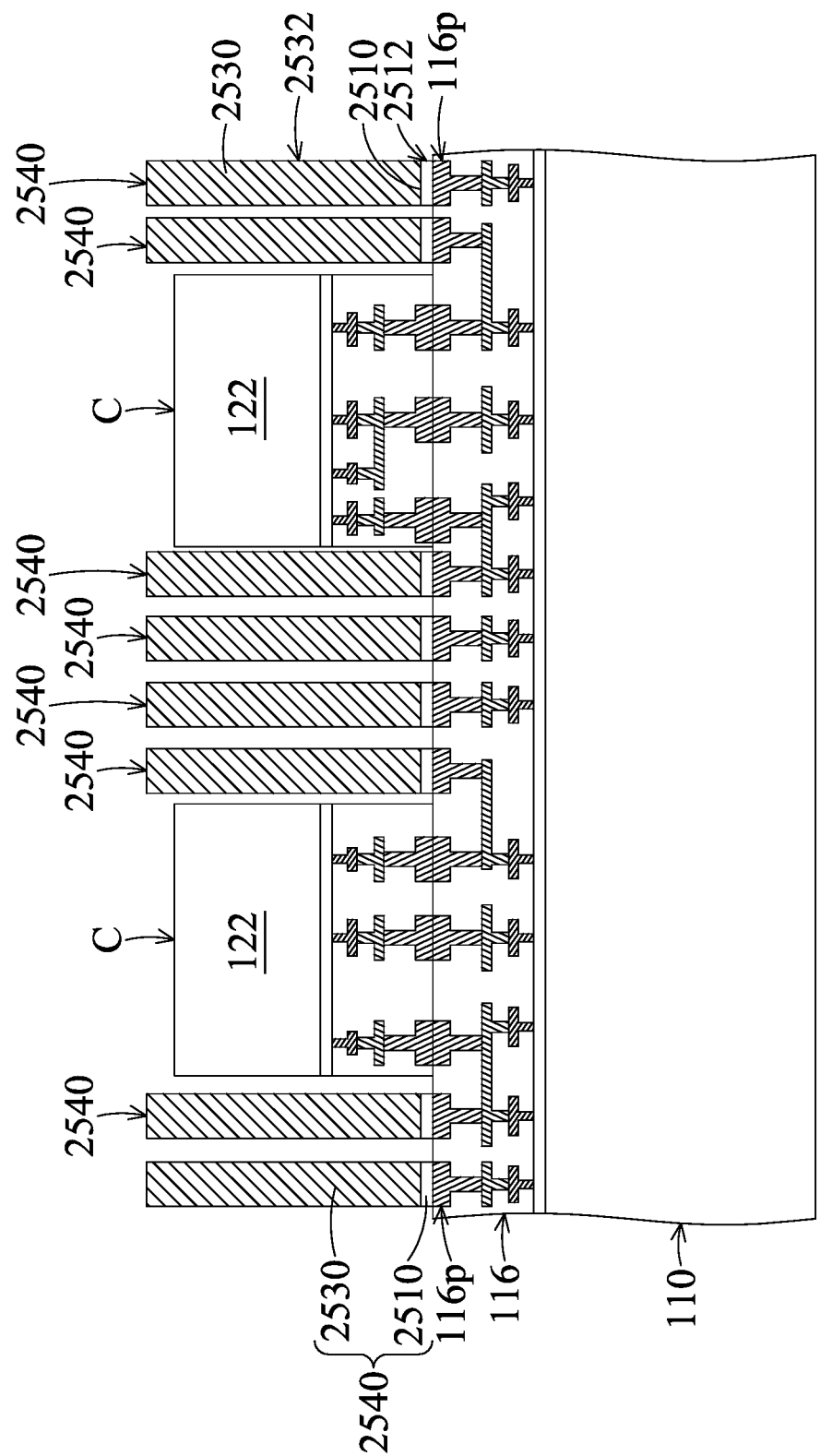

As shown in FIG. 25B, the mask layer 2520 is removed, in accordance with some embodiments. As shown in FIG. 25B, portions of the seed layer 2510 exposed by the conductive pillars 2530 are removed, in accordance with some embodiments. Each conductive pillar 2530 and the seed layer 2510 thereunder together form a conductive plug 2540, in accordance with some embodiments. A sidewall 2512 of the seed layer 2510 is substantially aligned with a sidewall 2532 of the conductive pillar 2530 thereover, in accordance with some embodiments. The conductive plugs 2540 are over and in direct contact with the bonding pads 116*p*, in accordance with some embodiments.

Figure 25C:
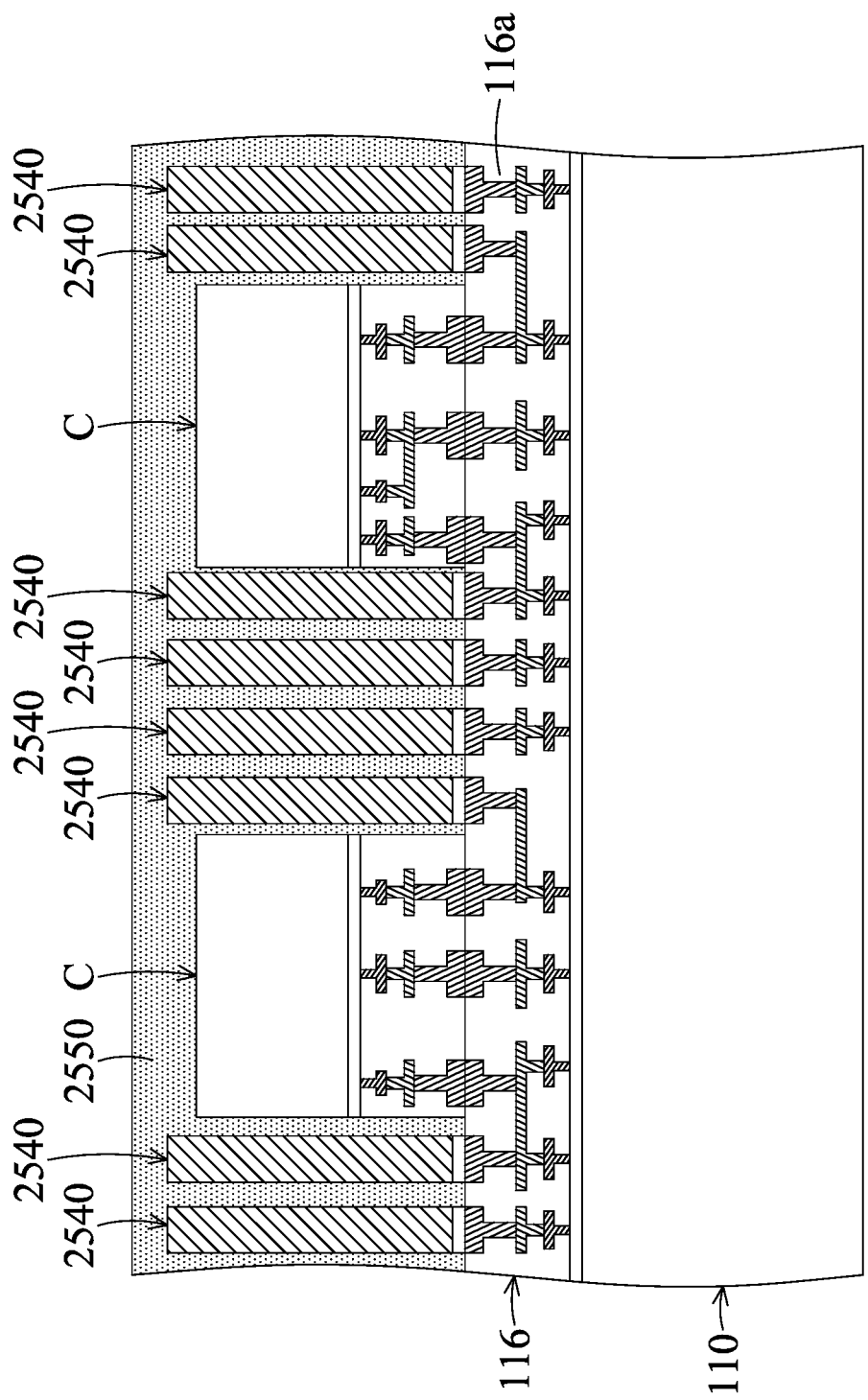

As shown in FIG. 25C, a molding layer 2550 is formed over the chips C, the conductive plugs 2540, and the semiconductor structure 110, in accordance with some embodiments. The molding layer 2550 is made of a polymer material, in accordance with some embodiments.

Figure 25D:
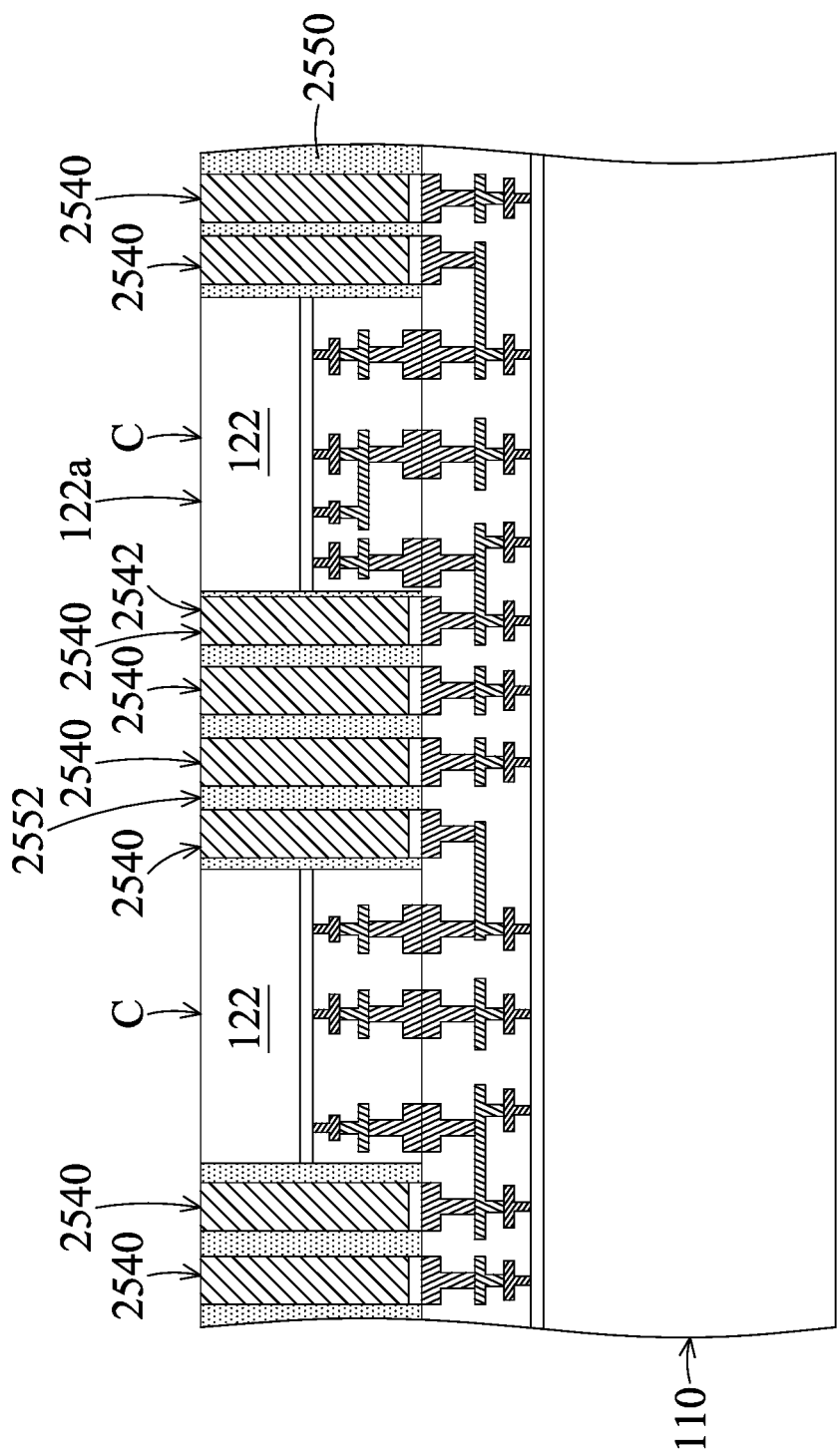
Figure 25E:
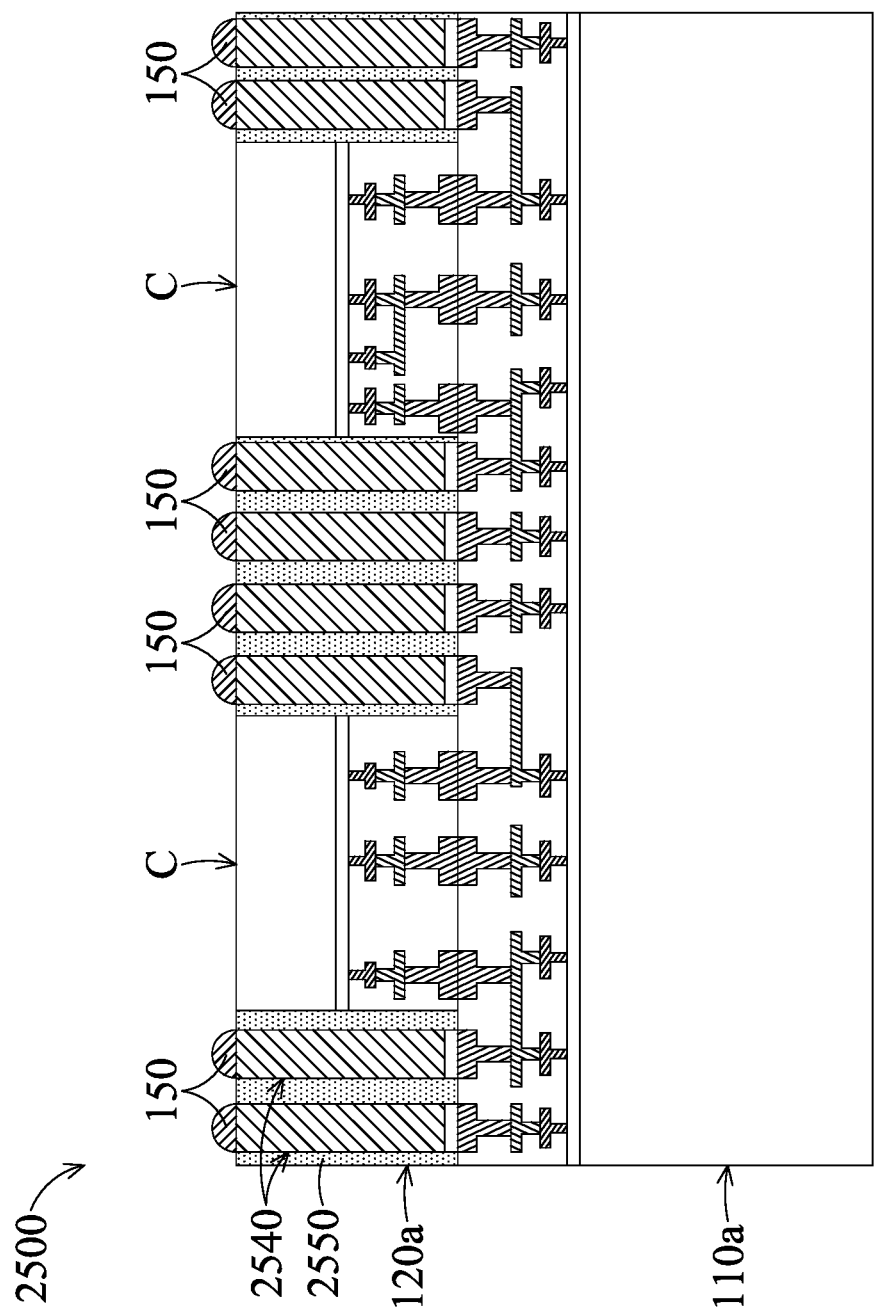

As shown in FIG. 25D, top portions of the conductive plugs 2540, the molding layer 2550, and the chips C are removed, in accordance with some embodiments. The surfaces 2542, 2552, 122*a* of the conductive plugs 2540, the molding layer 2550, and the substrate 122 of the chip C are substantially level with each other, in accordance with some embodiments. As shown in FIG. 25E, conductive bumps 150 are formed over the conductive plugs 2540, in accordance with some embodiments.

Figure 26:
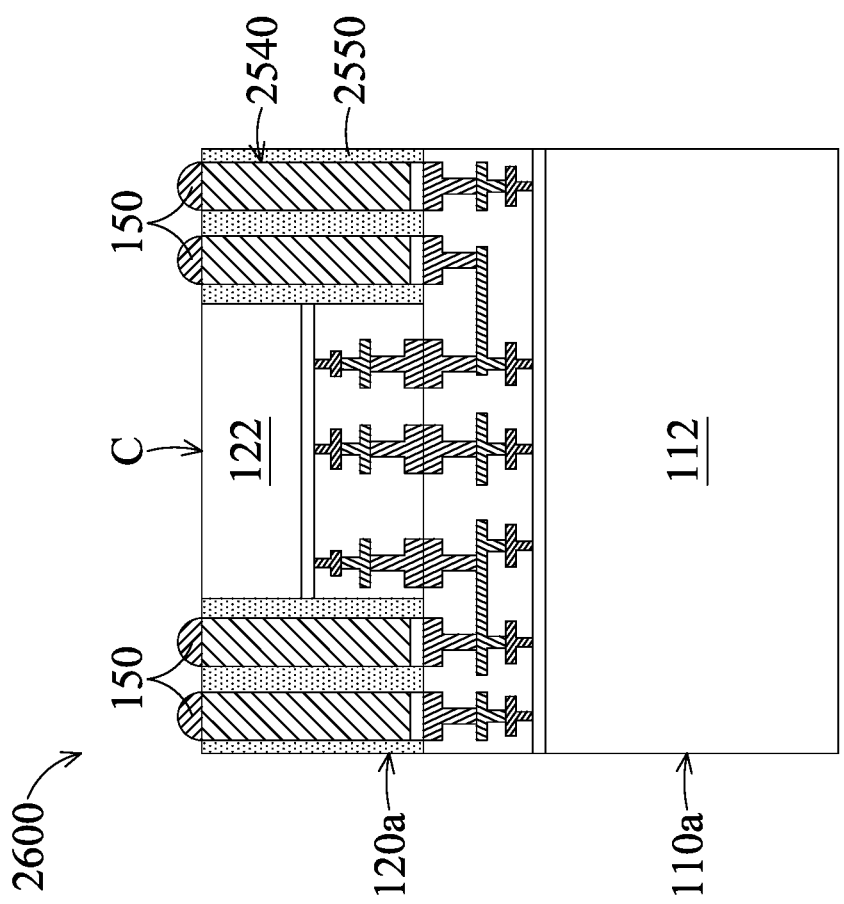
FIG. 26 is a cross-sectional view of a chip stack structure, in accordance with some embodiments.

FIG. 26 is a cross-sectional view of a chip stack structure 2600, in accordance with some embodiments. As shown in FIG. 26, the chip stack structure 2600 is similar to the chip stack structure 2500 of FIG. 25E, except that the chip structure 120*a* of the chip stack structure 2600 has only one chip C, in accordance with some embodiments. The substrates 112 and 122 are similar in size such as width, in accordance with some embodiments.

Figure 27:
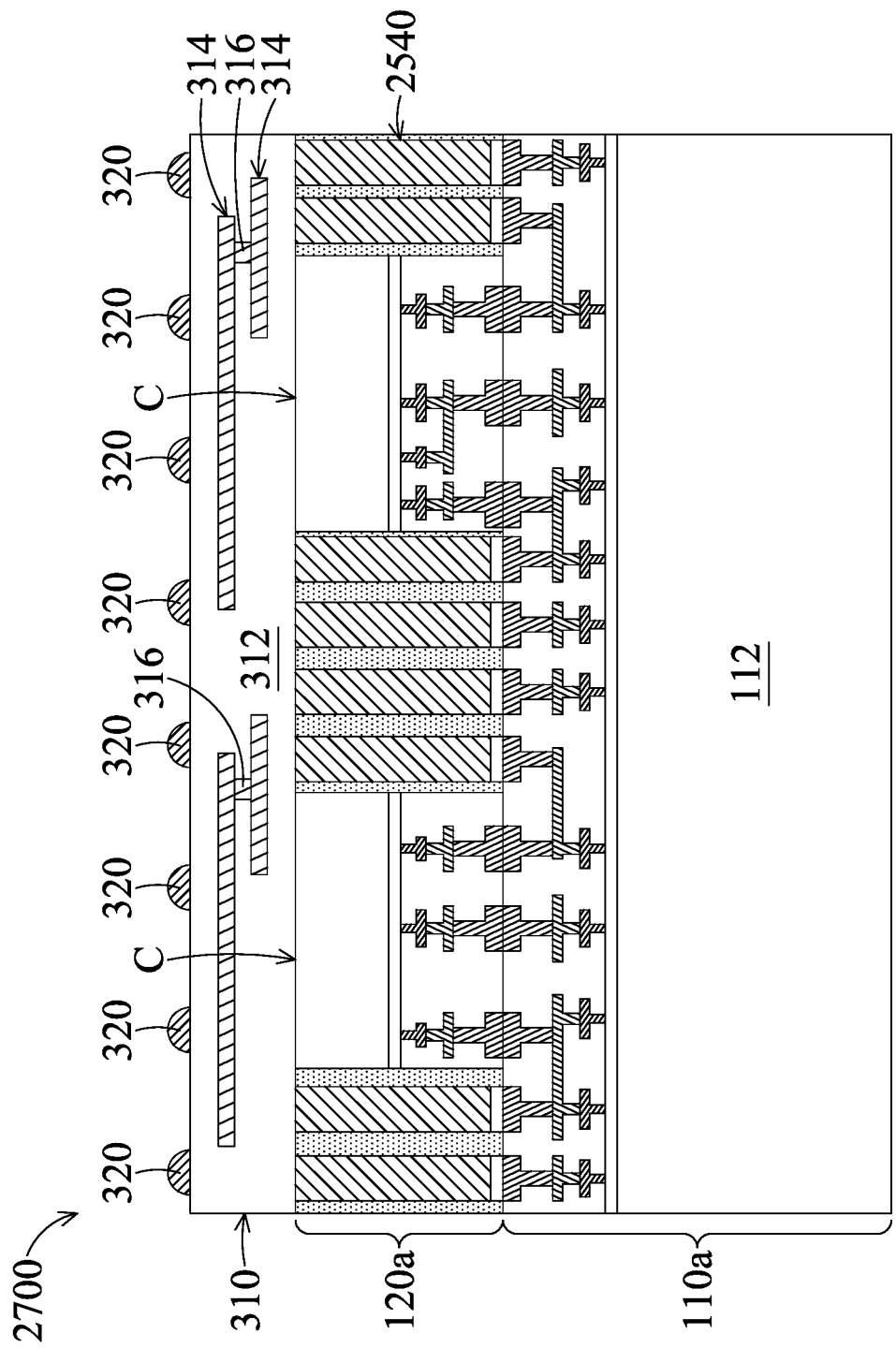
FIG. 27 is a cross-sectional view of a chip stack structure, in accordance with some embodiments.

FIG. 27 is a cross-sectional view of a chip stack structure 2700, in accordance with some embodiments. As shown in FIG. 27, the chip stack structure 2700 is similar to the chip stack structure 2500 of FIG. 25E, except that the chip stack structure 2700 further has a redistribution layer 310 and conductive bumps 320, in accordance with some embodiments.

The redistribution layer 310 is formed over the chip structure 120*a*, in accordance with some embodiments. The conductive bumps 320 are formed over the redistribution layer 310, in accordance with some embodiments. The redistribution layer 310 includes a dielectric layer 312, wiring layers 314, and conductive vias 316, in accordance with some embodiments. The wiring layers 314 and conductive vias 316 are in the dielectric layer 312, in accordance with some embodiments. The conductive vias 316 are electrically connected between the wiring layers 314, in accordance with some embodiments.

The conductive plugs 140 and the conductive bumps 320 are electrically connected to the wiring layers 314 and the conductive vias 316, in accordance with some embodiments. The chips 110*a* and C are electrically connected to the conductive bumps 320 through the conductive plugs 140, the wiring layers 314, and the conductive vias 316, in accordance with some embodiments.

Figure 28:
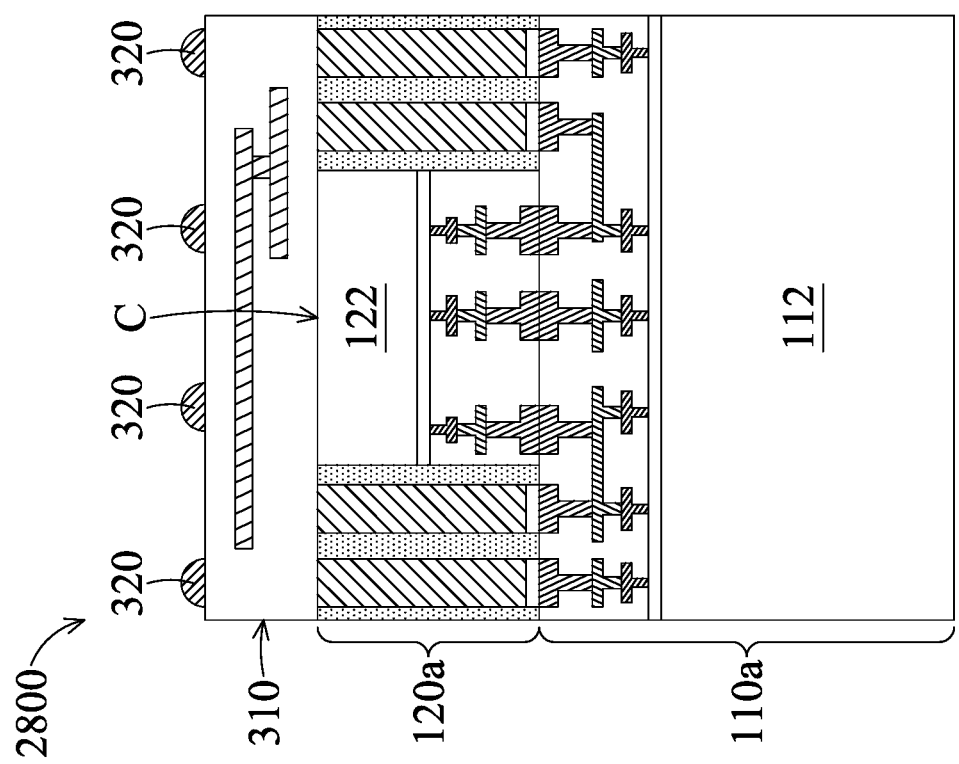
FIG. 28 is a cross-sectional view of a chip stack structure, in accordance with some embodiments.

FIG. 28 is a cross-sectional view of a chip stack structure 2800, in accordance with some embodiments. As shown in FIG. 28, the chip stack structure 2800 is similar to the chip stack structure 2700 of FIG. 27, except that the chip structure 120*a* of the chip stack structure 2800 has only one chip C, in accordance with some embodiments. The substrates 112 and 122 are similar in size such as width, in accordance with some embodiments.

Figure 29:
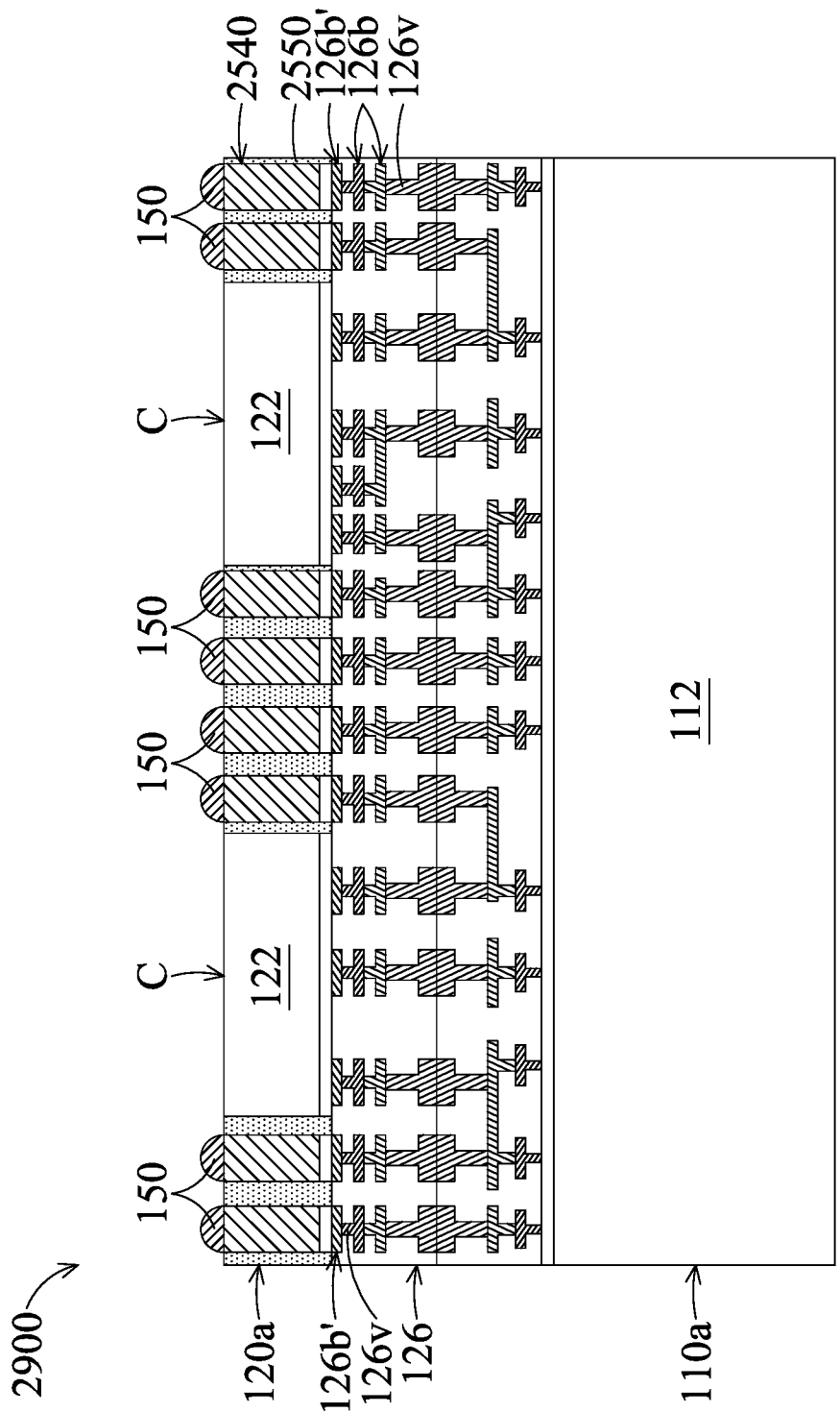
FIG. 29 is a cross-sectional view of a chip stack structure, in accordance with some embodiments.

FIG. 29 is a cross-sectional view of a chip stack structure 2900, in accordance with some embodiments. As shown in FIG. 29, the chip stack structure 2900 is similar to the chip stack structure 2500 of FIG. 25E, except that the conductive plugs 2540 of the chip stack structure 2900 are connected to the wiring layer 126*b*' of the interconnect structure 126, in accordance with some embodiments. The conductive plugs 2540 and the molding layer 2550 of the chip stack structure 2900 do not extend into the interconnect structure 126, in accordance with some embodiments.

Figure 30:
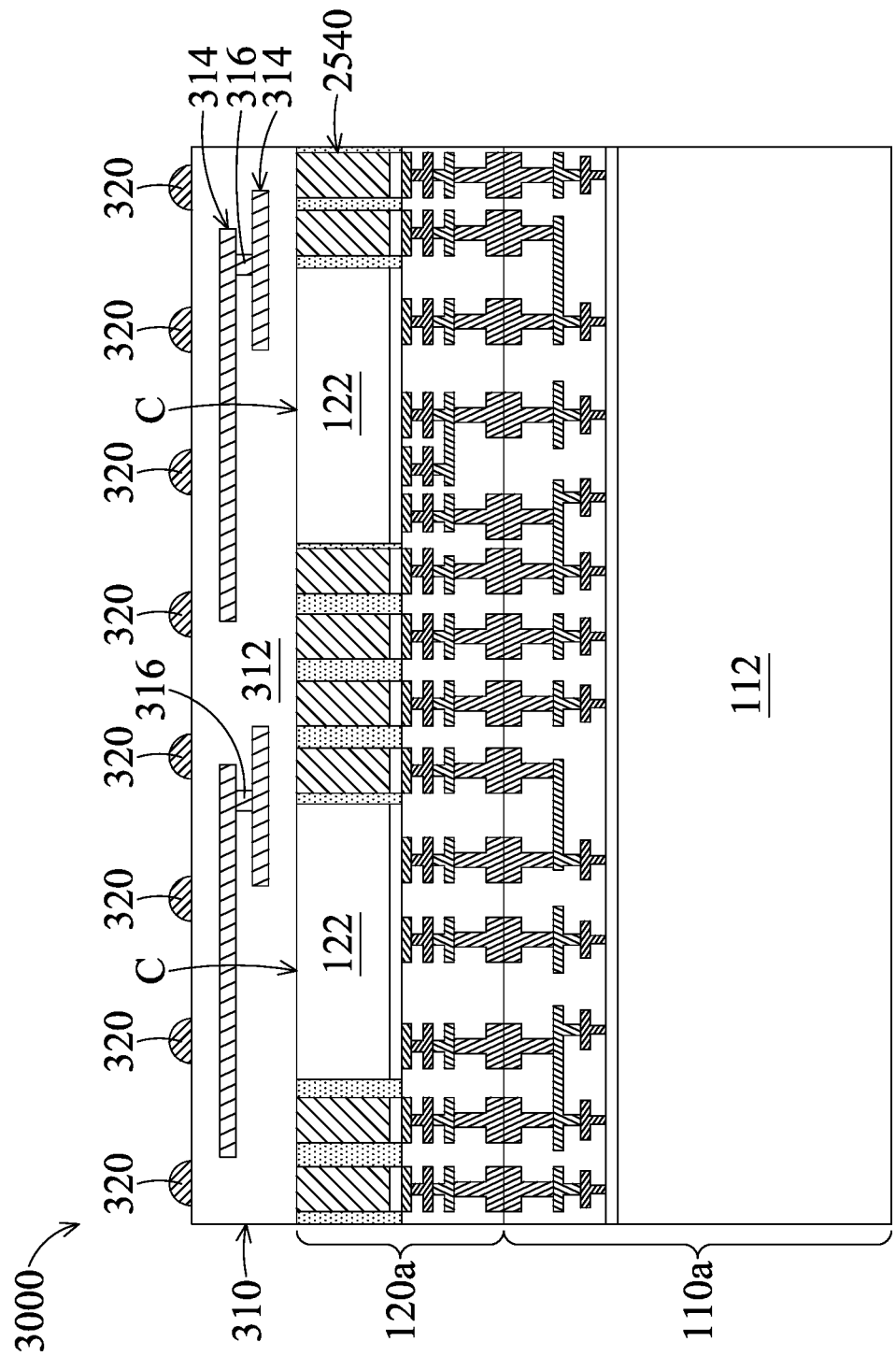
FIG. 30 is a cross-sectional view of a chip stack structure, in accordance with some embodiments.

FIG. 30 is a cross-sectional view of a chip stack structure 3000, in accordance with some embodiments. As shown in FIG. 30, the chip stack structure 3000 is similar to the chip stack structure 2900 of FIG. 29, except that the chip stack structure 3000 further has a redistribution layer 310 and conductive bumps 320, in accordance with some embodiments.

The redistribution layer 310 is formed over the chip structure 120a, in accordance with some embodiments. The conductive bumps 320 are formed over the redistribution layer 310, in accordance with some embodiments. The redistribution layer 310 includes a dielectric layer 312, wiring layers 314, and conductive vias 316, in accordance with some embodiments. The wiring layers 314 and conductive vias 316 are in the dielectric layer 312, in accordance with some embodiments. The conductive vias 316 are electrically connected between the wiring layers 314, in accordance with some embodiments.

The conductive plugs 2540 and the conductive bumps 320 are electrically connected to the wiring layers 314 and the conductive vias 316, in accordance with some embodiments. The chips 110a and C are electrically connected to the conductive bumps 320 through the conductive plugs 2540, the wiring layers 314, and the conductive vias 316, in accordance with some embodiments.

Figure 31:
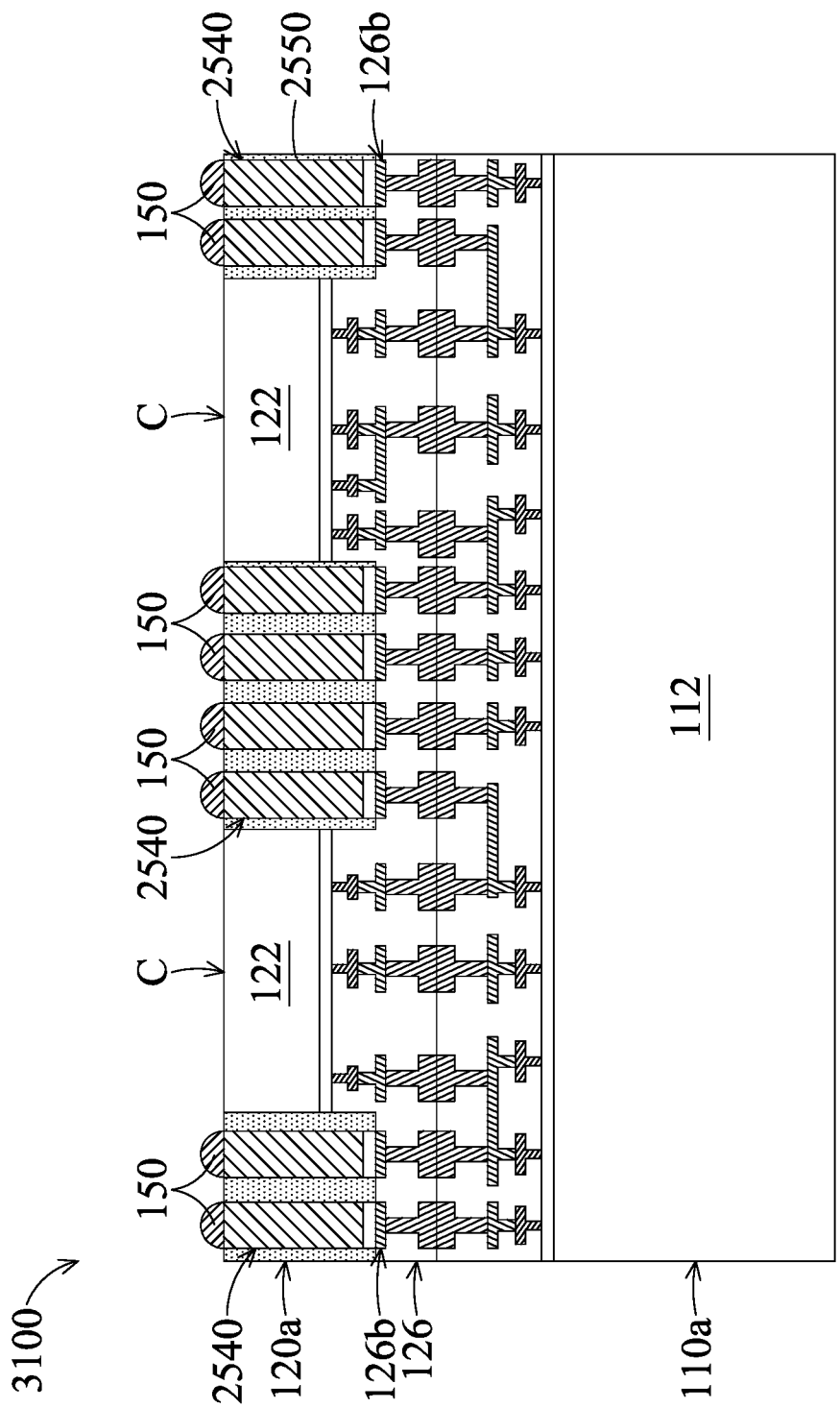
FIG. 31 is a cross-sectional view of a chip stack structure, in accordance with some embodiments.

FIG. 31 is a cross-sectional view of a chip stack structure 3100, in accordance with some embodiments. As shown in FIG. 31, the chip stack structure 3100 is similar to the chip stack structure 2500 of FIG. 25E, except that the conductive plugs 2540 of the chip stack structure 3100 are connected to the wiring layer 126b of the interconnect structure 126, in accordance with some embodiments. The conductive plugs 2540 and the molding layer 2550 of the chip stack structure 3100 extend into the interconnect structure 126 and do not penetrate through the interconnect structure 126, in accordance with some embodiments.

Figure 32:
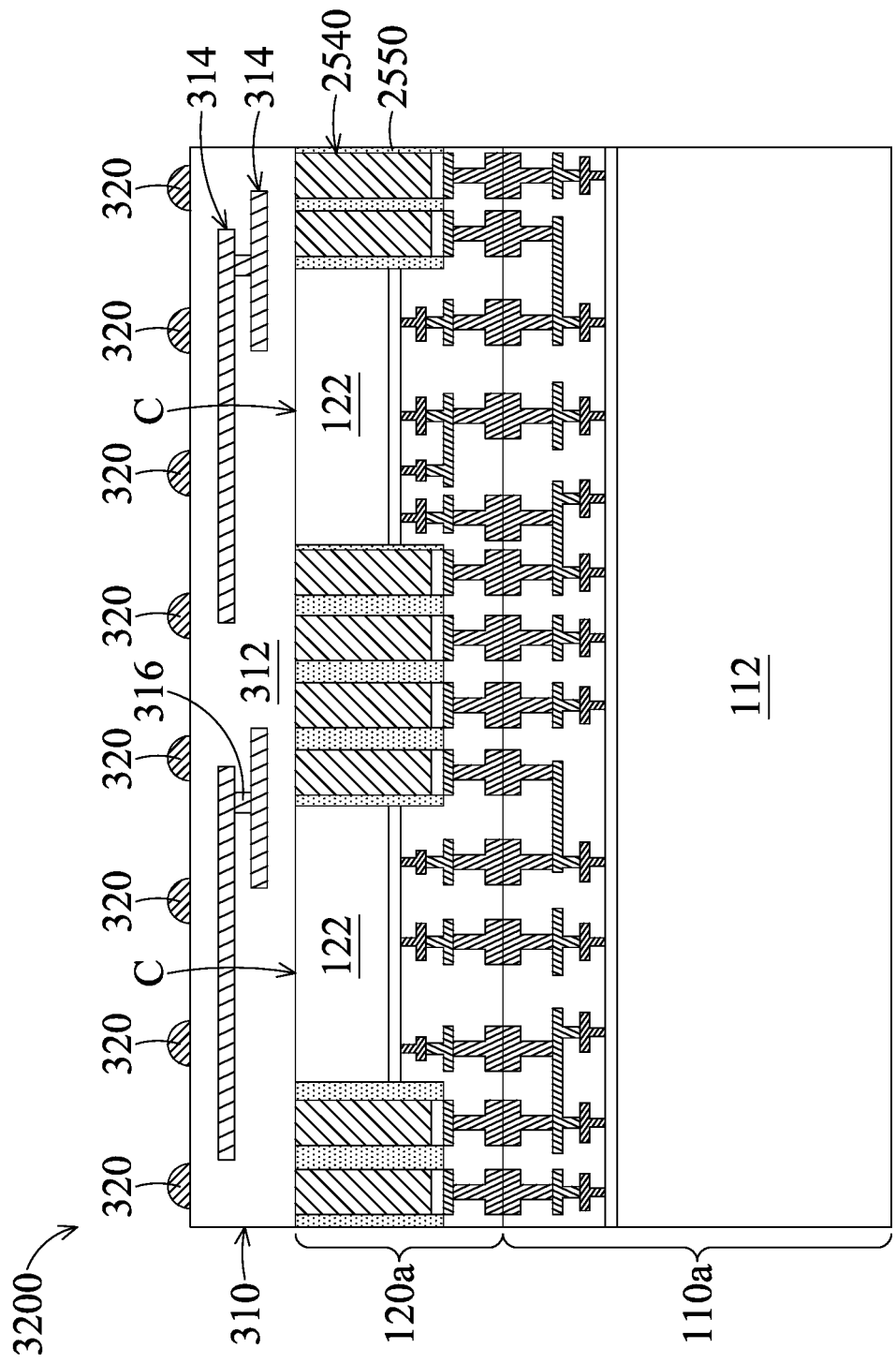
FIG. 32 is a cross-sectional view of a chip stack structure, in accordance with some embodiments.

FIG. 32 is a cross-sectional view of a chip stack structure 3200, in accordance with some embodiments. As shown in FIG. 32, the chip stack structure 3200 is similar to the chip stack structure 3100 of FIG. 31, except that the chip stack structure 3200 further has a redistribution layer 310 and conductive bumps 320, in accordance with some embodiments.

The redistribution layer 310 is formed over the chip structure 120a, in accordance with some embodiments. The conductive bumps 320 are formed over the redistribution layer 310, in accordance with some embodiments. The redistribution layer 310 includes a dielectric layer 312, wiring layers 314, and conductive vias 316, in accordance with some embodiments. The wiring layers 314 and conductive vias 316 are in the dielectric layer 312, in accordance with some embodiments. The conductive vias 316 are electrically connected between the wiring layers 314, in accordance with some embodiments.

The conductive plugs 2540 and the conductive bumps 320 are electrically connected to the wiring layers 314 and the conductive vias 316, in accordance with some embodiments. The chips 110a and C are electrically connected to the conductive bumps 320 through the conductive plugs 2540, the wiring layers 314, and the conductive vias 316, in accordance with some embodiments.

Processes and materials for forming the chip stack structures 200, 300, 400, 500, 600, 700, 800, 900, 1000, 1100, 1200, 1300, 1400, 1500, 1600, 1700, 1800, 1900, 2000, 2100, 2200, 2300, 2400, 2500, 2600, 2700, 2800, 2900, 3000, 3100, and 3200 may be similar to, or the same as, those for forming the chip stack structure 100 described above. Elements designated by the same reference numbers as those in FIGS. 1A to 32 have structures and materials that are the same or similar. Therefore, the detailed descriptions thereof will not be repeated herein.

The top views of the chip stack structures 100, 500, 900, 1300, 1700, 2100, 2500, 2900, and 3100 are similar to or the same as each other, in accordance with some embodiments.

In contrast with through silicon vias, the conductive plugs 140 (i.e., the through dielectric vias) has a high radius and a low resistance. In addition, the conductive plugs 140 can be formed in the back-end process of all technology nodes without considering chip layouts of different technology nodes. The conductive plugs 140 can land on desired conductive layers or conductive elements to deliver signal/power directly, which improves the signal/power transmission efficiency between the chips of the chip stack structures. The cost of forming the conductive plugs 140 is less than that of forming the through silicon vias, and therefore the conductive plugs 140 can be applied in all technology nodes.

In accordance with some embodiments, chip stack structures and methods for forming the same are provided. The methods (for forming the chip stack structures) include bonding a first semiconductor structure to a second semiconductor structure; partially removing a substrate of the first semiconductor structure to form a trench passing through the substrate; forming an insulating layer in the trench; forming conductive plugs in the trench to electrically connected to the second semiconductor structure; and dicing the first semiconductor structure, the second semiconductor structure, and the insulating layer into chip stack structures. Each chip stack structure includes a first chip coming from the first semiconductor structure and a second chip coming from the second semiconductor structure. The chip stack structure is bonded to a substrate.

Since the conductive plug is directly connected to the second chip without through the first chip, the conductive path between the second chip and the substrate is shortened. Therefore, the resistance of the conductive path is decreased. As a result, the signal integrity and the power integrity between the second chip and the substrate are improved. The method for forming the chip stack structures is adapted to a wafer to wafer process, which improves the signal/power transmission efficiency between the chips of the chip stack structures.

In accordance with some embodiments, a chip stack structure is provided. The chip stack structure includes a first chip including a first substrate and a first interconnect structure over the first substrate. The first interconnect structure includes a first dielectric layer and a first bonding pad embedded in the first dielectric layer. The chip stack structure includes a second chip over and bonded to the first chip. The second chip has a second interconnect structure and a second substrate over the second interconnect structure, the second interconnect structure is wider than the second substrate, the second interconnect structure includes a second dielectric layer and a second bonding pad embedded in the second dielectric layer, the first bonding pad is in direct contact with the second bonding pad, and the first dielectric layer is in direct contact with the second dielectric layer. The chip stack structure includes an insulating layer over the second interconnect structure and surrounding the second substrate. The chip stack structure includes a conductive plug penetrating through the insulating layer to the second interconnect structure.

In accordance with some embodiments, a chip stack structure is provided. The chip stack structure includes a first chip including a first substrate and a first interconnect structure over the first substrate. The first interconnect structure includes a first dielectric layer and a first bonding pad embedded in the first dielectric layer. The chip stack structure includes a second chip over and bonded to the first chip. The second chip has a second interconnect structure and a second substrate over the second interconnect structure, the second interconnect structure includes a second dielectric layer and a second bonding pad embedded in the second dielectric layer, the first bonding pad is in direct contact with the second bonding pad, and the first dielectric layer is in direct contact with the second dielectric layer. The chip stack structure includes an insulating layer over the first chip and surrounding the second chip. The chip stack structure includes a conductive plug penetrating through the insulating layer to the first interconnect structure, wherein a first surface of the second substrate, a second surface of the insulating layer, and a third surface of the conductive plug are substantially level with each other.

In accordance with some embodiments, a method for forming a chip stack structure is provided. The method includes providing a first semiconductor structure including a first substrate structure and a first interconnect structure over the first substrate structure. The first interconnect structure includes a first dielectric layer and a first bonding pad embedded in the first dielectric layer. The method includes bonding a second semiconductor structure to the first semiconductor structure. The second semiconductor structure includes a second interconnect structure and a second substrate structure over the second interconnect structure, the second interconnect structure includes a second dielectric layer and a second bonding pad embedded in the second dielectric layer, the second bonding pad is bonded to the first bonding pad, and the second dielectric layer is bonded to the first dielectric layer. The method includes partially removing the second substrate structure to form a trench passing through the second substrate structure, wherein a portion of the second substrate structure remains over the second interconnect structure after the partially removing of the second substrate structure, and the trench surrounds the portion. The method includes forming an insulating layer in the trench in the second substrate structure. The method includes forming a conductive plug in the trench. The conductive plug passes through the insulating layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A chip stack structure, comprising:
   a first chip comprising a first substrate and a first interconnect structure over the first substrate, wherein the first interconnect structure comprises a first dielectric layer and a first bonding pad embedded in the first dielectric layer;
   a second chip over and bonded to the first chip, wherein the second chip has a second interconnect structure and a second substrate over the second interconnect structure, the second interconnect structure is wider than the second substrate, the second interconnect structure comprises a second dielectric layer and a second bonding pad embedded in the second dielectric layer, the first bonding pad is in direct contact with the second bonding pad, and the first dielectric layer is in direct contact with the second dielectric layer;
   an insulating layer over the second interconnect structure and surrounding the second substrate; and
   a conductive plug penetrating through the insulating layer to the second interconnect structure.

2. The chip stack structure as claimed in claim 1, wherein the second interconnect structure comprises a wiring layer embedded in the second dielectric layer, and the conductive plug is in direct contact with the wiring layer.

3. The chip stack structure as claimed in claim 2, wherein a first surface of the wiring layer is exposed by the second dielectric layer, and the conductive plug is in direct contact with the first surface of the wiring layer.

4. The chip stack structure as claimed in claim 3, wherein the first surface of the wiring layer is substantially level with a second surface of the second dielectric layer under the second substrate.

5. The chip stack structure as claimed in claim 3, wherein the insulating layer extends into the second interconnect structure.

6. The chip stack structure as claimed in claim 5, wherein the conductive plug extends into the second interconnect structure.

7. The chip stack structure as claimed in claim 6, wherein the first surface of the wiring layer is lower than a second surface of the second substrate, and the second surface faces the second interconnect structure.

8. The chip stack structure as claimed in claim 2, wherein the conductive plug extends into the second dielectric layer.

9. The chip stack structure as claimed in claim 1, wherein the first interconnect structure further comprises a third bonding pad embedded in the first dielectric layer, and the conductive plug further penetrates through the second interconnect structure to the third bonding pad.

10. The chip stack structure as claimed in claim 1, wherein the first interconnect structure further comprises a wiring layer in the first dielectric layer, and the conductive plug further penetrates through the second interconnect structure and extends into the first dielectric layer to be connected to the wiring layer.

11. The chip stack structure as claimed in claim 1, wherein a width of the conductive plug decreases toward the first chip.

12. A chip stack structure, comprising:
   a first chip comprising a first substrate and a first interconnect structure over the first substrate, wherein the first interconnect structure comprises a first dielectric layer and a first bonding pad embedded in the first dielectric layer;
   a second chip over and bonded to the first chip, wherein the second chip has a second interconnect structure and a second substrate over the second interconnect structure, the second interconnect structure comprises a second dielectric layer and a second bonding pad embedded in the second dielectric layer, the first bonding pad is in direct contact with the second bonding pad, and the first dielectric layer is in direct contact with the second dielectric layer;
   an insulating layer over the first chip and surrounding the second chip; and
   a conductive plug penetrating through the insulating layer to the first interconnect structure, wherein a first surface of the second substrate, a second surface of the insulating layer, and a third surface of the conductive plug are substantially level with each other.

13. The chip stack structure as claimed in claim 12, wherein the conductive plug comprises a seed layer and a conductive pillar over the seed layer, and a first sidewall of the seed layer is substantially aligned with a second sidewall of the conductive pillar.

14. A method for forming a chip stack structure, comprising:
    providing a first semiconductor structure comprising a first substrate structure and a first interconnect structure over the first substrate structure, wherein the first interconnect structure comprises a first dielectric layer and a first bonding pad embedded in the first dielectric layer;
    bonding a second semiconductor structure to the first semiconductor structure, wherein the second semiconductor structure comprises a second interconnect structure and a second substrate structure over the second interconnect structure, the second interconnect structure comprises a second dielectric layer and a second bonding pad embedded in the second dielectric layer, the second bonding pad is bonded to the first bonding pad, and the second dielectric layer is bonded to the first dielectric layer;
    partially removing the second substrate structure to form a trench passing through the second substrate structure, wherein a portion of the second substrate structure remains over the second interconnect structure after the partially removing of the second substrate structure, and the trench surrounds the portion;
    forming an insulating layer in the trench in the second substrate structure; and
    forming a conductive plug in the trench, wherein the conductive plug passes through the insulating layer.

15. The method for forming the chip stack structure as claimed in claim 14, wherein the second interconnect structure comprises a wiring layer embedded in the second dielectric layer, a surface of the wiring layer is exposed by the trench, and the conductive plug is in direct contact with the surface of the wiring layer.

16. The method for forming the chip stack structure as claimed in claim 15, wherein the partially removing of the second substrate structure further comprises:
    partially removing the second dielectric layer, wherein the trench extends into the second dielectric layer, and the insulating layer and the conductive plug are partially in the second dielectric layer.

17. The method for forming the chip stack structure as claimed in claim 14, wherein the forming of the conductive plug in the trench comprises:
    partially removing the insulating layer and the second dielectric layer to form a through hole passing through the insulating layer and extending into the second dielectric layer and partially exposing a wiring layer of the second interconnect structure; and
    forming the conductive plug in the through hole.

18. The method for forming the chip stack structure as claimed in claim 14, wherein the forming of the conductive plug in the trench comprises:
    partially removing the insulating layer and the second dielectric layer to form a through hole passing through the insulating layer and the second dielectric layer and partially exposing a third bonding pad of the first interconnect structure; and
    forming the conductive plug in the through hole.

19. The method for forming the chip stack structure as claimed in claim 14, wherein the forming of the conductive plug in the trench comprises:
    partially removing the insulating layer, the second dielectric layer, and the first dielectric layer to form a through hole passing through the insulating layer and the second dielectric layer and extending into the first dielectric layer and partially exposing a wiring layer of the first interconnect structure; and
    forming the conductive plug in the through hole.

20. The method for forming the chip stack structure as claimed in claim 14, wherein the forming of the insulating layer in the trench in the second substrate structure and the forming of the conductive plug in the trench comprise:
    forming the conductive plug in the trench; and
    after forming the conductive plug in the trench, forming the insulating layer in the trench in the second substrate structure.

* * * * *